United States Patent
Matsuo

(10) Patent No.: US 12,490,429 B2
(45) Date of Patent: Dec. 2, 2025

(54) SEMICONDUCTOR MEMORY DEVICE

(71) Applicant: Kioxia Corporation, Tokyo (JP)

(72) Inventor: Kouji Matsuo, Ama Aichi (JP)

(73) Assignee: KIOXIA CORPORATION, Tokyo (JP)

( * ) Notice: Subject to any disclaimer, the term of this patent is extended or adjusted under 35 U.S.C. 154(b) by 865 days.

(21) Appl. No.: 17/466,360

(22) Filed: Sep. 3, 2021

(65) Prior Publication Data

US 2022/0310647 A1 Sep. 29, 2022

(30) Foreign Application Priority Data

Mar. 23, 2021 (JP) ................. 2021-048655

(51) Int. Cl.
*H10B 43/27* (2023.01)
*H10B 41/27* (2023.01)

(52) U.S. Cl.
CPC ............ *H10B 43/27* (2023.02); *H10B 41/27* (2023.02)

(58) Field of Classification Search
CPC ........ H10B 43/27; H10B 41/27; H10B 41/10; H10B 43/10; H10B 43/35; H10B 43/50; H01L 29/40117; H01L 29/40114
See application file for complete search history.

(56) References Cited

U.S. PATENT DOCUMENTS

| | | | |
|---|---|---|---|
| 7,867,831 B2 | 1/2011 | Shin et al. | |
| 9,224,749 B1 | 12/2015 | Guo et al. | |
| 9,349,745 B2 | 5/2016 | Lue | |
| 2015/0325585 A1 | 11/2015 | Peng | |
| 2020/0091165 A1* | 3/2020 | Yamashita | ........ H01L 29/40114 |
| 2020/0098785 A1* | 3/2020 | Kariya | .................. H10B 43/10 |
| 2020/0176033 A1 | 6/2020 | Hosotani et al. | |
| 2020/0273882 A1 | 8/2020 | Wang et al. | |
| 2021/0296347 A1* | 9/2021 | Saito | ...................... H10B 43/30 |

FOREIGN PATENT DOCUMENTS

| | | |
|---|---|---|
| JP | 2020-013071 A | 1/2020 |
| TW | 202032759 A | 9/2020 |

\* cited by examiner

*Primary Examiner* — Thanh T Nguyen
(74) *Attorney, Agent, or Firm* — Foley & Lardner LLP

(57) ABSTRACT

According to one embodiment, a semiconductor memory device includes: a first semiconductor extending in a first direction parallel to a substrate; a first conductor extending in a second direction perpendicular to the first direction; a first charge storage layer surrounding the first conductor; a first insulator provided between the first conductor and the first charge storage layer; a second insulator provided between the first charge storage layer and the first semiconductor, wherein an outer circumference of a portion of the second insulator is in contact with the first semiconductor; and a first memory cell including the first conductor, the first semiconductor, a portion of the first charge storage layer, a portion of the first insulator, and the portion of the second insulator.

10 Claims, 52 Drawing Sheets

SEMICONDUCTOR MEMORY DEVICE

CROSS-REFERENCE TO RELATED APPLICATION

This application is based upon and claims the benefit of priority from Japanese Patent Application No. 2021-048655, filed Mar. 23, 2021, the entire contents of which are incorporated herein by reference.

FIELD

Embodiments described herein relate generally to a semiconductor memory device.

BACKGROUND

As one semiconductor memory device, a NAND flash memory is known.

DETAILED DESCRIPTION

Figure 1:
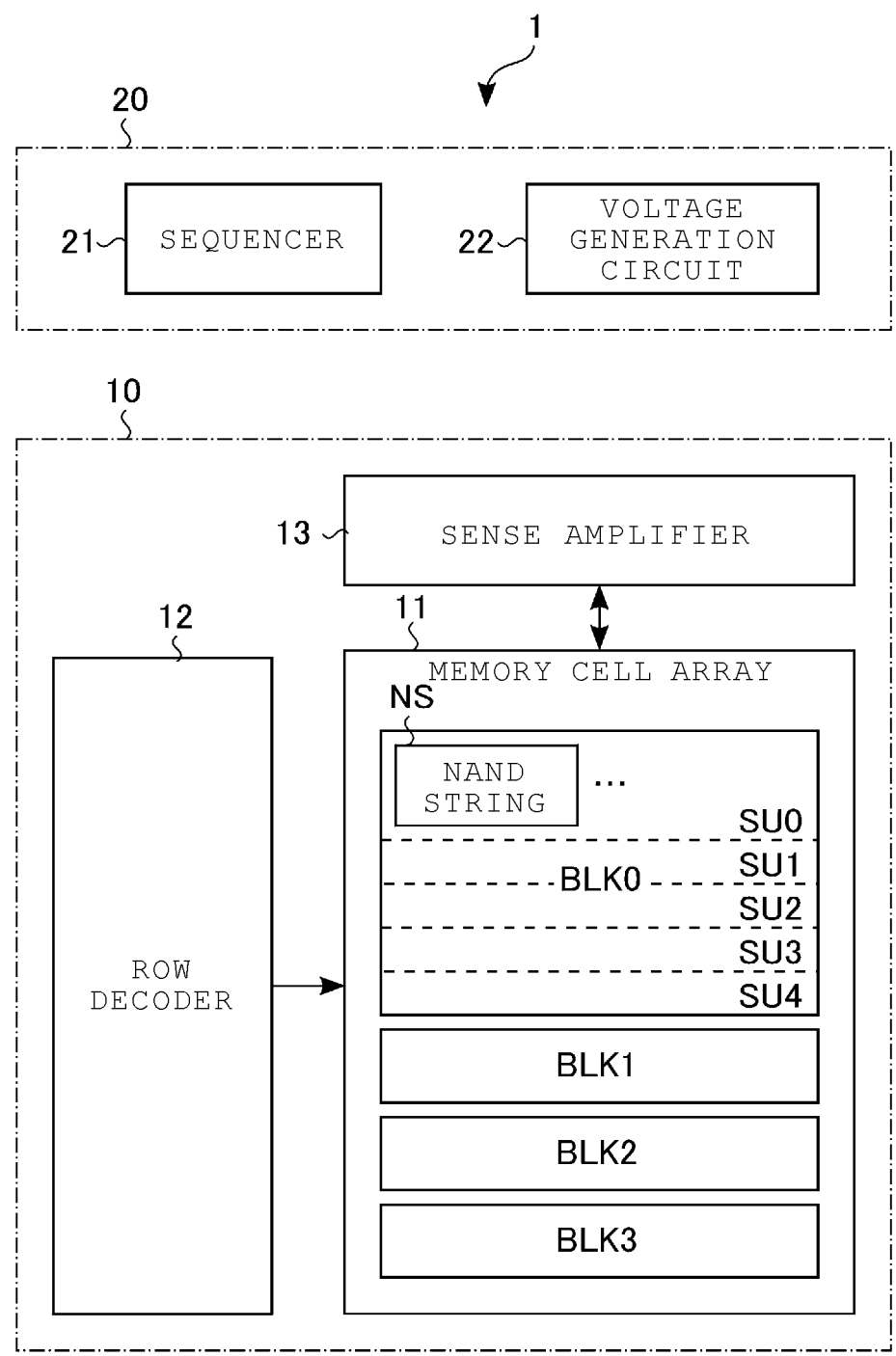
FIG. 1 is a block diagram illustrating a semiconductor memory device according to an embodiment.

Embodiments provide a semiconductor memory device capable of improving reliability.

In general, according to one embodiment, a semiconductor memory device includes: a first semiconductor extending in a first direction parallel to a substrate; a first conductor extending in a second direction perpendicular to the first direction; a first charge storage layer surrounding the first conductor; a first insulator provided between the first conductor and the first charge storage layer; a second insulator provided between the first charge storage layer and the first semiconductor, wherein an outer circumference of a portion of the second insulator is in contact with the first semiconductor; and a first memory cell including the first conductor, the first semiconductor, a portion of the first charge storage layer, a portion of the first insulator, and the portion of the second insulator.

Hereinafter, embodiments will be described with reference to the drawings. In the following description, components having substantially the same functions and configurations are represented by the same reference numerals, and the description will be repeated as necessary. In addition, each of the embodiments described below shows an example of a device or a method for practicing the technical ideas of the embodiment, and the technical ideas of the embodiment are not intended to limit materials, shapes, structures, disposition, and the like of components to those described below. The technical ideas of the embodiment may be modified in various ways within the scope of claims.

A semiconductor memory device according to an embodiment will be described. Hereinafter, as an example of the semiconductor memory device, a three-dimensionally stacked NAND flash memory where a memory cell transistor is three-dimensionally stacked above a semiconductor substrate will be described.

1. Configuration 1.1 Overall Configuration of Semiconductor Memory Device

First, an example of an overall configuration of the semiconductor memory device will be described with reference to FIG. 1. FIG. 1 is an example of a block diagram illustrating a basic overall configuration of the semiconductor memory device.

As illustrated in FIG. 1, a semiconductor memory device 1 includes a memory core unit 10 and a peripheral circuit unit 20.

The memory core unit 10 includes a memory cell array 11, a row decoder 12, and a sense amplifier 13.

The memory cell array 11 includes a plurality of blocks BLK (in the example illustrated in FIG. 1, BLK0 to BLK3) including a plurality of nonvolatile memory cell transistors (hereinafter, also referred to as "memory cells") associated with rows and columns. Each of the blocks BLK includes a plurality of string units SU. In the example of FIG. 1, the block BLK includes five string units SU0 to SU4. In addition, each of the string units SU includes a plurality of NAND strings NS. The number of blocks BLK in the memory cell array 11 and the number of string units SU in the block BLK may be freely selected. The details of the memory cell array 11 will be described below.

The row decoder 12 decodes a row address received from an external controller (not illustrated). The row decoder 12 selects a row direction of the memory cell array 11 based on the decoding result. More specifically, the row decoder 12 applies a voltage to various wirings (word lines and selected gate lines) for selecting the row direction.

When data is read, the sense amplifier 13 reads data from the memory cell transistor of any of the blocks BLK. In addition, when data is written, the sense amplifier 13 applies a voltage corresponding to the write data to the memory cell array 11.

The peripheral circuit unit 20 includes a sequencer 21 and a voltage generation circuit 22.

The sequencer 21 controls an overall operation of the semiconductor memory device 1. More specifically, the sequencer 21 controls the voltage generation circuit 22, the row decoder 12, the sense amplifier 13, and the like during a write operation, a read operation, and an erasing operation.

The voltage generation circuit 22 generates a voltage required for a write operation, a read operation, or an erasing operation and supplies the generated voltage to the row decoder 12, the sense amplifier 13, and the like.

1.2 Circuit Configuration of Memory Cell Array

Figure 2:
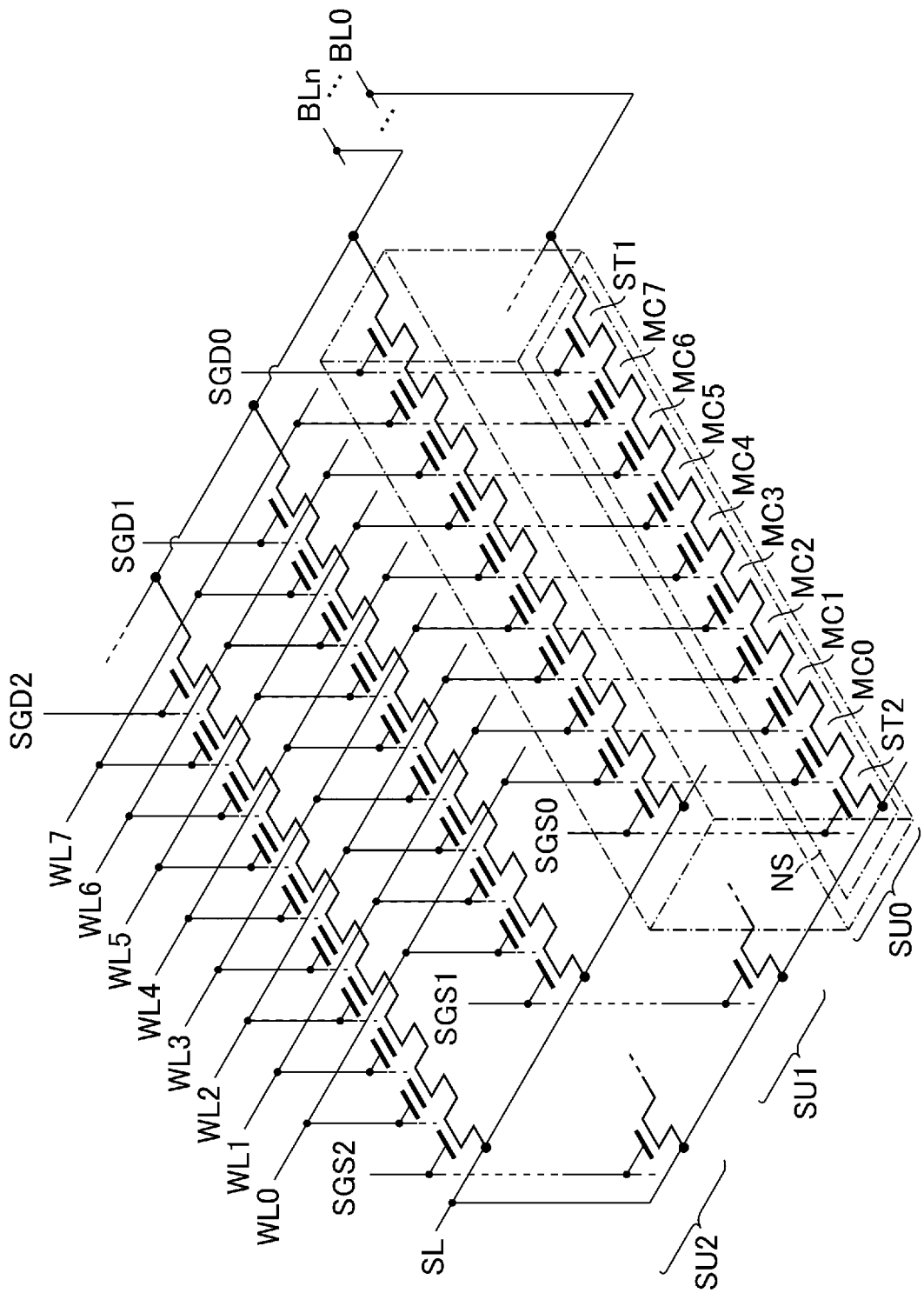
FIG. 2 is a circuit diagram illustrating a memory cell array in the semiconductor memory device according to the embodiment.

Next, an example of a circuit configuration of the memory cell array 11 will be described with reference to FIG. 2. FIG. 2 is a circuit diagram illustrating the memory cell array 11. In the example of FIG. 2, the circuit diagram of the string units SU0 to SU2 is illustrated. In the embodiment, the NAND strings NS in the string unit SU are stacked above the semiconductor substrate. In the example of FIG. 2, the circuit configuration of the NAND strings NS stacked in the string unit SU is sterically illustrated.

As illustrated in FIG. 2, each of the NAND strings NS includes select transistors ST1 and ST2 and a plurality of memory cell transistors MC (in the example of FIG. 2, eight memory cell transistors MC0 to MC7).

The memory cell transistors MC include a control gate and a charge storage layer and store data in a nonvolatile manner. The memory cell transistors MC may be a MONOS (Metal-Oxide-Nitride-Oxide-Silicon) type in which an insulator is used as a charge storage layer, or may be a FG (floating gate) type in which a conductor is used as a charge storage layer. Hereinafter, a case where the memory cell transistor MC is a FG type will be described. In addition, the number of memory cell transistors MC in one NAND string NS may be 16, 32, 48, 64, 96, or 128 but is not limited thereto.

Current paths of the memory cell transistors MC0 to MC7 in the NAND string NS are connected in series. A drain of the memory cell transistors MC0 is connected to a source of the select transistor ST1. A source of the memory cell transistors MC7 is connected to a drain of the select transistor ST2. Each of the numbers of select transistors ST1 and ST2 in the NAND string NS may be freely selected and one or more.

Gates of the memory cell transistors MC stacked in each of the string units SU are connected in common to one word line WL. More specifically, for example, gates of a plurality of memory cell transistors MC0 stacked in the string units SU0 to SU2 are connected in common to a word line WL0. Likewise, gates of a plurality of memory cell transistors MC1 to MC7 stacked in the string units SU0 to SU2 are connected to word lines WL1 to WL7, respectively.

Gates of a plurality of select transistors ST1 stacked in each of the string units SU are connected in common to one selected gate line SGD. For example, each of the select transistors ST1 in the string unit SU0 is connected to a selected gate line SGD0. Each of the select transistors ST1 in the string unit SU1 is connected to a selected gate line SGD1. Each of the select transistors ST1 in the string unit SU2 is connected to a selected gate line SGD2.

Drains of the select transistors ST1 in the string unit SU are connected to different bit lines BL. Drains of the select transistors ST1 provided in the same layer of each of the string units SU are connected in common to one bit line BL. More specifically, for example, drains of the select transistors ST1 corresponding to the NAND string NS disposed in the lowermost layer of each of the string units SU are connected to a bit line BL0. Drains of the select transistors ST1 corresponding to the NAND string NS disposed on the n-th layer (n represents an integer of 1 or more) of each of the string units SU are connected to a bit line BLn.

Gates of a plurality of select transistors ST2 stacked in each of the string units SU are connected in common to one selected gate line SGS. For example, each of the select transistors ST2 in the string unit SU0 is connected to a selected gate line SGS0. Each of the select transistors ST2 in the string unit SU1 is connected to a selected gate line SGS1. Each of the select transistors ST2 in the string unit SU2 is connected to a selected gate line SGS2. Gates of a plurality of select transistors ST2 stacked in each of the string units SU may be connected in common to one selected gate line SGS.

Sources of a plurality of select transistors ST2 in each of the string units SU are connected in common to one source line SL.

During a write operation and a read operation, a plurality of memory cell transistors MC connected to one word line WL in the string unit SU are collectively selected. In other words, the memory cell transistors MC stacked in the string unit SU are collectively selected.

1.3 Configuration of Memory Cell Array

Figure 3:
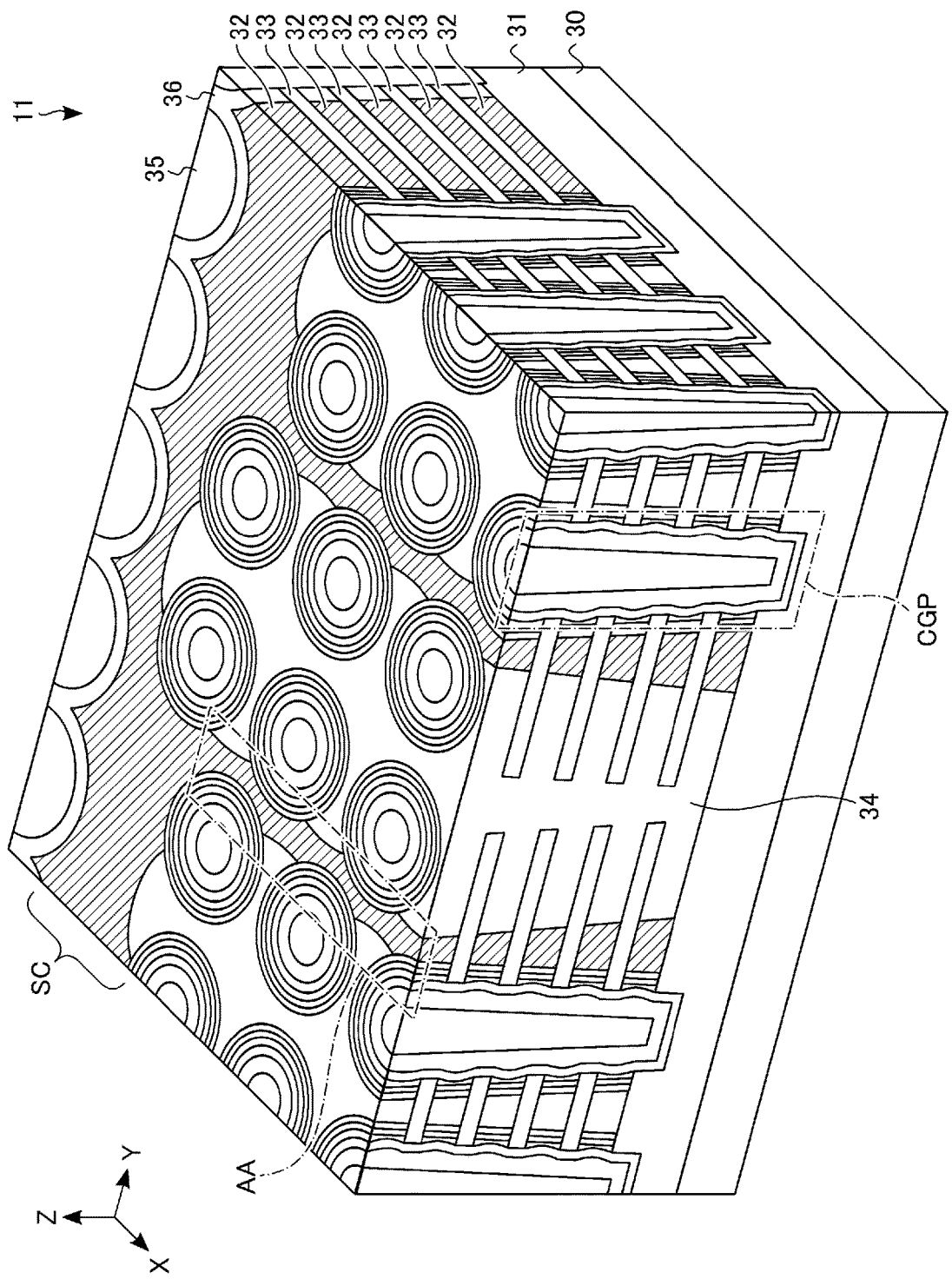
FIG. 3 is a perspective view illustrating the memory cell array in the semiconductor memory device according to the embodiment.

Next, an example of a configuration of the memory cell array 11 will be described with reference to FIG. 3. FIG. 3 is a perspective view illustrating a part of the memory cell array 11. In the example of FIG. 3, in order to clarify a structure of semiconductors 32, a portion corresponding to the semiconductor 32 is hatched with an oblique line. In the following description, a direction parallel to the semiconductor substrate will be referred to as "X direction". A direction substantially parallel to the semiconductor substrate and intersecting the X direction will be referred to as "Y direction". Further, a direction substantially perpendicular to the semiconductor substrate will be referred to as "Z direction".

As illustrated in FIG. 3, an insulator 31 is provided on a semiconductor substrate 30. The insulator 31 is, for example, silicon oxide ($SiO_2$). The memory cell array 11 is provided on the insulator 31. The memory cell array 11 includes a plurality of semiconductors 32, a plurality of insulators 33 to 35, a plurality of semiconductors 36, and a plurality of electrode pillars CGP.

The semiconductors 32 are stacked distant from each other in the Z direction. More specifically, the semiconductors 32 are stacked on the insulator 31 with the insulator 33 interposed between the layers. As the semiconductors 32, for example, polysilicon is used. As the insulator 33, for example, $SiO_2$ is used.

The semiconductor 32 includes: a ST1 connection portion SC extending in the Y direction; and a plurality of active area portions AA having one end connected to the ST1 connection portion SC and extending in the X direction. The ST1 connection portion SC is in contact with the semiconductors 36 that function as current paths of the select transistors ST1.

The active area portions AA function as active areas where channel layers of the memory cell transistors MC are formed. One active area portion AA corresponds to one NAND string NS. An insulator 34 is provided between the active area portions AA adjacent to each other in the Y direction. As the insulator 34, for example, $SiO_2$ is used.

The semiconductors 36 are stacked on the insulator 31 with the insulator 33 interposed between the layers. The semiconductor 36 is provided in the same layer as the semiconductor 32. The semiconductor 36 is in contact with one side surface of the ST1 connection portion SC of the semiconductor 32 facing the X direction. As the semiconductor 36, an n-type semiconductor is used. For example, as the semiconductor 36, polysilicon (n-type semiconductor) doped with an impurity such as phosphorus is used.

A plurality of insulators 35 are disposed in the Y direction. The insulator 35 has, for example, a columnar shape extending in the Z direction. A side surface of the insulator 35 is in contact with the semiconductors 36 and the insulators 33 that are stacked, and a bottom surface reaches the inside of the insulator 31. In other words, in the same layer as the semiconductor 32, the semiconductor 36 surrounds outer circumferences of the insulators 35.

The electrode pillar CGP extends in the Z direction and a bottom surface thereof reaches the inside of the insulator 31. The electrode pillars CGP function as gate electrodes of the memory cell transistors MC stacked in the Z direction. The word line WL (not illustrated) is provided above the electrode pillar CGP and is electrically connected to the electrode pillar CGP. The details of the structure of the electrode pillar CGP will be described below.

The active area portion AA extending in the X direction is disposed between the electrode pillars CGP that are disposed in a staggered arrangement in two columns in the X direction. On the other hand, the insulator 34 is provided between the electrode pillars CGP that are disposed in two columns in the X direction to face in the Y direction. In other words, plural pairs of electrode pillars CGP that are disposed in two columns in the X direction to face in the Y direction are disposed in a staggered arrangement in the Y direction with the active area portions AA interposed therebetween. In the same layer as the active area portions AA, a block insulating film, a charge storage layer, and a tunnel insulating film of the memory cell transistor MC are provided on an outer circumference of the electrode pillar CGP. One memory cell transistor MC is provided at a position where the electrode pillar CGP and the active area portion AA intersect each other. The memory cell transistors MC disposed in a staggered arrangement in the X direction are connected to one active area portion AA. That is, the memory cell transistors MC connected to one active area portion AA correspond to one NAND string NS.

1.4 Planar Configuration of Memory Cell Array

Figure 4:
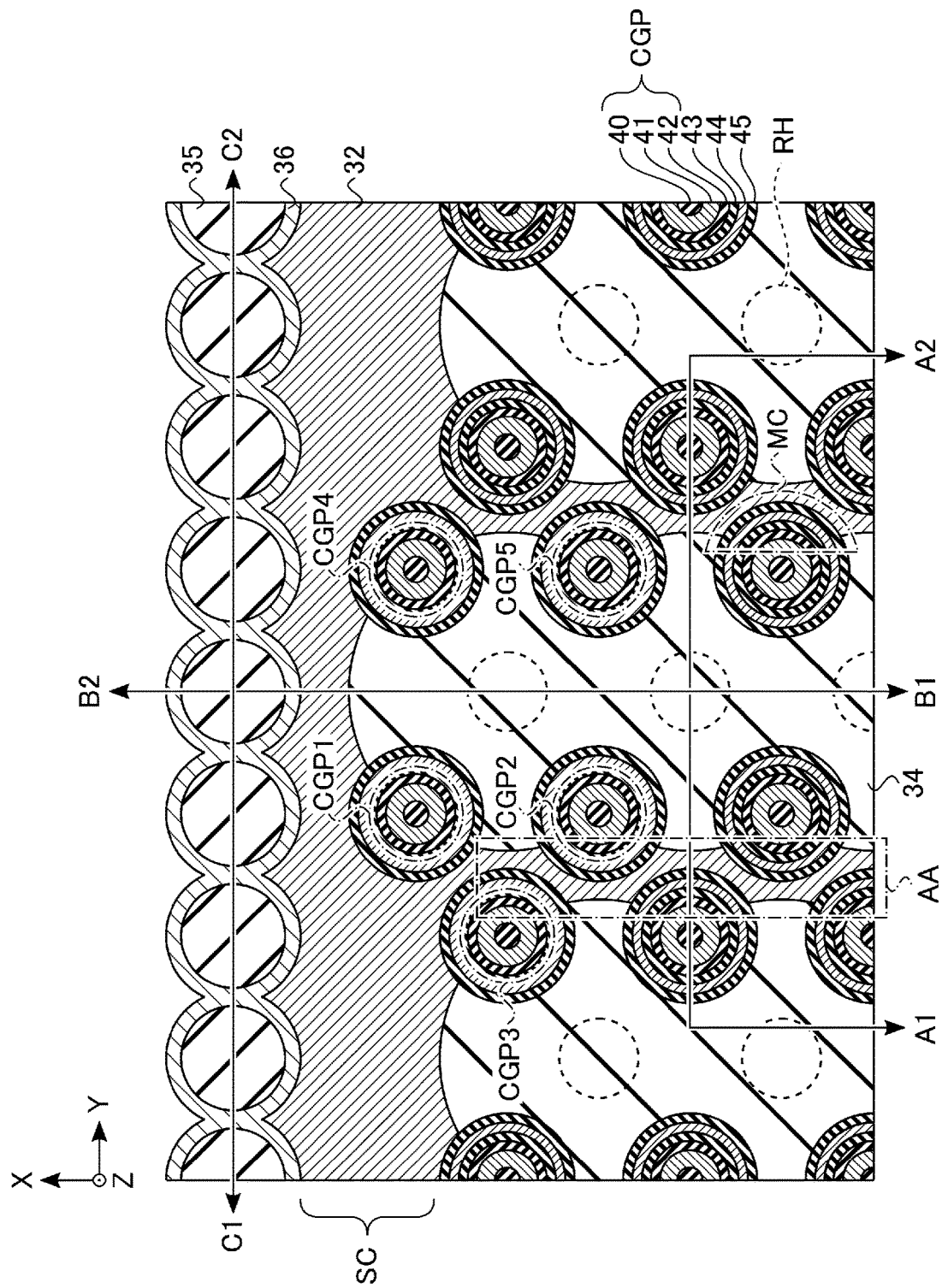
FIG. 4 is a plan view illustrating a semiconductor in the uppermost layer of the memory cell array in the semiconductor memory device according to the embodiment.
Figure 5:
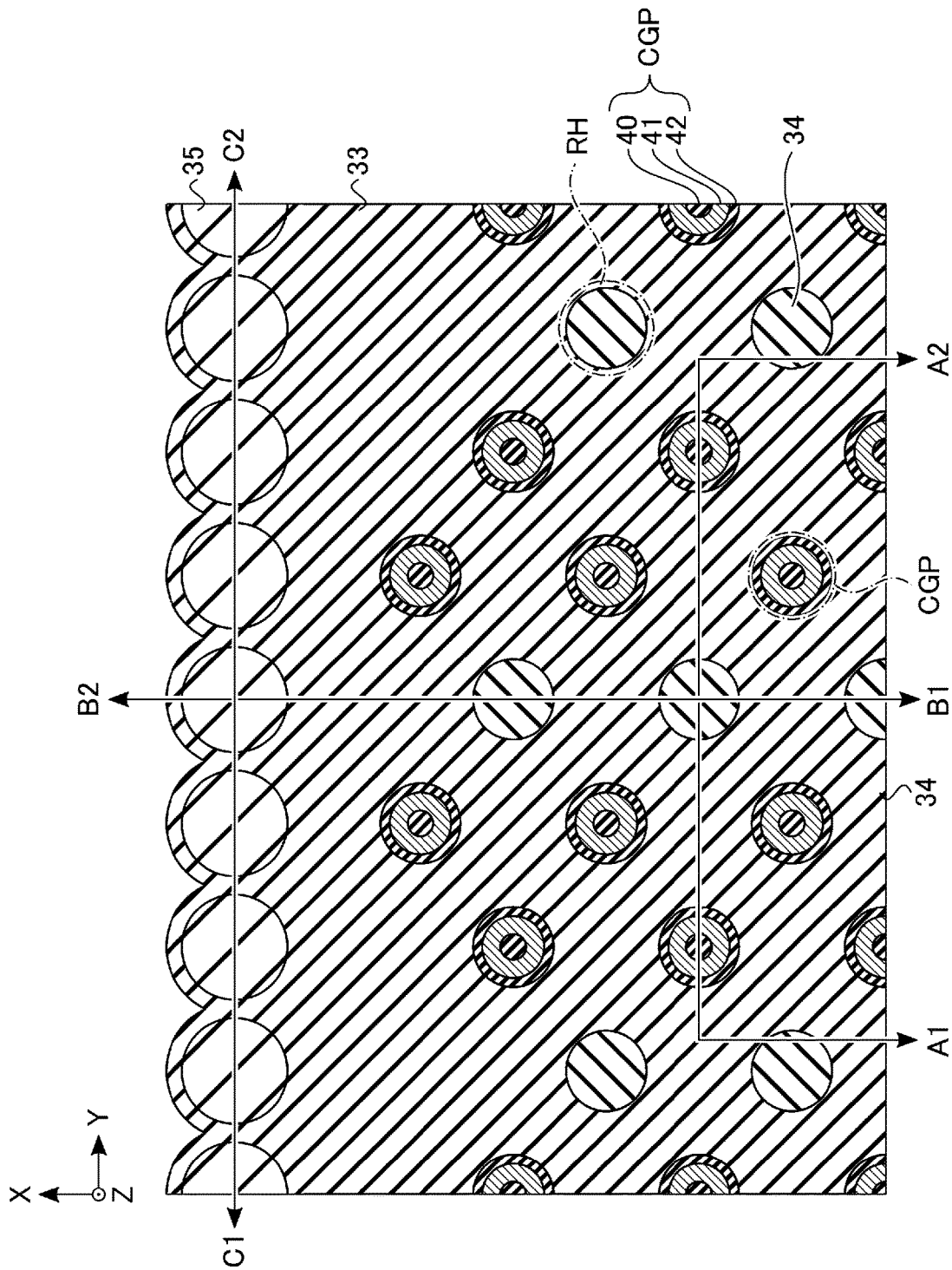
FIG. 5 is a plan view illustrating an insulator in the uppermost layer of the memory cell array in the semiconductor memory device according to the embodiment.

Next, one example of a planar configuration of the memory cell array 11 will be described with reference to FIGS. 4 and 5. FIG. 4 is a plan view illustrating the semiconductor 32 in the uppermost layer. FIG. 5 is a plan view illustrating the insulator 33 in the uppermost layer.

As illustrated in FIGS. 4 and 5, the electrode pillar CGP has a columnar shape and includes an insulator 40, a conductor 41, and an insulator 42. The shape of the electrode pillar CGP on an XY plane is not limited to a circular shape. For example, the shape of the electrode pillar CGP on the XY plane may be a rectangular shape. The insulator 40 has, for example, a columnar shape. As the insulator 40, for example, $SiO_2$ is used. The insulator 40 may be removed. That is, the conductor 41 may have a cylindrical shape or a columnar shape. On a YX plane, the conductor 41 having a cylindrical shape that surrounds the insulator 40 is provided. The conductor 41 functions as a gate electrode of the memory cell transistor MC. As for the conductor 41, a conductive material is used. The conductive material may be, for example, a metal material or a semiconductor material to which an impurity is added. The conductive material has, for example, a stacked structure including tungsten (W) and titanium nitride (TiN). Further, the insulator 42 having a cylindrical shape surrounds the conductor 41. The insulator 42 functions as the block insulating film of the memory cell transistor MC. As for the insulator 42, an insulating material is used. As for the insulating material, for example, a high dielectric constant film such as an oxide or a nitride of aluminum (Al), hafnium (Hf), Ti, zirconium (Zr), or lanthanum (La), a high breakdown voltage film such as $SiO_2$ or silicon oxynitride (SiON), or a mixture or stacked film thereof is used. Hereinafter, a case where $SiO_2$ is used as the insulator 42 will be described.

As illustrated in FIG. 4, in the same layer as the semiconductor 32, an insulator 43, a charge storage layer 44, and an insulator 45 that have a cylindrical shape are sequentially provided to surround the outer circumference of the electrode pillar CGP. The insulator 43 surrounds the insulator 42 and functions as the block insulating film of the memory cell transistor MC together with the insulator 42. As the insulator 43, for example, $SiO_2$ is used. The charge storage layer 44 surrounds the insulator 43. In the case of FG type memory cell transistor MC, for example, polysilicon is used as the charge storage layer 44. The insulator 45 surrounds the charge storage layer 44 and functions as the tunnel insulating film of the memory cell transistor MC. As the insulator 45, for example, $SiO_2$ is used.

One active area portion AA is disposed between the electrode pillars CGP that are disposed in a staggered arrangement in two columns in the X direction. The active area portion AA is in contact with apart of the insulator 45 provided on the outer circumference of each of the electrode pillars CGP. For example, electrode pillars CGP1 and CGP2 are disposed adjacent to each other in the X direction, and an electrode pillar CGP3 is disposed between the electrode pillars CGP1 and CGP2 in the X direction and disposed at a position different from the electrode pillars CGP1 and CGP2 in the Y direction. The active area portion AA is provided between the electrode pillars CGP1 and CGP3 and the electrode pillars CGP2 and CGP3. For example, between the charge storage layers 44 having a cylindrical shape provided on the respective outer circumferences of the electrode pillars CGP1 and CGP3, on an XY plane, a region having a three-layer structure including the insulator 45 corresponding to the electrode pillar CGP1, the semiconductor 32 (active area portion AA), and the insulator 45 corresponding to the electrode pillar CGP3 is provided. The active area portion AA extends to meander in the X direction, for example between the electrode pillars CGP. In other words, the active area portion AA has a wavy shape extending in the X direction.

Another part of the outer circumference of the insulator 45 that is not in contact with the active area portion AA is contact with the insulator 34. On the other hand, between the electrode pillars CGP that are disposed in two columns in the Y direction to face in the X direction, the insulator 34 is provided and the active area portion AA is not provided. For example, an electrode pillar CGP4 and an electrode pillar CGP5 are disposed adjacent to each other in the X direction. The electrode pillars CGP1 and CGP4 are disposed adjacent to each other in the Y direction, and the electrode pillars CGP2 and CGP5 are disposed adjacent to each other in the Y direction. In a region where the electrode pillars CGP1, CGP2, CGP4, and CGP5 face each other, the insulator 34 is provided. A side surface of the insulator 34 is in contact with the semiconductor 32, and the surface of the insulator 34 in contact with the semiconductor 32 is curved. More specifically, for example, the insulator 34 has a shape in which a plurality of circular regions that extend concentrically from a plurality of holes RH provided in the X direction are continuous in the X direction.

A region including the electrode pillar CGP, the active area portion AA in contact with the insulator 45, and a part of the insulator 43, the charge storage layer 44, and the insulator 45 provided between the electrode pillar CGP and the active area portion AA functions as the memory cell transistor MC.

For example, the insulators 35 having a columnar shape are disposed in one column in the Y direction. The semiconductor 36 having a shape in which a plurality of cylinders are continuous in the Y direction surrounds the outer circumferences of the insulators 35. One side surface of the semiconductor 36 facing the X direction is in contact with a side surface of the ST1 connection portion SC of the semiconductor 32.

As illustrated in FIG. 5, between the electrode pillars CGP that are disposed in two columns in the Y direction to face in the X direction, the holes RH disposed in one column in the X direction are provided such that the holes RH and the electrode pillars CGP are disposed in a staggered arrangement. The holes RH are embedded with the insulator 34. In the embodiment, in a manufacturing step of the memory cell array 11, a replacement method of forming a portion corresponding to the semiconductor 32 using a sacrificial film and replacing the sacrificial film with the semiconductor 32 and the insulator 34 is applied. The holes RH are used during the replacement. The manufacturing step of the memory cell array 11 will be described below.

1.5 Cross-sectional Configuration of Memory Cell Array

Figure 6:
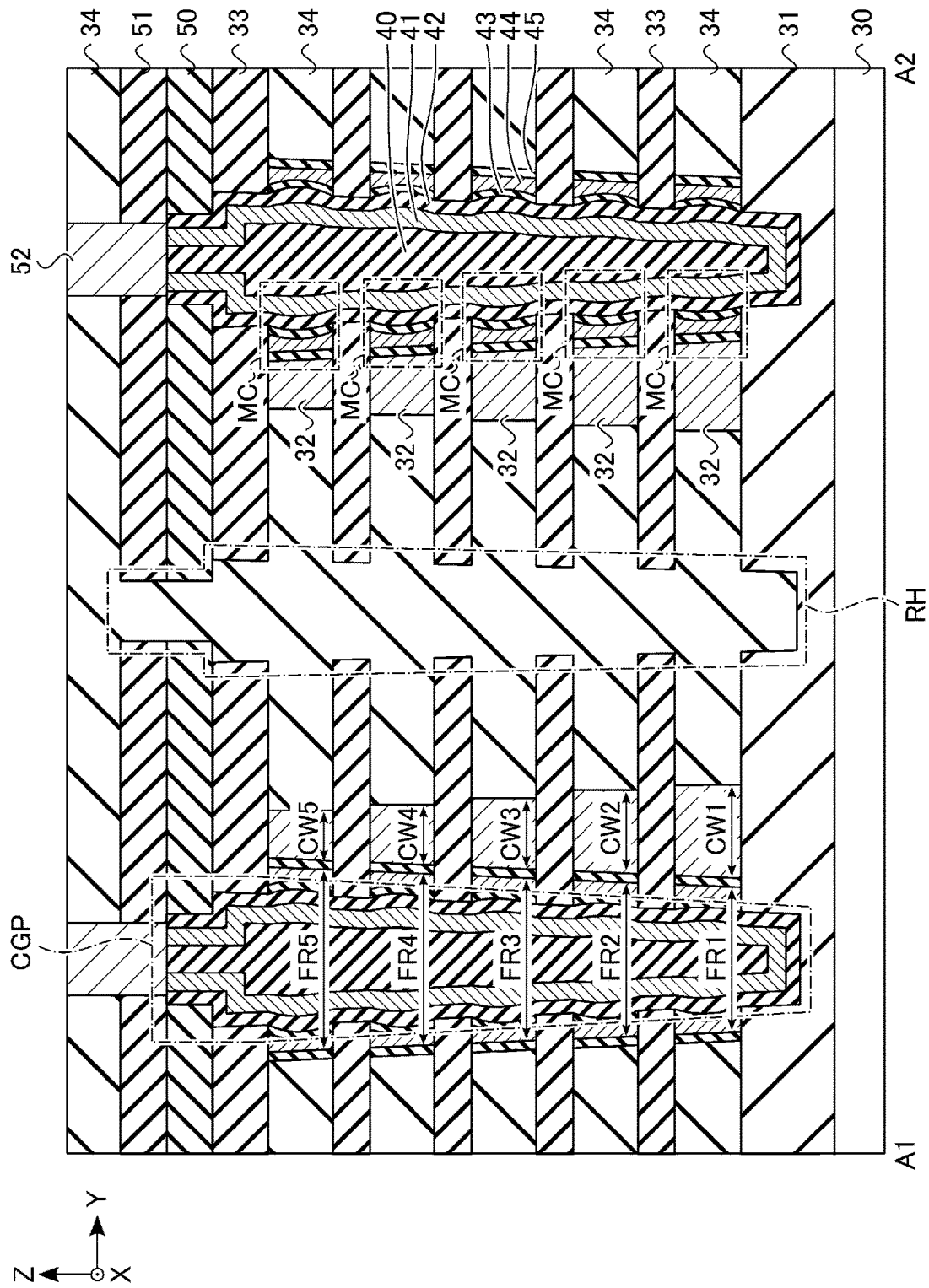
FIG. 6 is a cross-sectional view taken along line A1-A2 of FIGS. 4 and 5.
Figure 7:
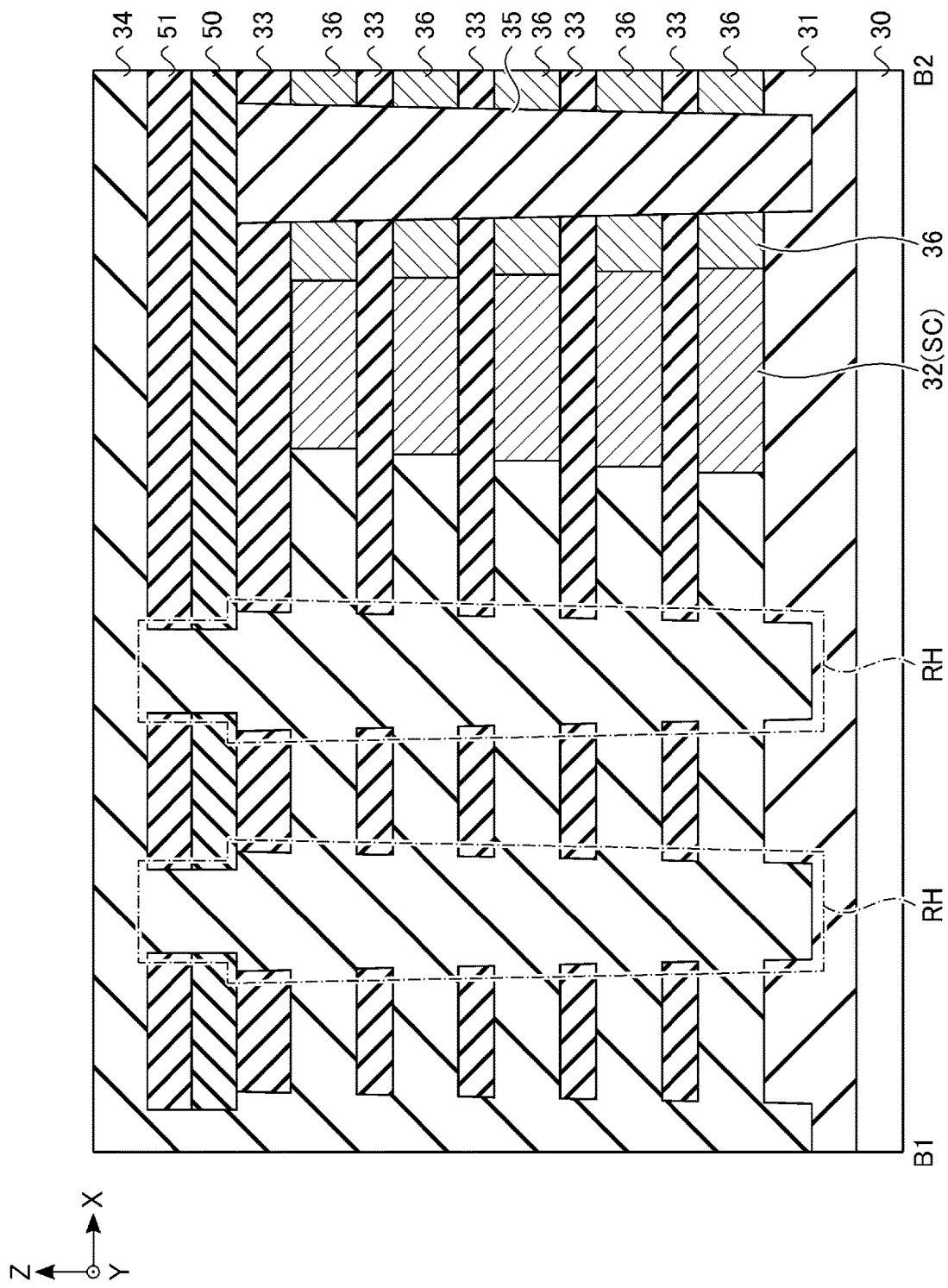
FIG. 7 is a cross-sectional view taken along line B1-B2 of FIGS. 4 and 5.
Figure 8:
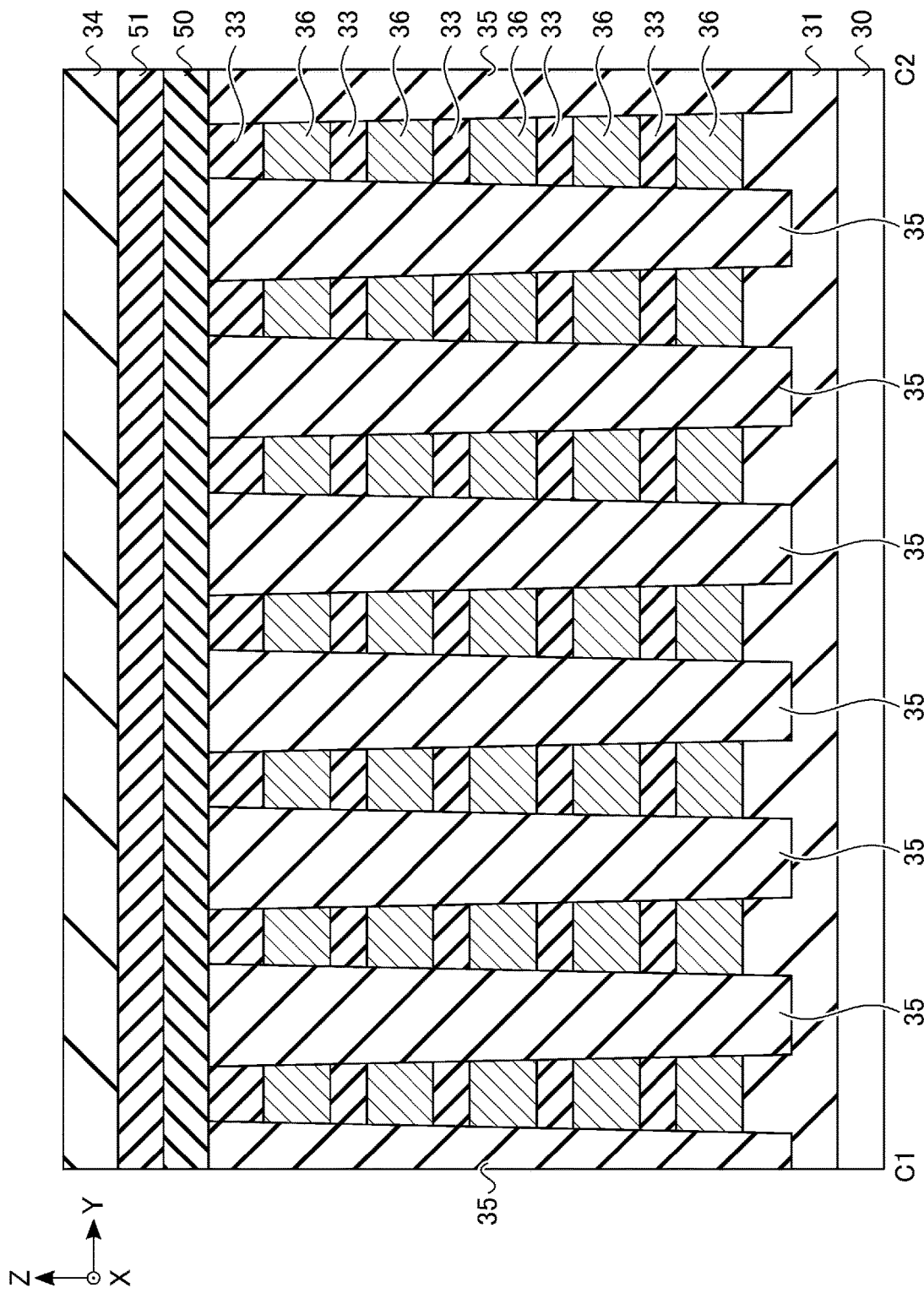
FIG. 8 is a cross-sectional view taken along line C1-C2 of FIGS. 4 and 5.

Next, a cross-sectional configuration of the memory cell array 11 will be described with reference to FIGS. 6 to 8. FIG. 6 is a cross-sectional view taken along line A1-A2 of FIGS. 4 and 5. FIG. 7 is a cross-sectional view taken along line B1-B2 of FIGS. 4 and 5. FIG. 8 is a cross-sectional view taken along line C1-C2 of FIGS. 4 and 5.

As illustrated in FIG. 6, the insulator 31 is provided on the semiconductor substrate 30. For example, a transistor (not illustrated) or a plurality of wiring layers (not illustrated) formed on the semiconductor substrate 30 may be provided in the insulator 31.

In a partial region of the insulator 31, for example, five layers of semiconductors 32 (active area portions AA) are provided with the insulator 33 interposed between the layers. In other words, five layers of active area portions AA and five layers of insulators 33 are alternately disposed on the insulator 31. The numbers of the semiconductors 32 (active area portions AA) and the insulators 33 stacked may be freely selected. In the example of FIG. 6, the widths of the semiconductors 32 in the Y direction become shorter from the lowest layer to the highest layer. More specifically, for example, in the active area portions AA of the semiconductors 32 of the five layers, when the widths of the active area portions AA in the Y direction are represented by CW1 to CW5 in order from the lowest layer, a relationship of CW1>CW2>CW3>CW4>CW5 is satisfied. The structure of the active area portions AA is not limited to this example. For example, the widths in the Y direction of the active area portions AA of the semiconductors 32 stacked distant from each other may be the same as each other or may become longer from the lowest layer to the highest layer.

Insulators 50 and 51 are provided on the insulator 33 in the uppermost layer. As the insulators 50 and 51, for example, SiO$_2$ is used. The insulator 34 is provided on the insulator 51.

In a manufacturing step of the memory cell array 11, the five layers of insulators 33 and the insulators 50 and 51 have openings formed during the processing of the holes RH, respectively. The insulator 34 is provided in the same layer as the five layers of semiconductors 32. The insulator 34 is connected to the insulator 34 on the insulator 51 through the openings of the five layers of insulators 33 and the insulators 50 and 51. The insulator 34 on the insulator 51 may be removed.

The electrode pillar CGP that penetrates the insulator 50, the five layers of insulators 33, and the five layers of semiconductors 32 (and the insulator 34) such that the bottom surface reaches the insulator 31 is provided. In the electrode pillar CGP, for example, the insulator 40 having a substantially columnar shape, the conductor 41 in contact with the side surface and the bottom surface of the insulator 40, and the insulator 42 in contact with the side surface and the bottom surface of the conductor 41 are provided. The bottom surface of the insulator 42 and the vicinity thereof are in contact with the insulator 31. A void may be formed at a center portion of the insulator 40. In the example of FIG. 6, the electrode pillar CGP has a tapered shape. In the same layer as the semiconductor 32, the side surface of the electrode pillar CGP is curved to protrude to the outside. However, the shape of the electrode pillar CGP is not limited to this example. The electrode pillar CGP does not need to have a tapered shape, and the side surface may not be curved.

In the same layer as the semiconductor 32, the insulator 43, the charge storage layer 44, and the insulator 45 are provided in this order toward the outside in the outer circumference of the electrode pillar CGP. In other words, the insulator 43 is provided between the insulator 42 and the semiconductor 32. The charge storage layer 44 is provided between the semiconductor 32 and the insulator 43. The insulator 45 is provided between the semiconductor 32 and the charge storage layer 44. For example, when the diameters of five layers of charge storage layers 44 having a cylindrical shape are represented by FR1 to FR5 in order from the lowest layer, a relationship of FR1<FR2<FR3<FR4<FR5 is satisfied. A region including the conductor 41, the semiconductor 32, a part of the insulators 42 and 43 provided between the conductor 41 and the semiconductor 32, a part of the charge storage layer 44, and a part of the insulator 45 functions as the memory cell transistor MC.

A conductor 52 that penetrates the insulator 51 and the insulator 34 is provided on the electrode pillar CGP. The conductor 52 functions as a contact plug that is electrically connected to the word line WL (not illustrated) provided above the conductor 52. The conductor 52 is formed of a conductive material.

As illustrated in FIG. 7, the holes RH (the openings of the insulators 33, 50, and 51 corresponding to the holes RH) are provided in the X direction. In the openings of the insulators 33, 50, and 51 corresponding to the holes RH, the insulator 34 is provided. In other words, in regions where the holes RH are provided, pillars of the insulators 34 that connect the insulators 34 formed in a plurality of layers to each other in the Z direction are provided. One side surface of the ST1 connection portion SC of the semiconductor 32 facing the X direction is in contact with the insulator 34, and another side surface thereof facing this side surface is in contact with the semiconductor 36. The insulator 35 penetrates the five layers of insulators 33 such that the bottom surface thereof reaches the insulator 31. In the same layer as the semiconductor 32, the semiconductor 36 surrounds the insulator 35. The side surface of the insulator 35 is in contact with the insulator 33 and the semiconductor 36.

As illustrated in FIG. 8, the insulators 35 are disposed in the Y direction. In the same layer of the semiconductor 32, the semiconductor 36 is provided between the insulators 35.

2 Method of Manufacturing Memory Cell Array

Next, a method of manufacturing the memory cell array 11 will be described using FIGS. 9 to 51. FIGS. 9 to 51 illustrate manufacturing steps of the memory cell array 11, respectively. Hereinafter, a case where the replacement method of forming the structure corresponding to the semiconductor 32 using a sacrificial film and removing the sacrificial film to replace the sacrificial film with the semiconductor 32 is used as the method of forming the semiconductor 32 will be described.

Figure 9:
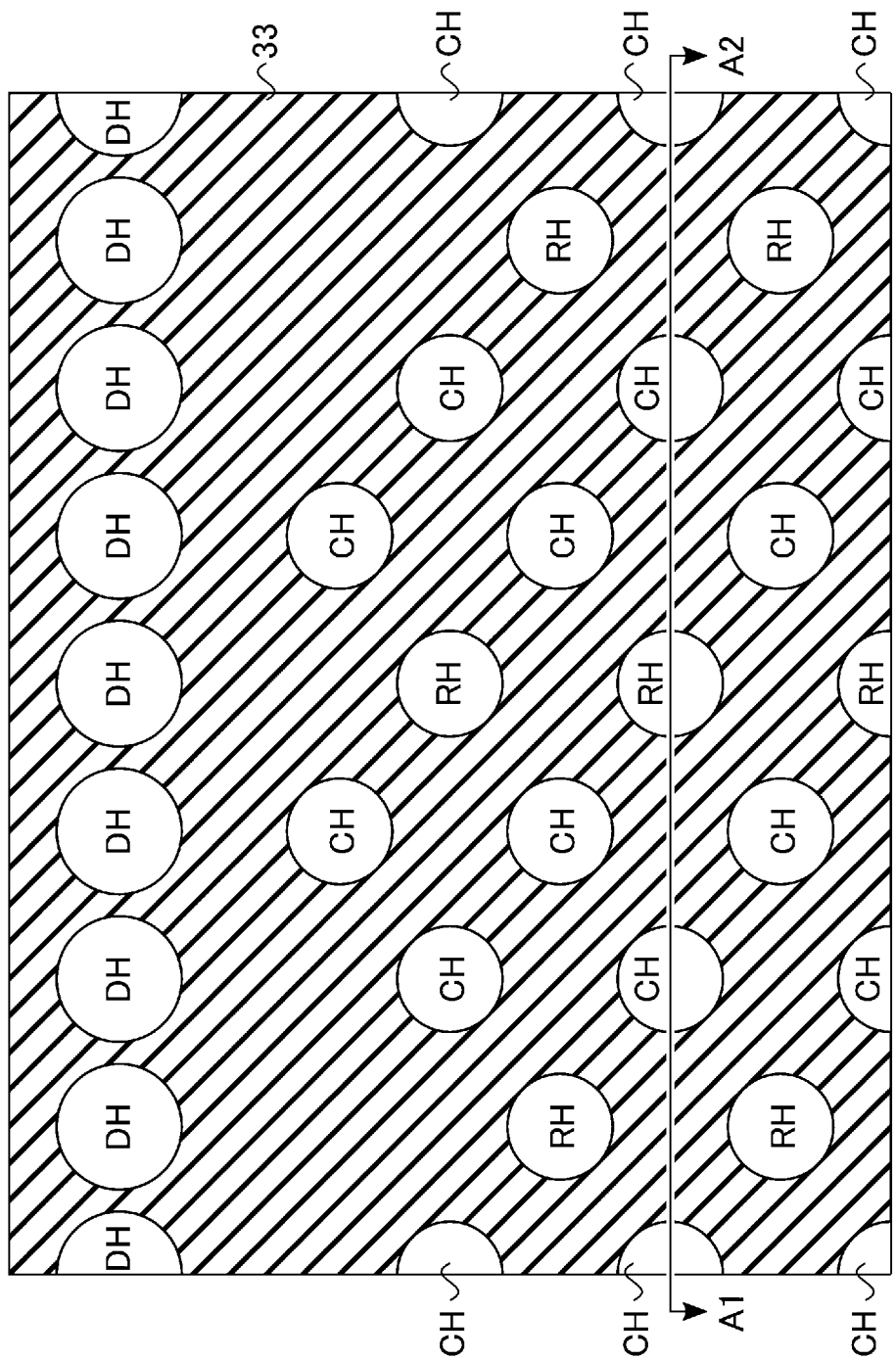
FIG. 9 is a plan view illustrating a manufacturing step of the memory cell array in the semiconductor memory device according to the embodiment.
Figure 10:
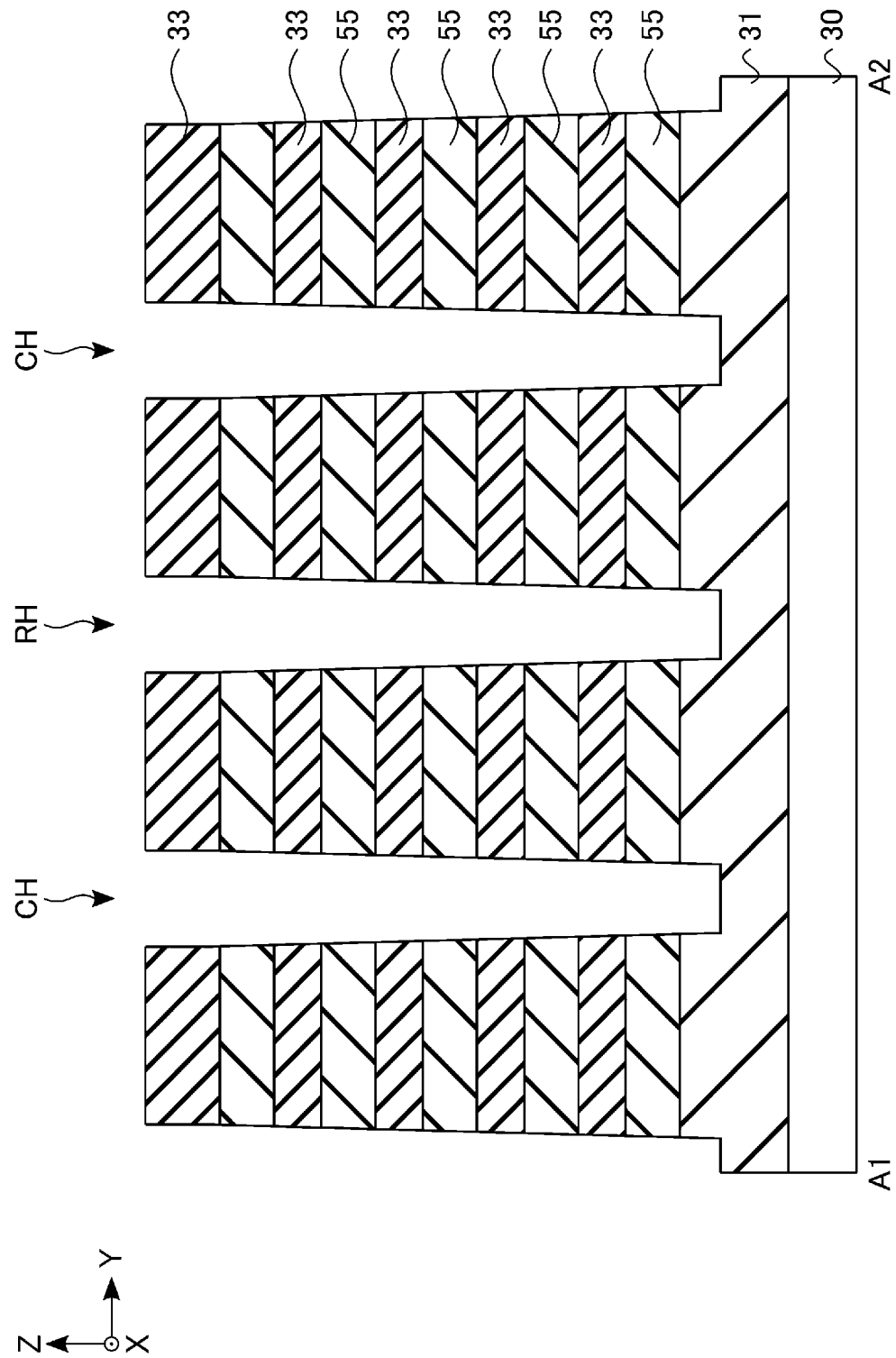
FIG. 10 is a cross-sectional view taken along line A1-A2 of FIG. 9.

As illustrated in FIGS. 9 and 10, the insulator 31 is formed on the semiconductor substrate 30. In this state, five layers of sacrificial films 55 corresponding to the semiconductor 32 and five layers of insulators 33 are alternately stacked on the insulator 31. The sacrificial film 55 is used for the replacement with the semiconductor 32. As the sacrificial film 55, a material where sufficient selectivity of wet etching with the insulator 33 can be obtained is used. Hereinafter, a case where silicon nitride (SiN) is used as the sacrificial film 55 will be described.

Next, a plurality of holes CH, RH, and DH that penetrate the five layers of sacrificial films 55 and the five layers of insulators 33 such that bottom surfaces thereof reach the insulator 31 are collectively formed. The hole CH is used for forming the electrode pillar CGP. The holes RH is used for the replacement of the sacrificial films 55. The hole DH is used for forming the insulator 35. The diameters of the holes CH, RH, and DH may be the same as or different from each other. In addition, the shape of the holes CH, RH, and DH on an XY plane is not limited to a circular (true circle) shape. Each of the holes may have an elliptical shape or a rectangular shape. In addition, the cross-sectional shape of the holes CH, RH, and DH is not limited to a tapered shape. The cross-sectional shape of each of the holes may be a shape where the side surface is straight in the Z direction or a bowing shape.

Figure 11:
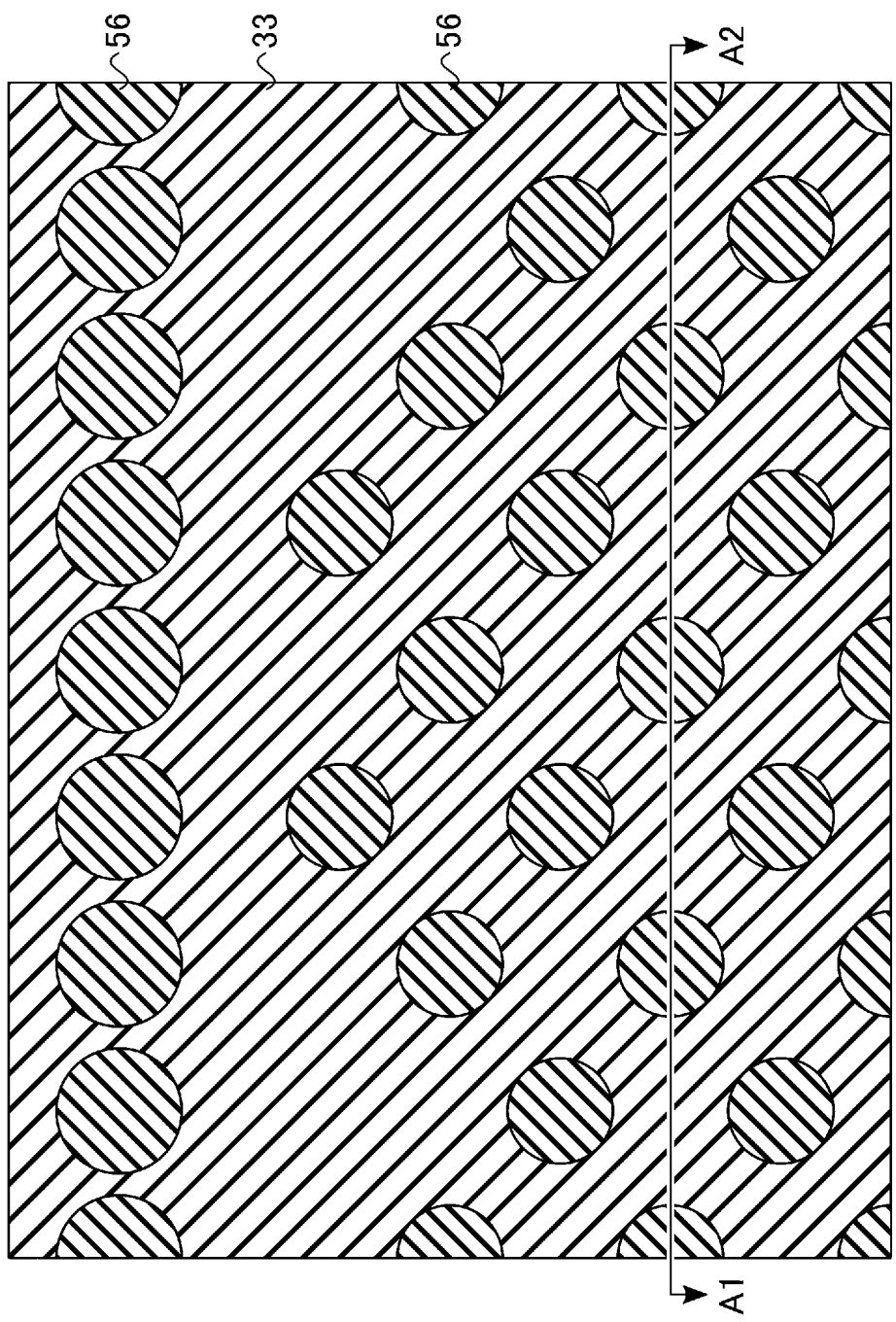
FIG. 11 is a plan view illustrating a manufacturing step of the memory cell array in the semiconductor memory device according to the embodiment.
Figure 12:
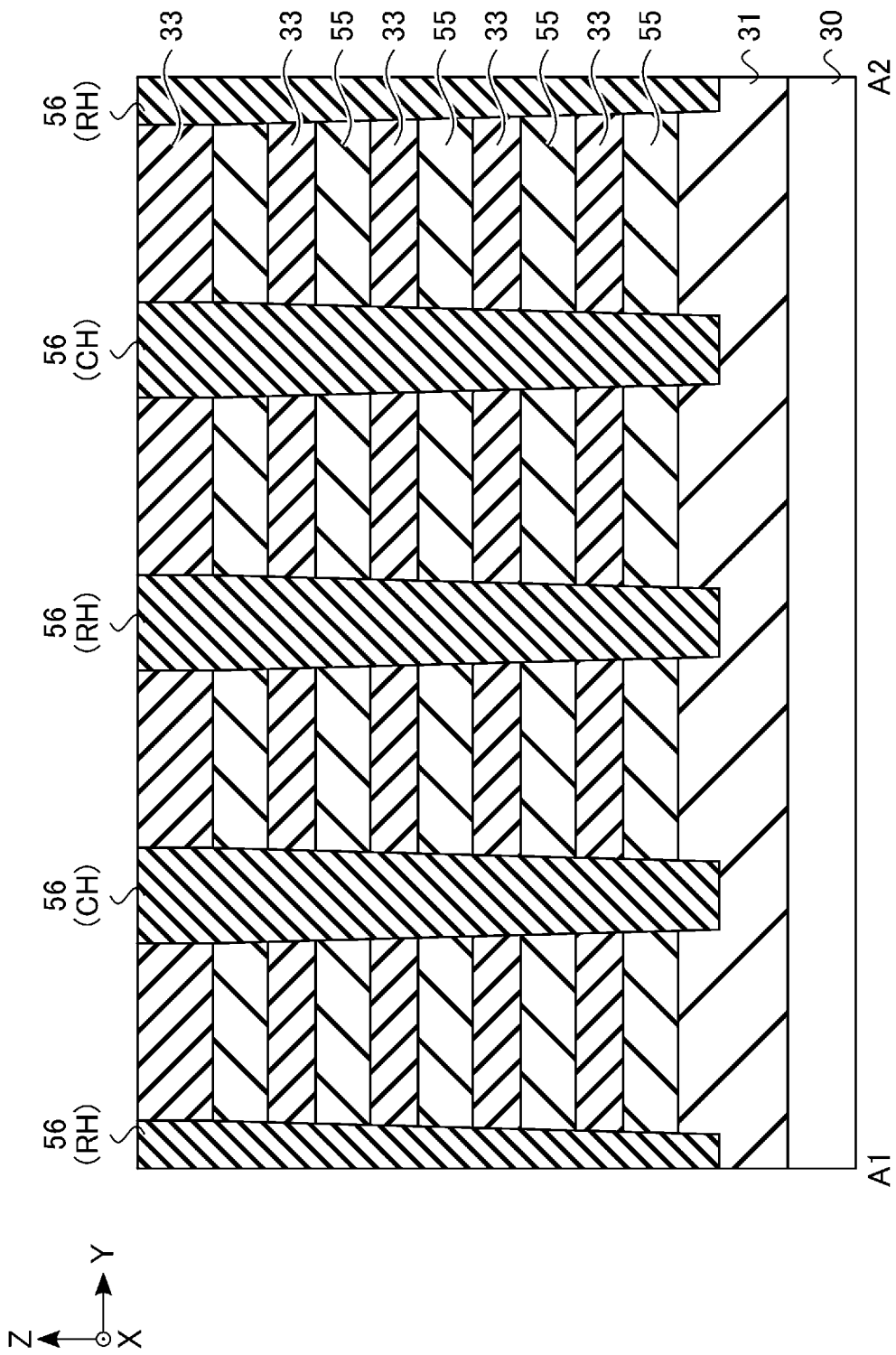
FIG. 12 is a cross-sectional view taken along line A1-A2 of FIG. 11.

As illustrated in FIGS. 11 and 12, the holes CH, RH, and DH are embedded with sacrificial films 56, and the sacrificial film 56 in the insulator 33 of the uppermost layer is removed. The sacrificial films 56 are used for temporarily embedding the holes CH, RH, and DH in the manufacturing step of the memory cell array 11. As the sacrificial film 56, a material where sufficient selectivity of wet etching with the insulator 33 and the sacrificial films 55 can be obtained is used. The sacrificial film 56 may be, for example, a material including carbon or a stacked structure including thin films of SiO$_2$ and polysilicon. Hereinafter, a case where the sacrificial film 56 is a carbon film will be described.

Figure 13:
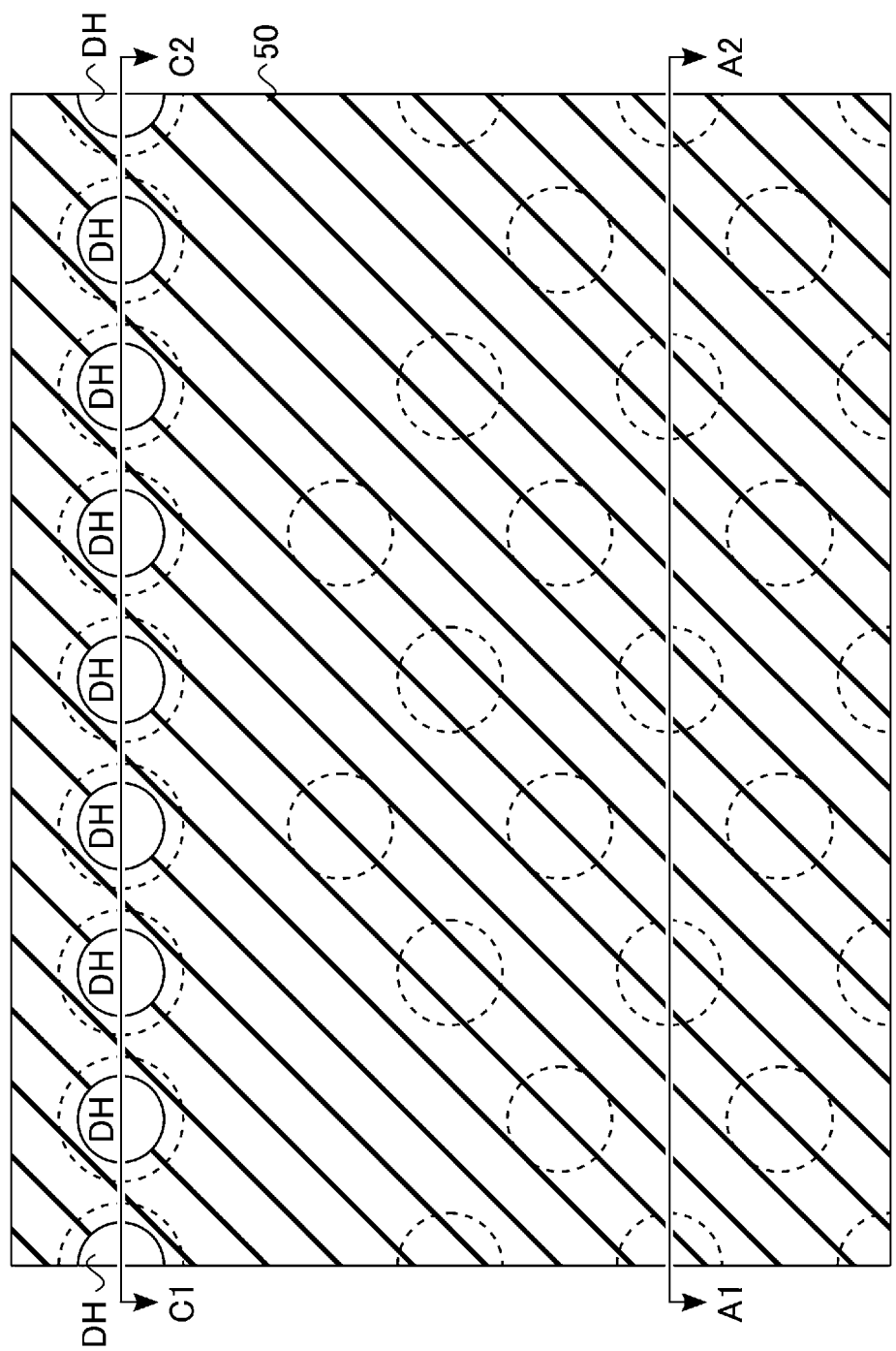
FIG. 13 is a plan view illustrating a manufacturing step of the memory cell array in the semiconductor memory device according to the embodiment.
Figure 14:
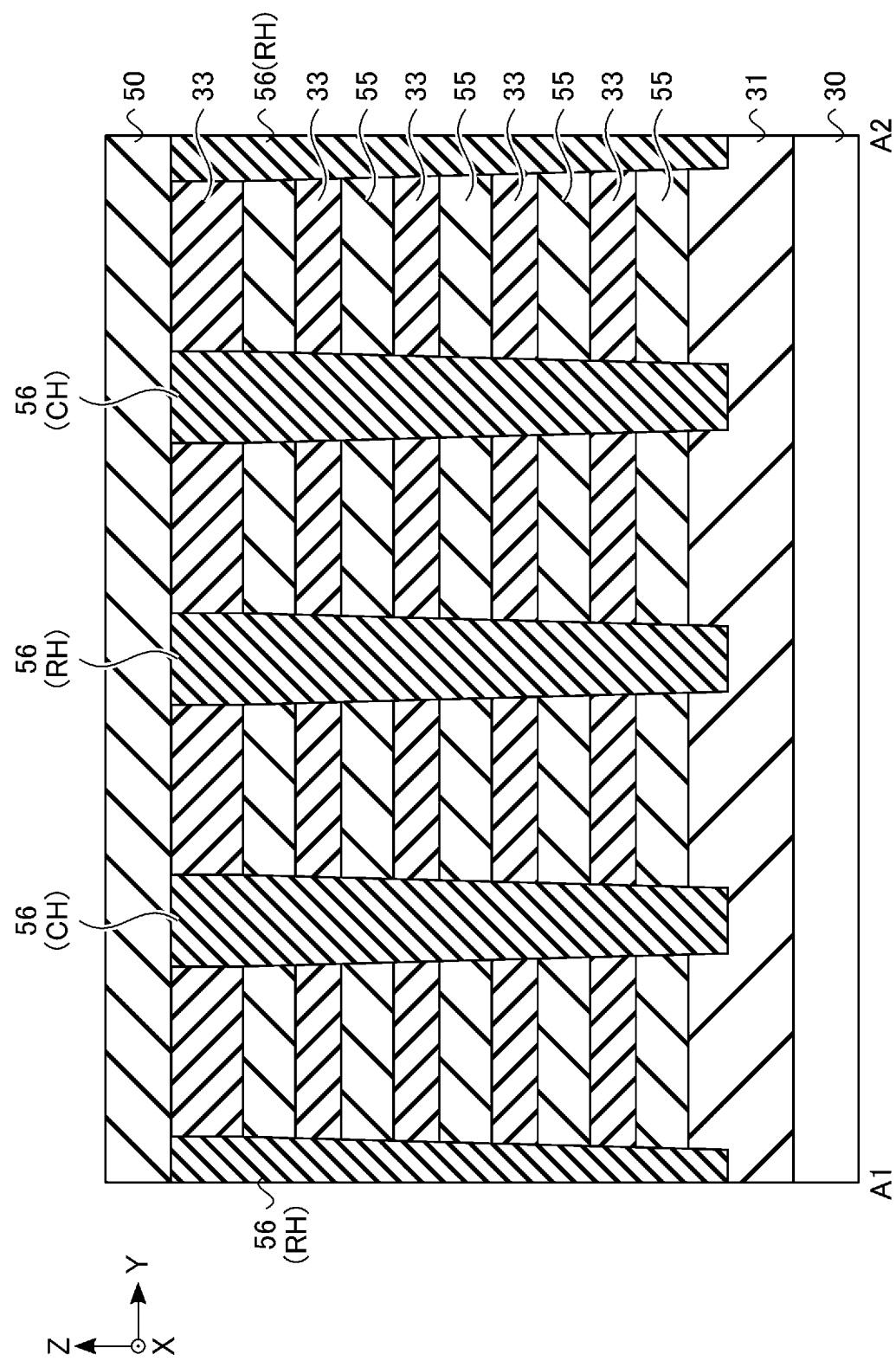
FIG. 14 is a cross-sectional view taken along line A1-A2 of FIG. 13.
Figure 15:
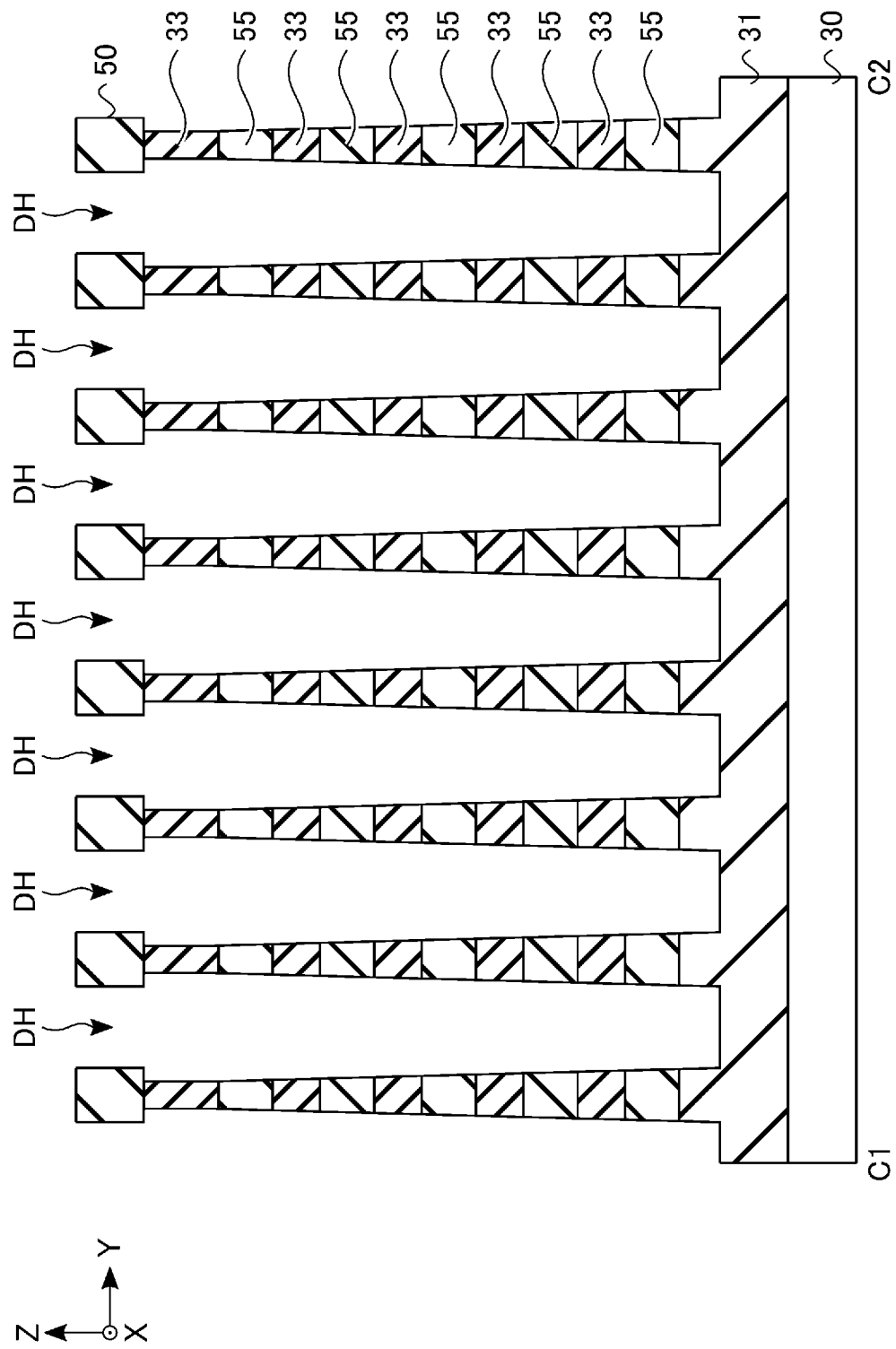
FIG. 15 is a cross-sectional view taken along line C1-C2 of FIG. 13.
Figure 16:
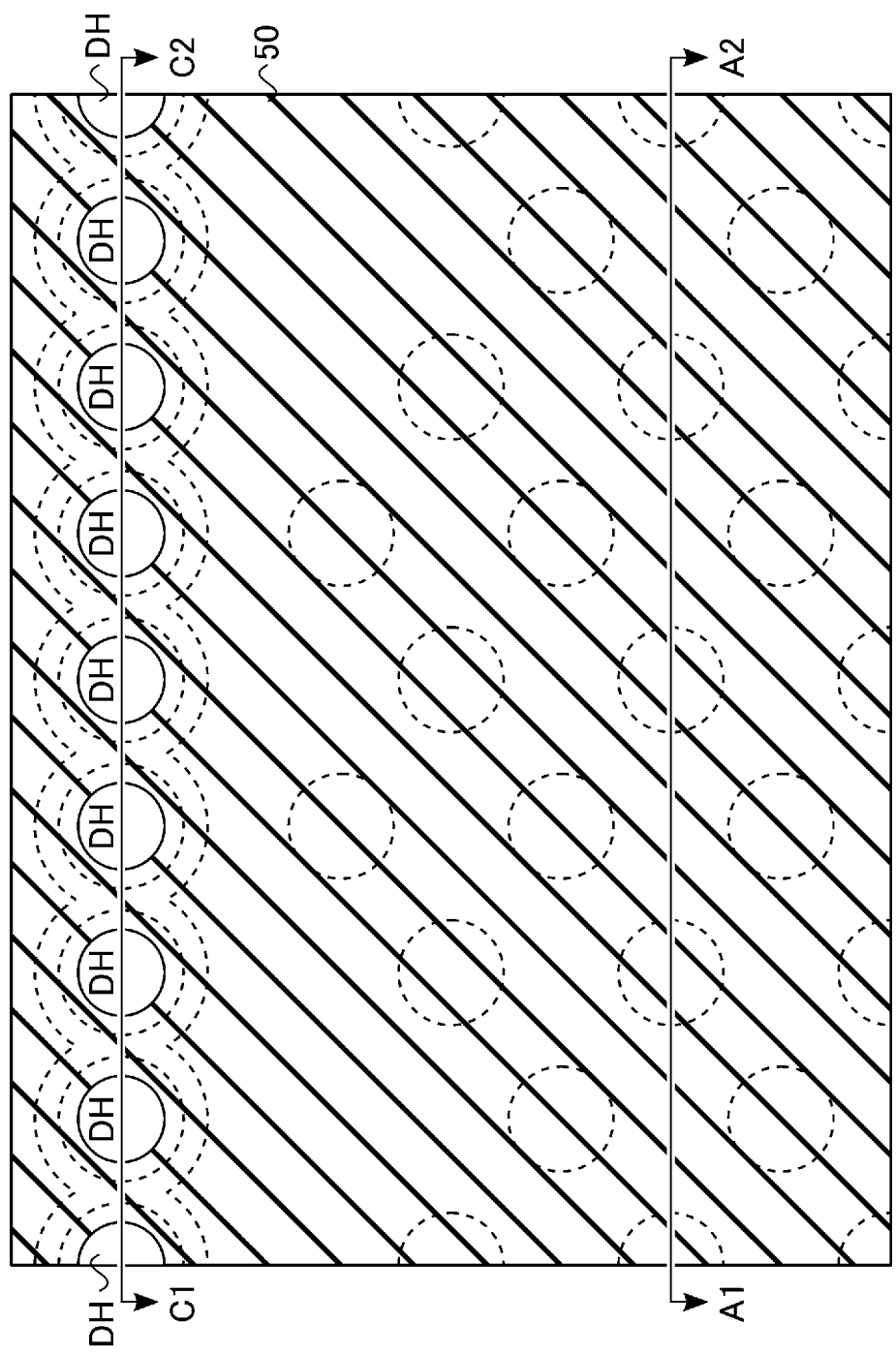
FIG. 16 is a plan view illustrating a manufacturing step of the memory cell array in the semiconductor memory device according to the embodiment.
Figure 17:
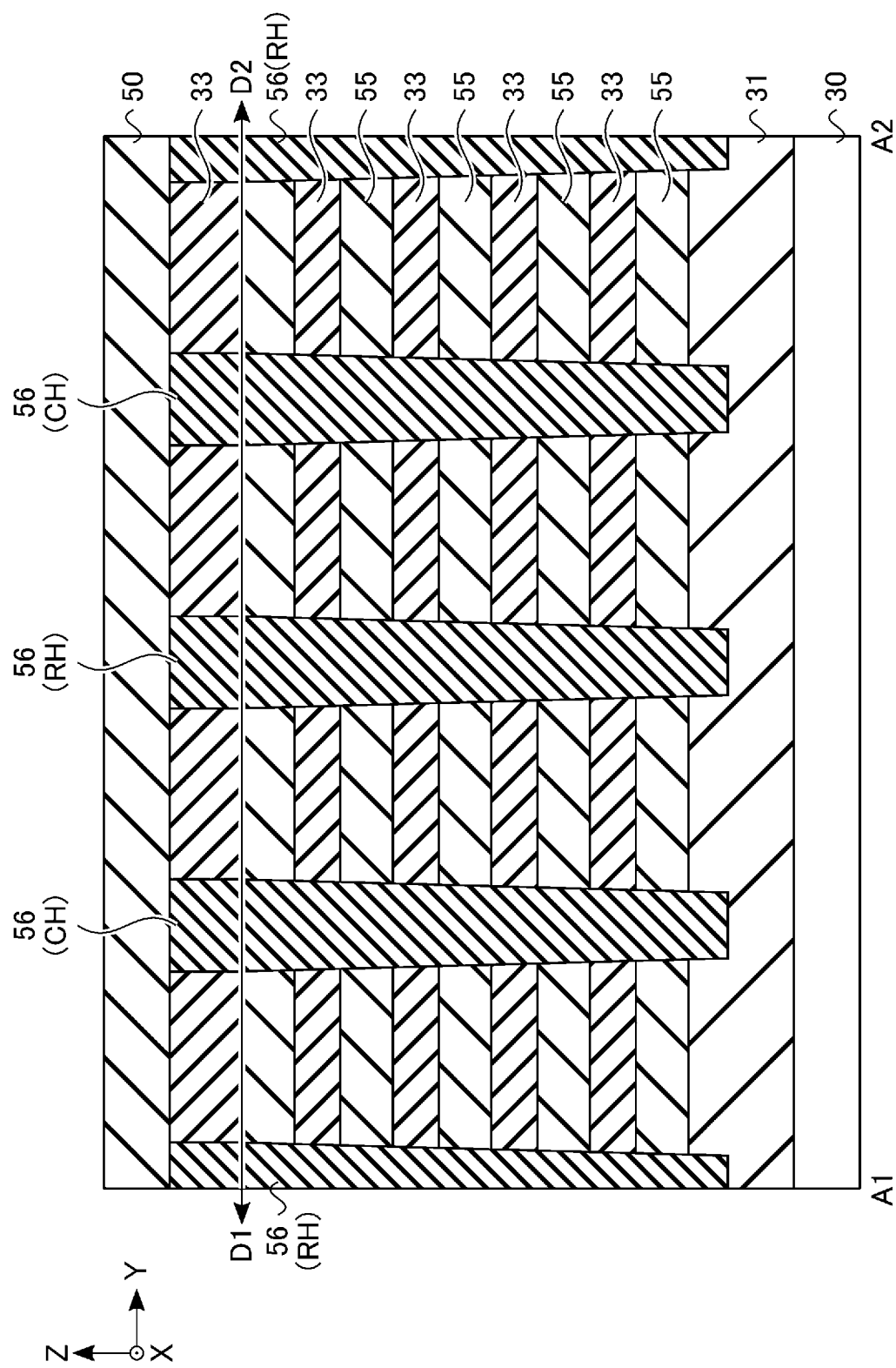
FIG. 17 is a cross-sectional view taken along line A1-A2 of FIG. 16.
Figure 18:
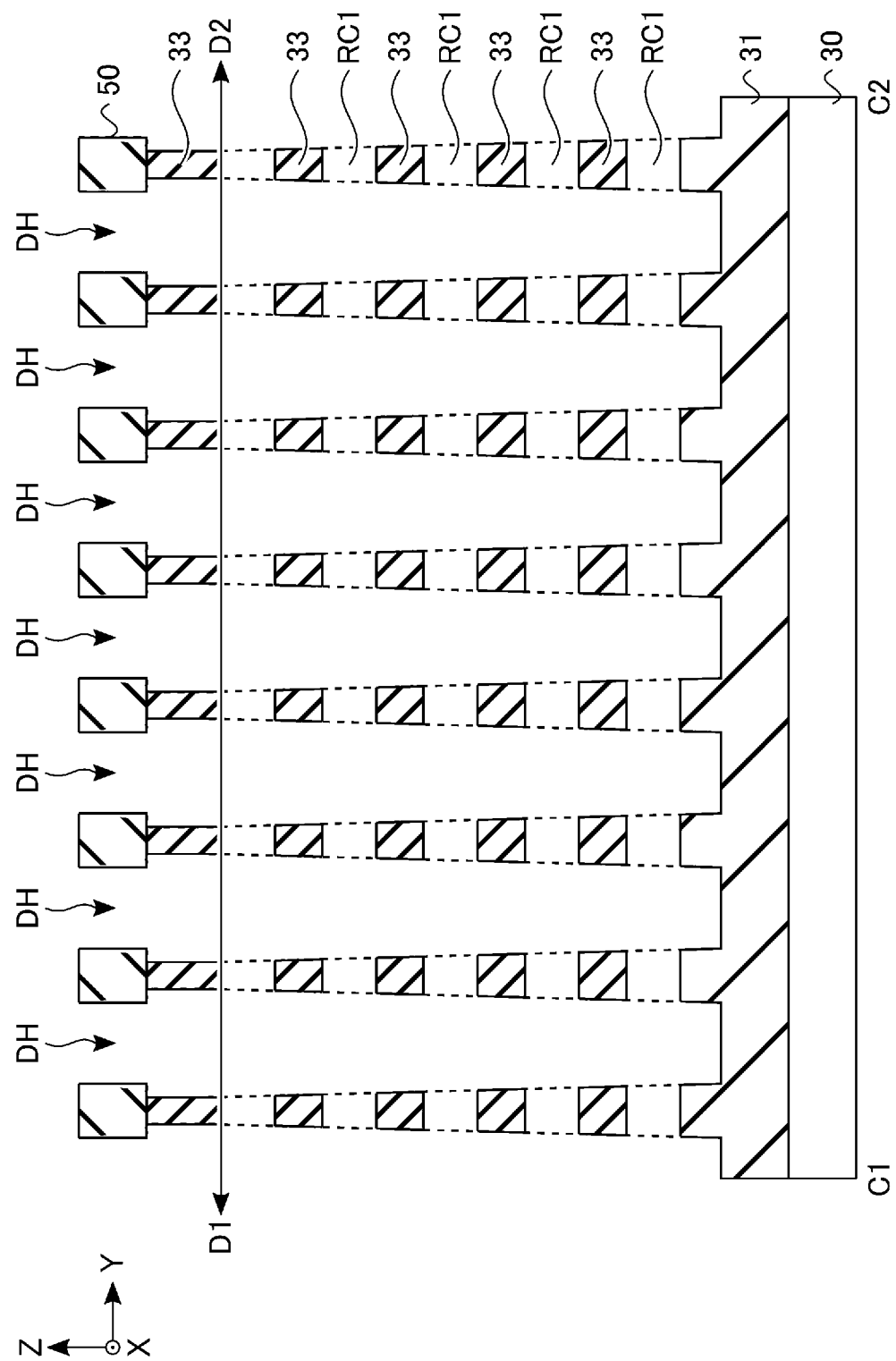
FIG. 18 is a cross-sectional view taken along line C1-C2 of FIG. 16.

As illustrated in FIGS. 13 to 15, the insulator 50 is formed on the insulator 33 in the uppermost layer and on the sacrificial film 56 formed in the holes CH, RH, and DH.

Next, the insulator 50 on the hole DH is processed (opening is formed) such that the sacrificial film 56 in the hole DH is exposed. In the examples of FIGS. 13 and 15, a case where the opening size of the insulator 50 is less than the diameter of the hole DH on the upper surface of the insulator 33 in the uppermost layer is illustrated, but the opening size of the insulator 50 is not limited to this case. The opening size of the insulator 50 may be the same as or more than the diameter of the hole DH on the upper surface of the insulator 33 in the uppermost layer. Next, the sacrificial film 56 in the hole DH is removed. For example, when the sacrificial film 56 is a carbon film, the sacrificial film 56 in the hole DH is removed by $O_2$ asking.

Figure 19:
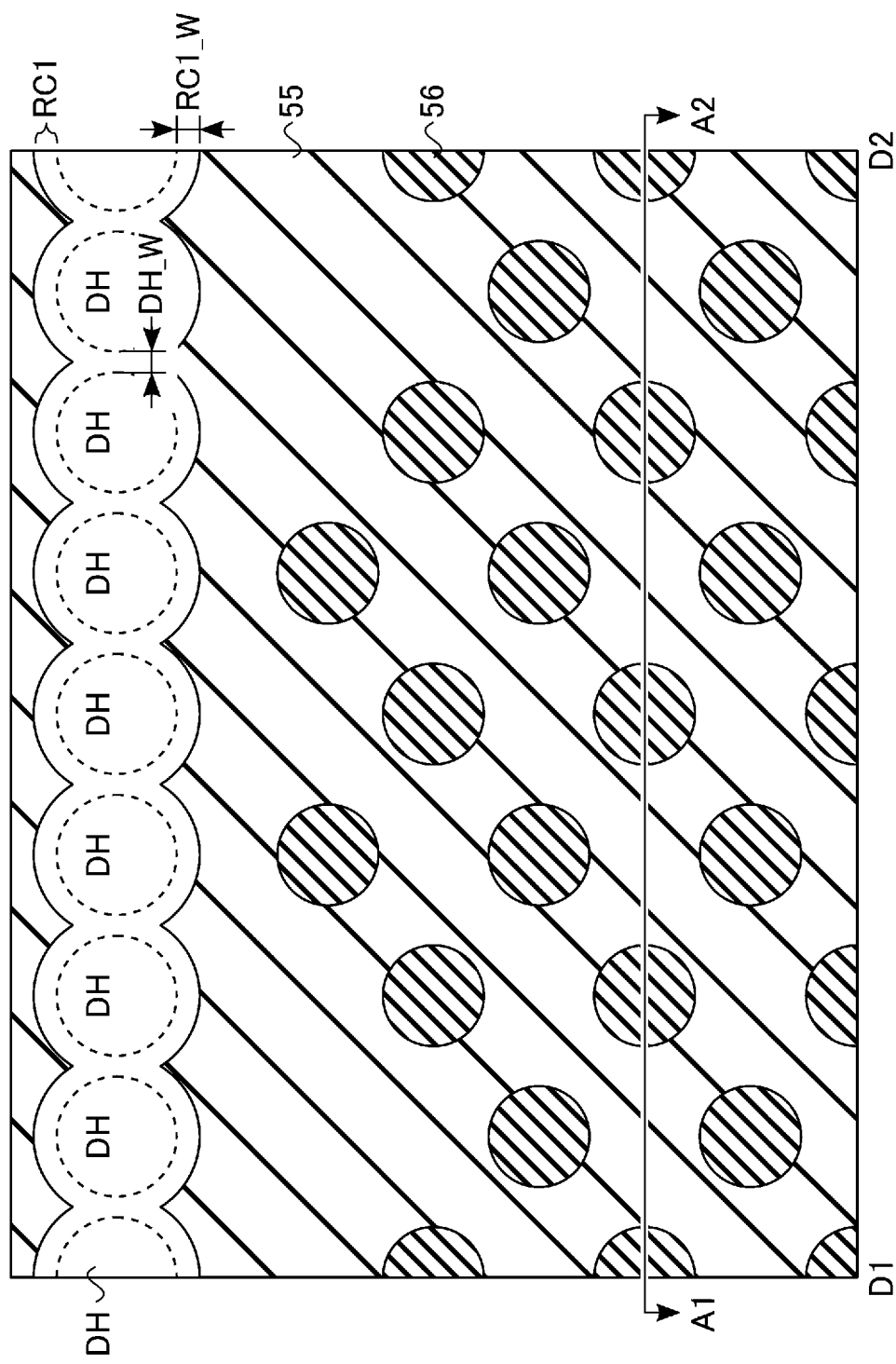
FIG. 19 is a plan view taken along line D1-D2 of FIGS. 17 and 18.

As illustrated in FIGS. 16 to 19, the side surface of the sacrificial film 55 exposed in the hole DH is processed by wet etching such that a recessed region that spreads concentrically from the hole DH is formed. Hereinafter, the step of processing the hole side surface to form the recessed region will be referred to as "recess etching", and the recessed region will be referred to as "recessed region RC". As illustrated in FIG. 19, in the recess etching using the hole DH, the etching amount (hereinafter, referred to as "recess amount") that is, a recess width RC1_W of a recessed region RC1 is adjusted such that the sacrificial film 55 between the holes DH disposed in the Y direction is removed. The recess width RC1_W is the distance from an end portion of the opening of the insulator 33 formed by the hole DH to a portion of the insulator 33 in contact with the semiconductor 36. Accordingly, the recess width RC1_W of the recessed region RC1 is longer than a distance DH_W between two holes DH. Therefore, the recessed region RC1 has a shape in which the recessed regions RC1 having a cylindrical shape provided in the outer circumferences of the holes DH are connected in the Y direction.

Figure 20:
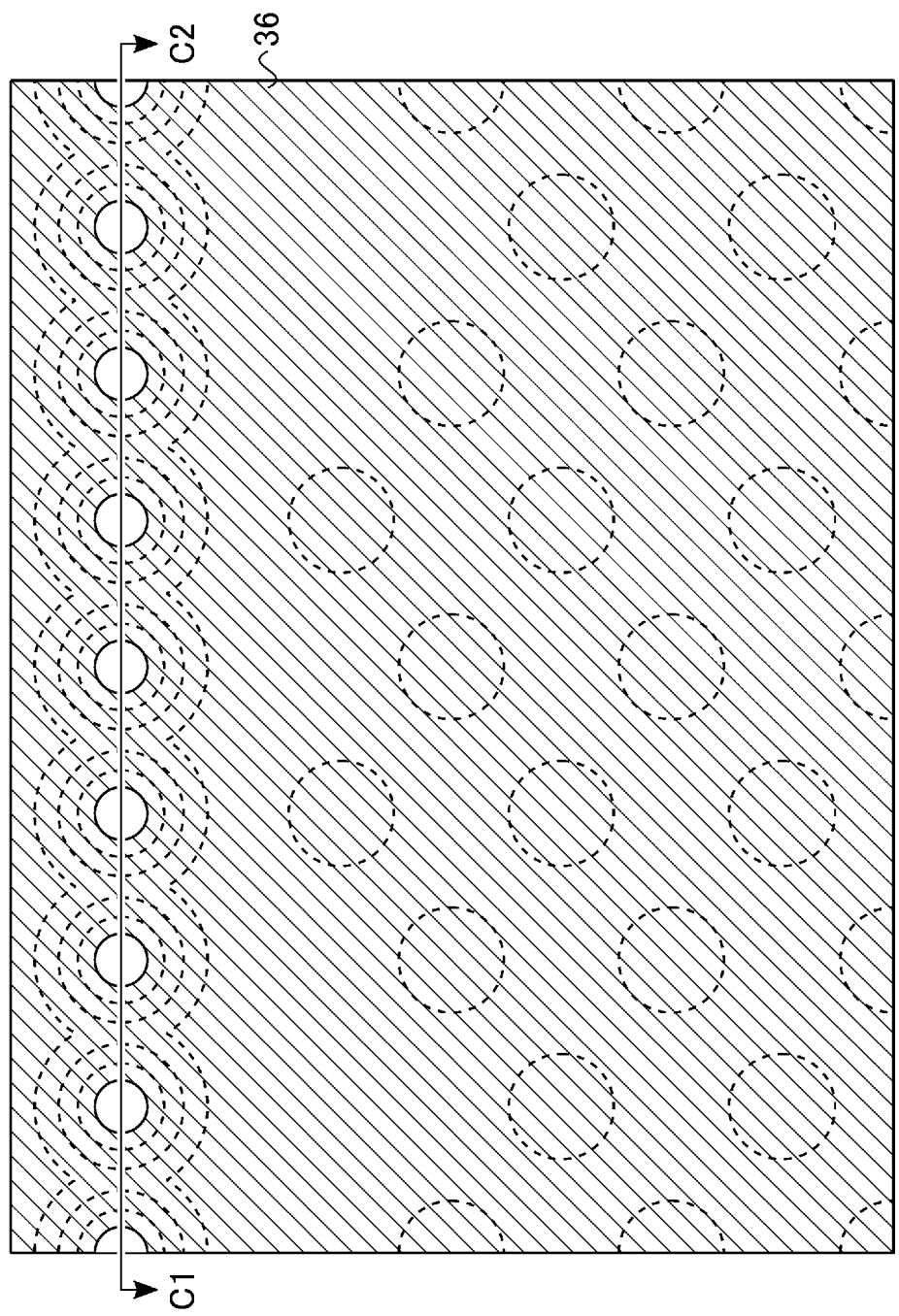
FIG. 20 is a plan view illustrating a manufacturing step of the memory cell array in the semiconductor memory device according to the embodiment.
Figure 21:
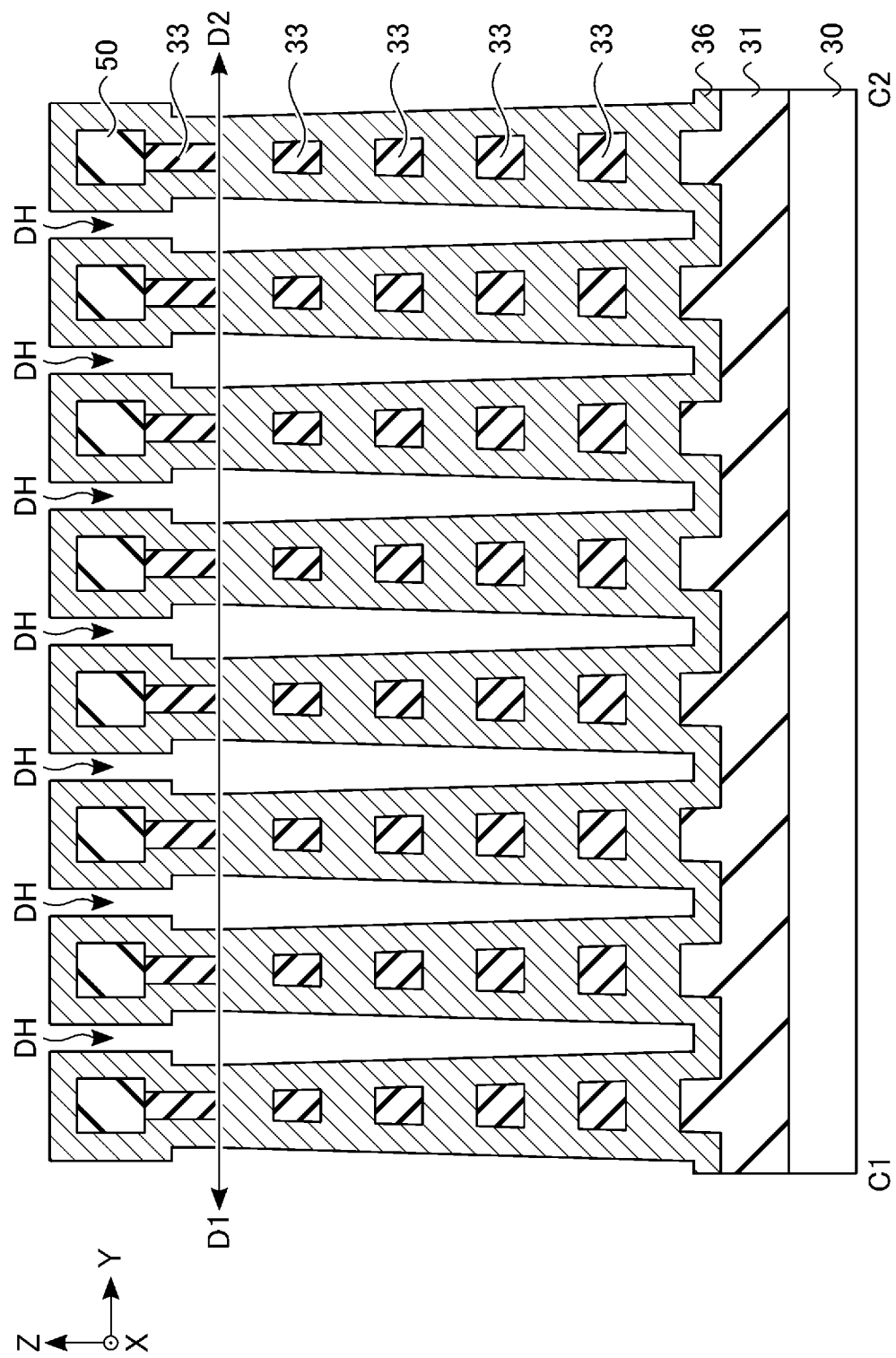
FIG. 21 is a cross-sectional view taken along line C1-C2 of FIG. 20.
Figure 22:
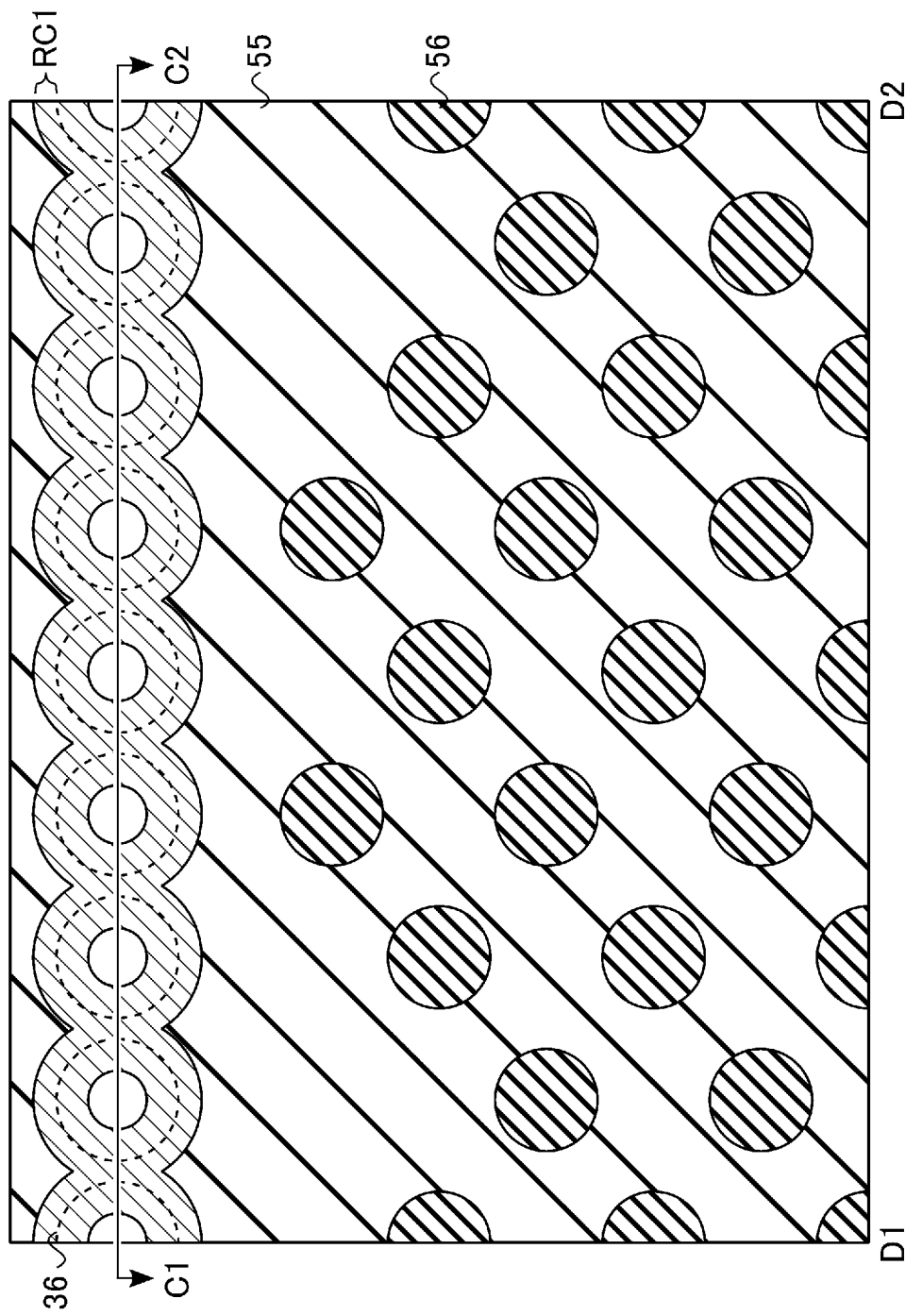
FIG. 22 is a plan view taken along line D1-D2 of FIG. 21.

As illustrated in FIGS. 20 to 22, the semiconductor 36 is formed and is embedded in the recessed region RC1. For example, as the semiconductor 36, a P-doped amorphous silicon film is formed by chemical vapor deposition (CVD). At this time, the thickness of the semiconductor 36 is the thickness of a film that is embedded in the recessed region RC1 without blocking the opening of the hole DH.

Figure 23:
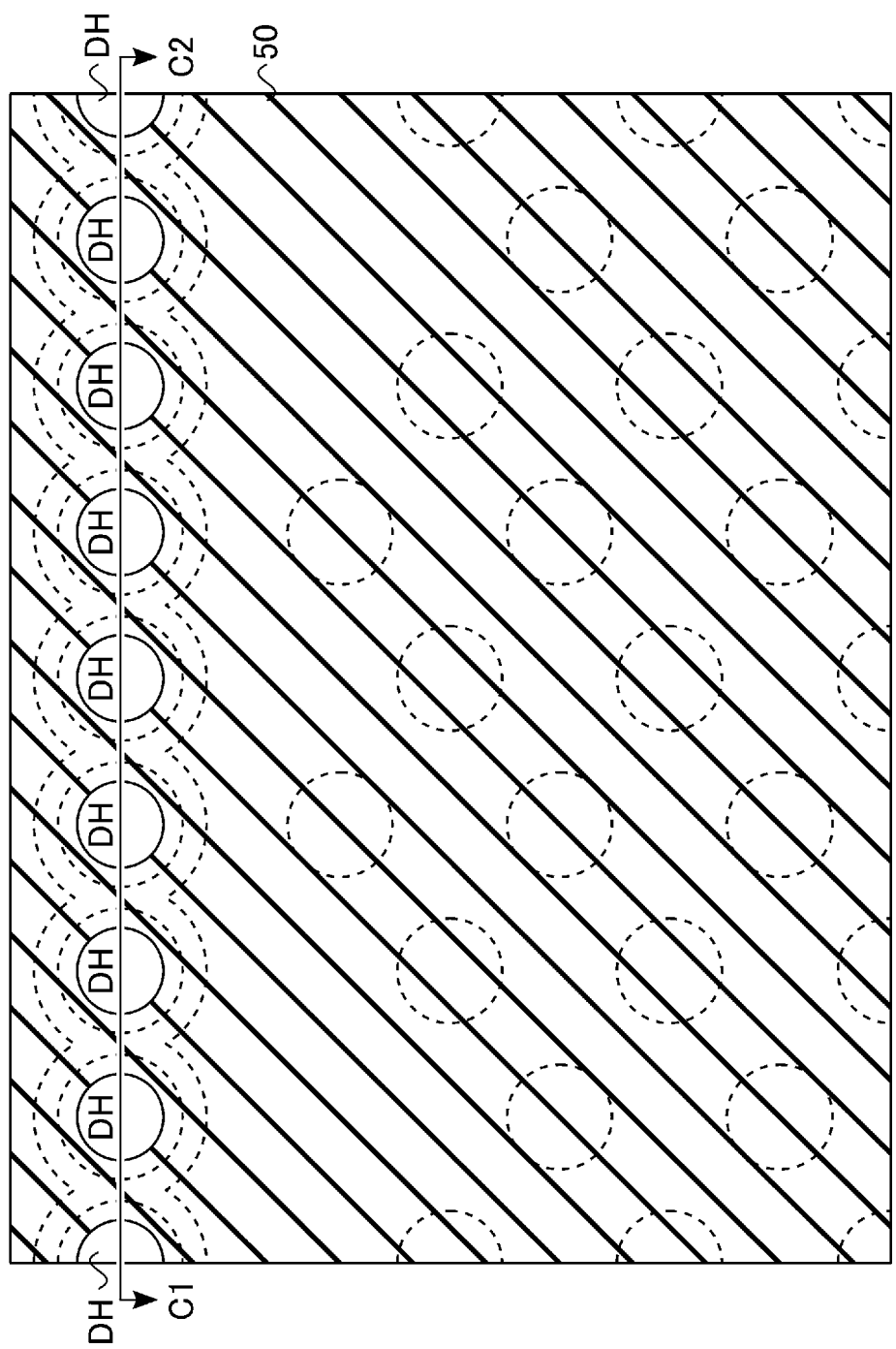
FIG. 23 is a plan view illustrating a manufacturing step of the memory cell array in the semiconductor memory device according to the embodiment.
Figure 24:
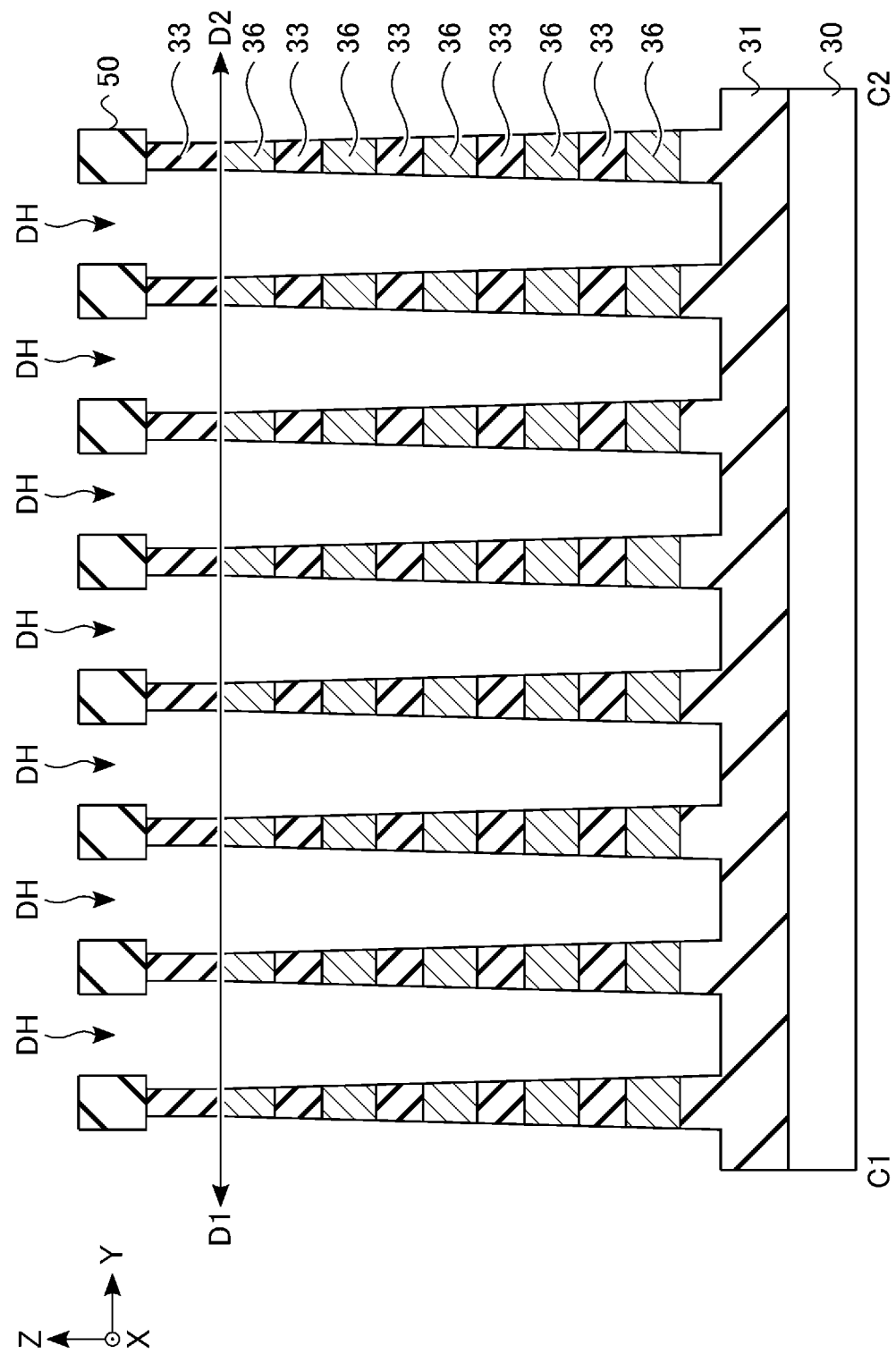
FIG. 24 is a cross-sectional view taken along line C1-C2 of FIG. 23.
Figure 25:
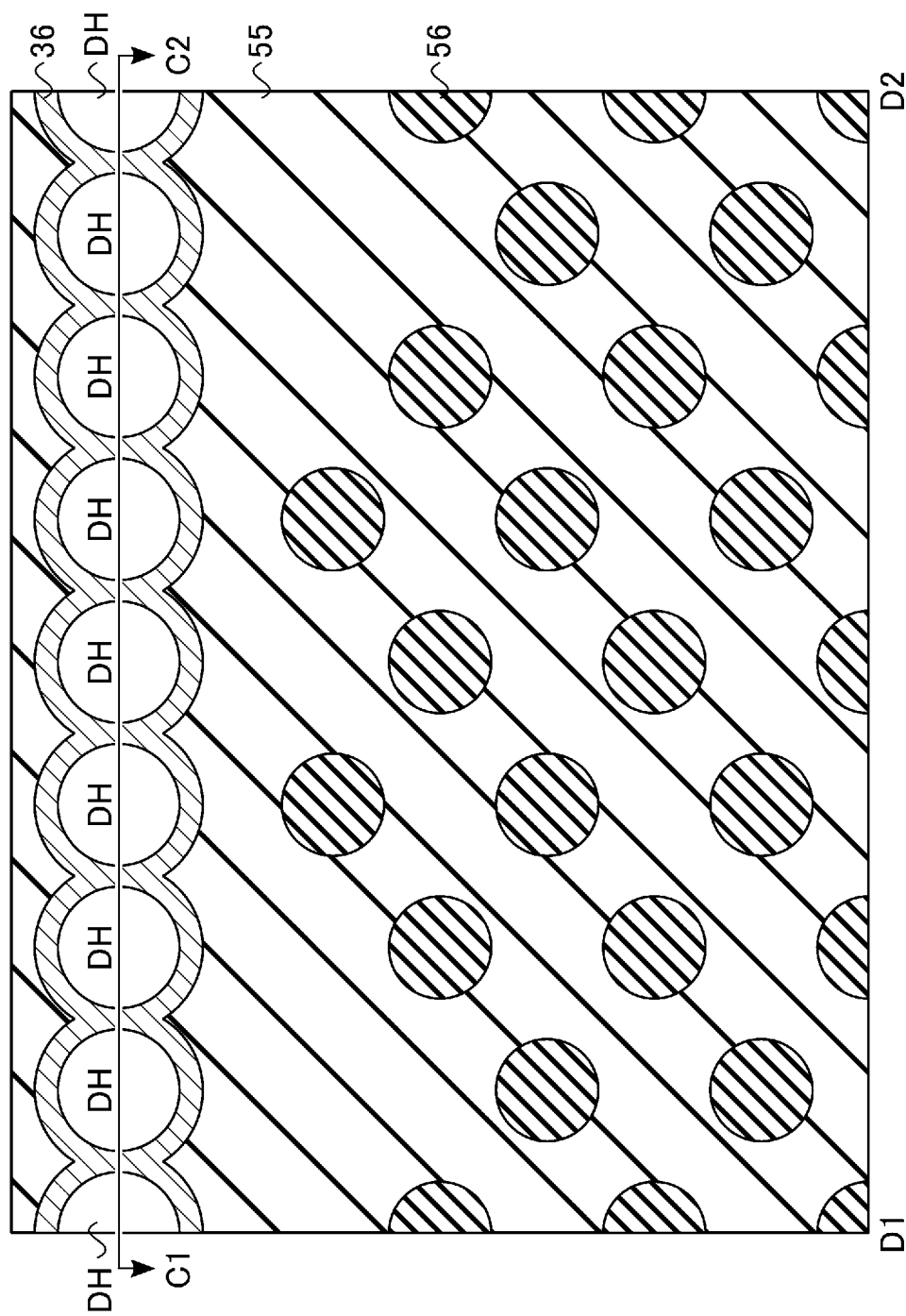
FIG. 25 is a plan view taken along line D1-D2 of FIG. 24.

As illustrated in FIGS. 23 to 25, the semiconductor 36 on the insulator 50 and on the side surface and the bottom surface of the hole DH is removed by wet etching or isotropic etching such as chemical dry etching (CDE). At this time, etching conditions of the recess etching are controlled such that the semiconductor 36 remains in the recessed region RC1 and is not connected to the semiconductor 36 in another layer. Hereinafter, the step of embedding the recessed region RC will be referred to as "recess embedding". As illustrated in FIG. 24, when the opening size of the hole DH on the bottom surface of the insulator 50 is less than the diameter of the hole DH on the upper surface of the insulator 33 in the uppermost layer, a step difference is generated between the insulators 33 and 50. In this case, the semiconductor 36 may remain in the step difference portion. In addition, the semiconductor 36 may remain in the bottom of the hole DH.

Figure 26:
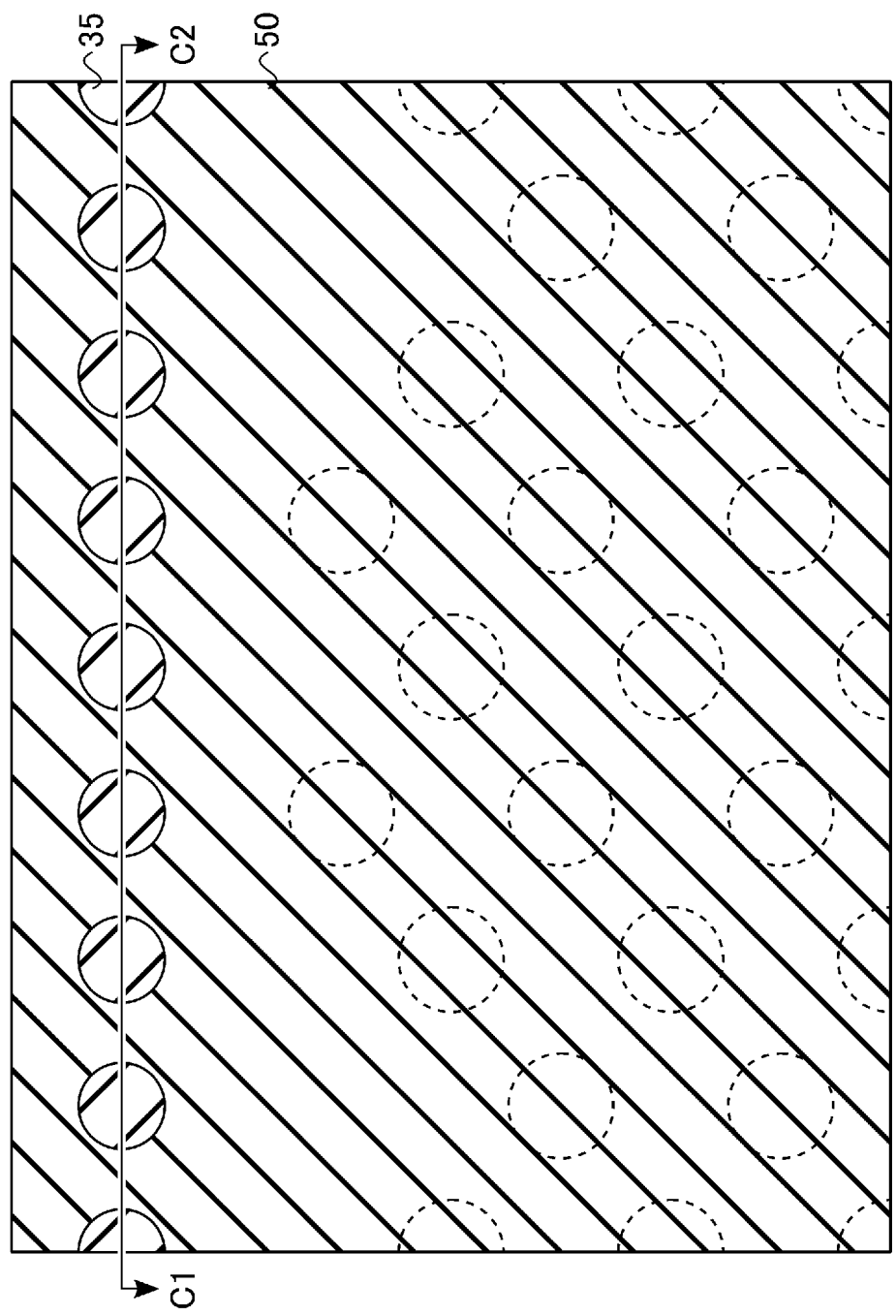
FIG. 26 is a plan view illustrating a manufacturing step of the memory cell array in the semiconductor memory device according to the embodiment.
Figure 27:
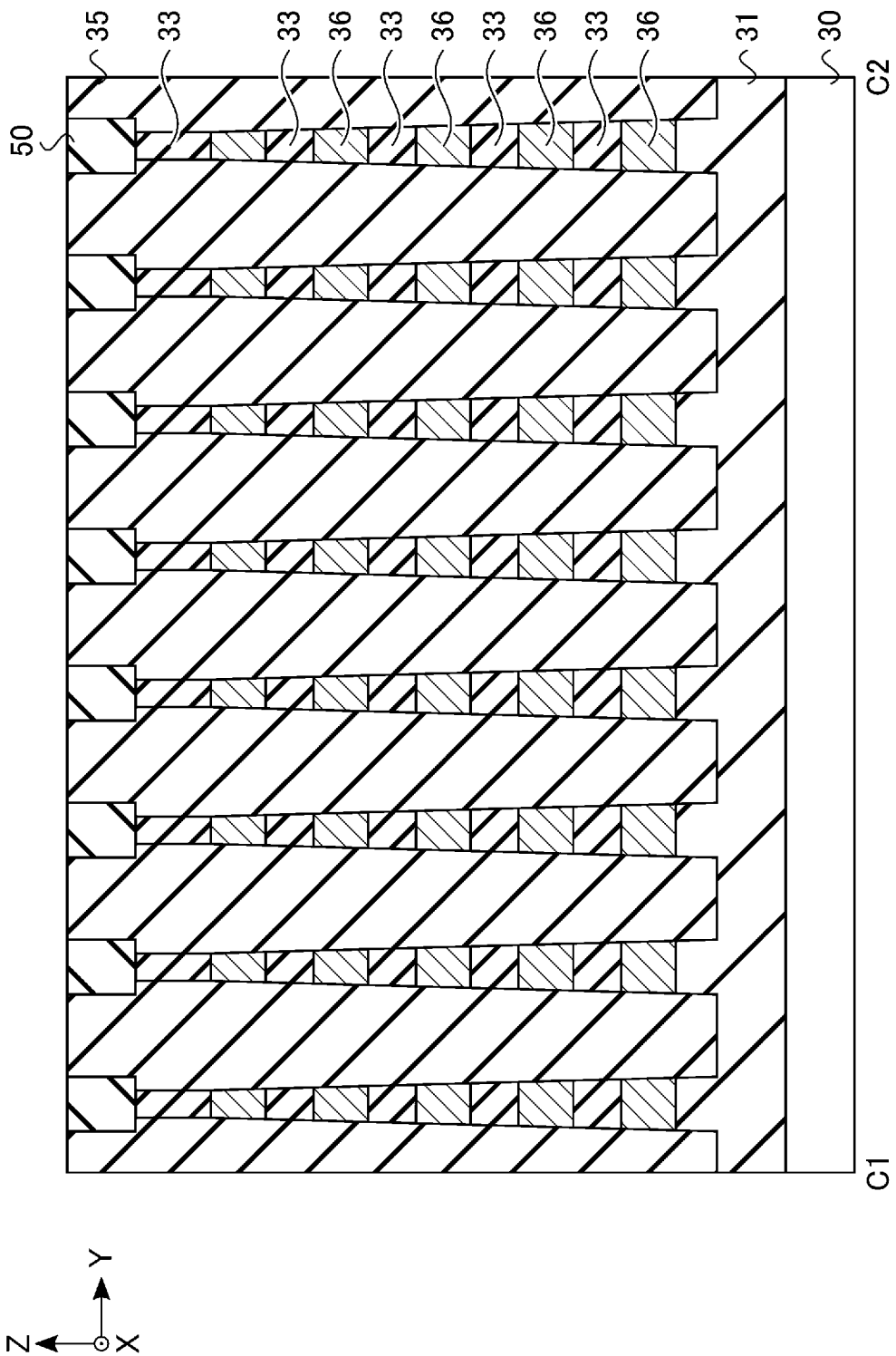
FIG. 27 is a cross-sectional view taken along line C1-C2 of FIG. 26.

As illustrated in FIGS. 26 and 27, the hole DH is embedded with the insulator 35, and the insulator 35 on the insulator 50 is removed. The insulator 35 may remain on the insulator 50. In addition, a void may be formed in the insulator 35.

Figure 28:
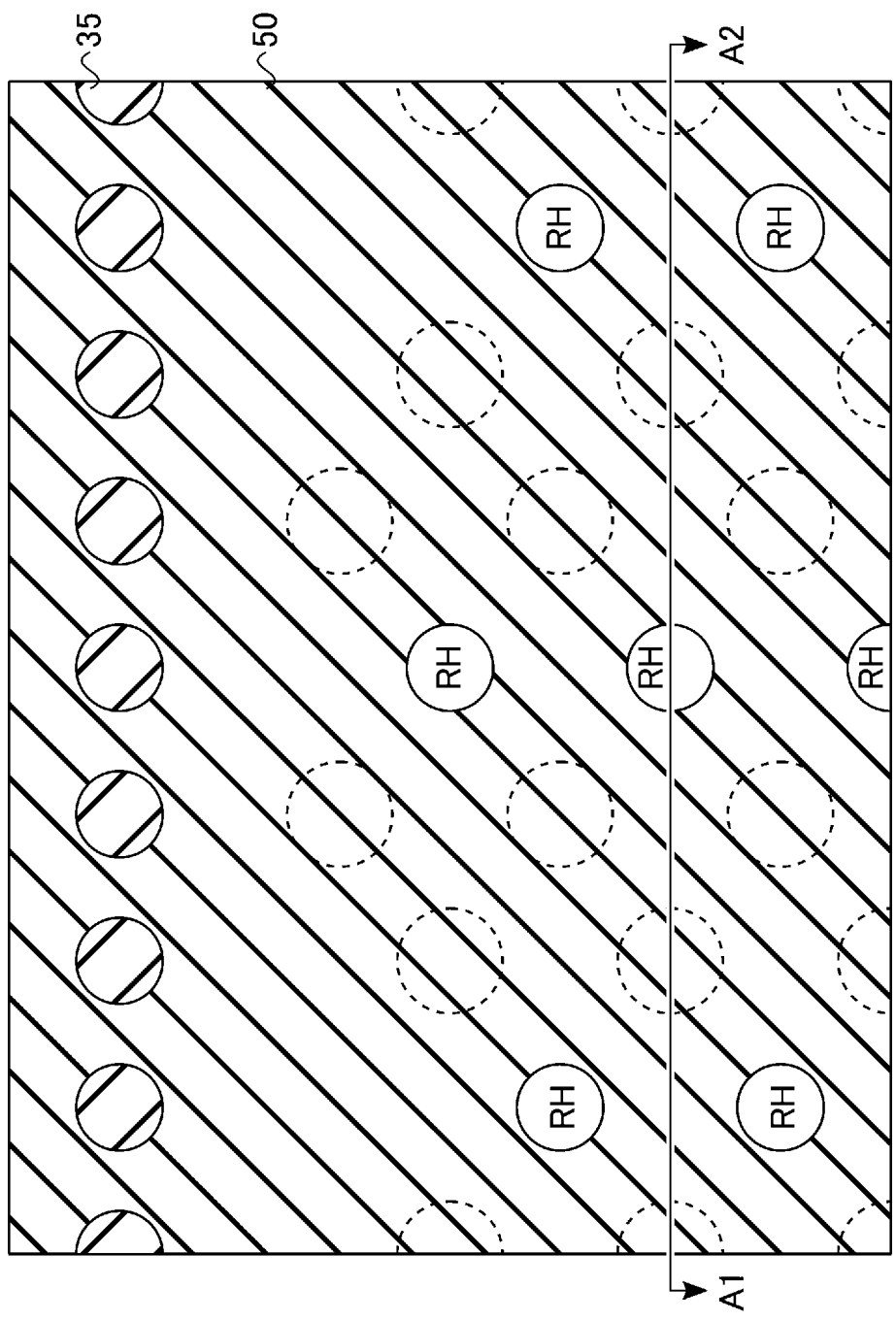
FIG. 28 is a plan view illustrating a manufacturing step of the memory cell array in the semiconductor memory device according to the embodiment.
Figure 29:
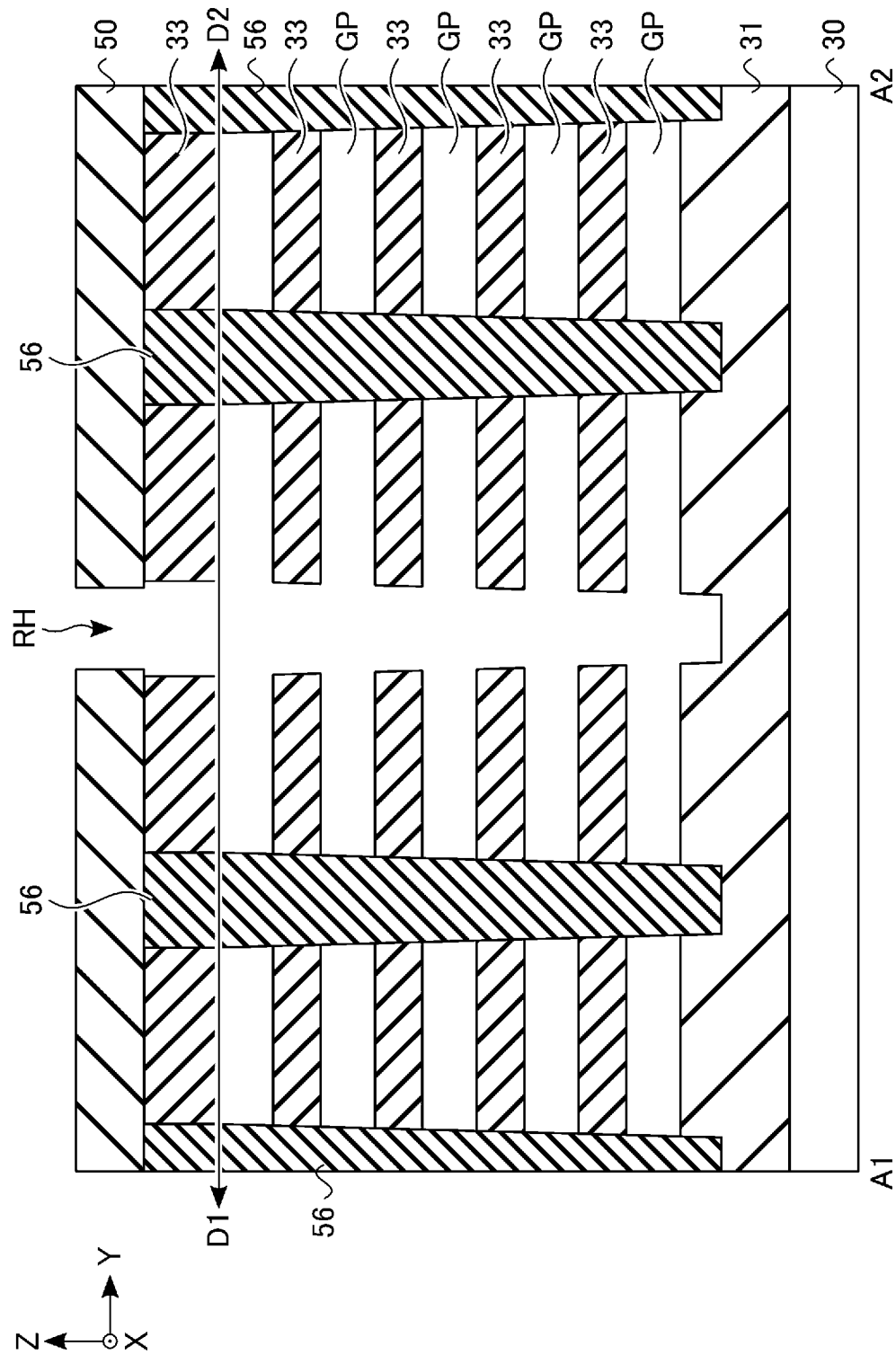
FIG. 29 is a cross-sectional view taken along line A1-A2 of FIG. 28.
Figure 30:
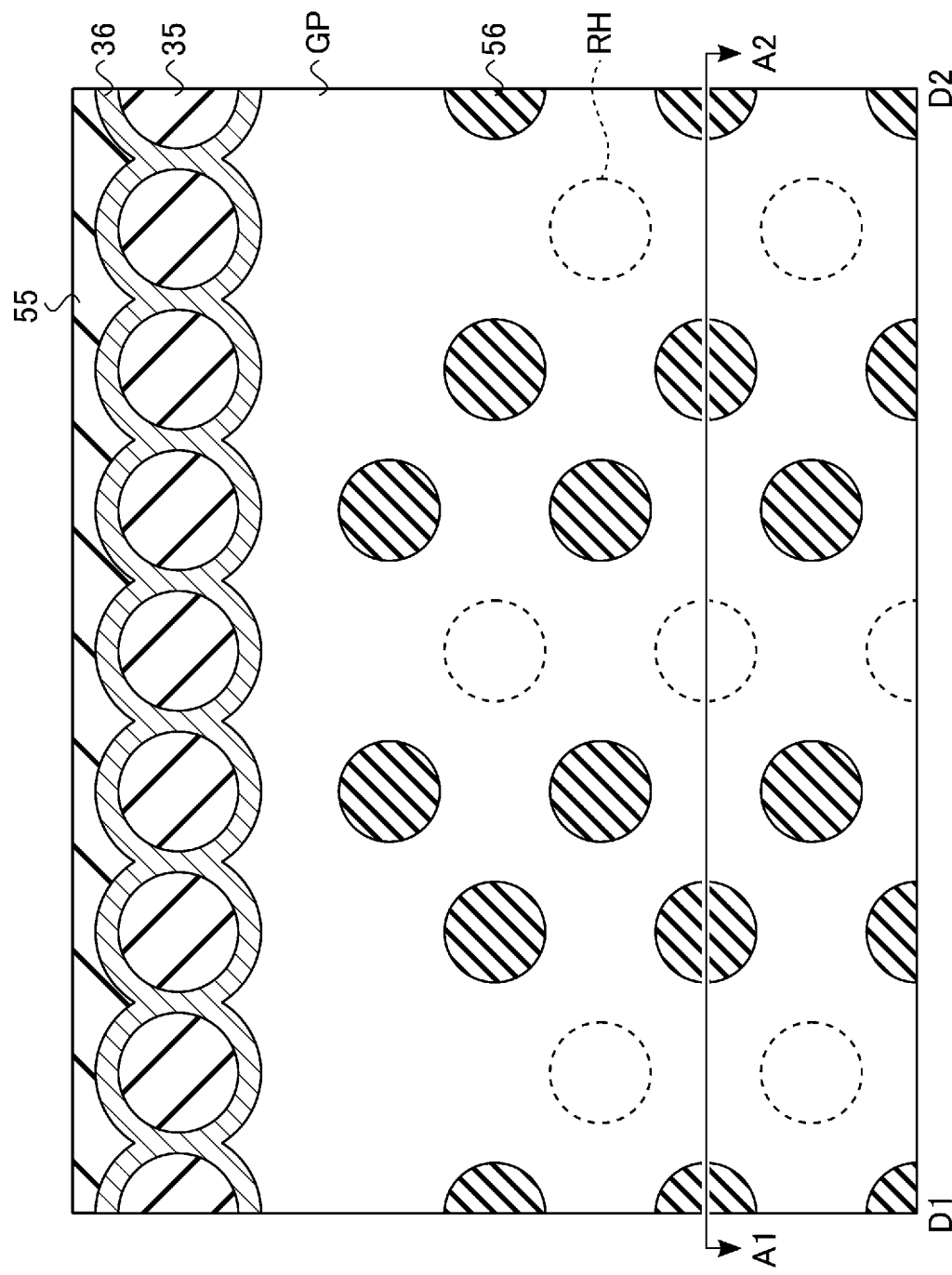
FIG. 30 is a plan view taken along line D1-D2 of FIG. 29.

As illustrated in FIGS. 28 to 30, the insulator 50 on the hole RH is processed (opening is formed) such that the sacrificial film 56 in the hole RH is exposed, and subsequently the sacrificial film 56 in the hole RH is removed.

Next, the sacrificial film 55 is removed by wet etching or isotropic etching such as chemical dry etching (CDE) such that a gap GP is formed between the layers of insulators 31 and the layers of insulator 33 and between the layers of insulators 33. At this time, as illustrated in FIG. 30, the sacrificial film 55 is removed until the side surface of the semiconductor 36 in contact with the sacrificial film 55 is exposed.

Figure 31:
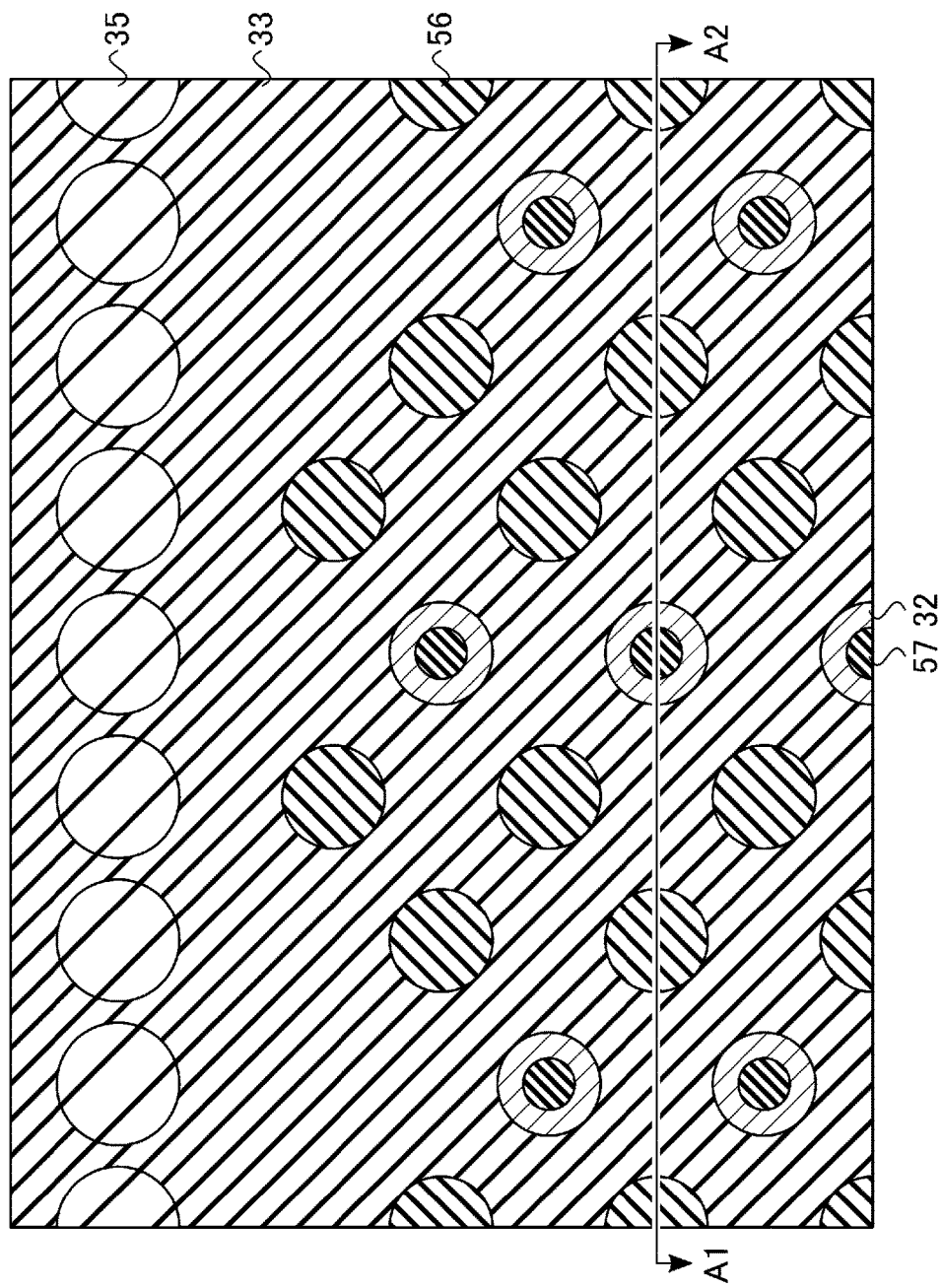
FIG. 31 is a plan view illustrating a manufacturing step of the memory cell array in the semiconductor memory device according to the embodiment.
Figure 32:
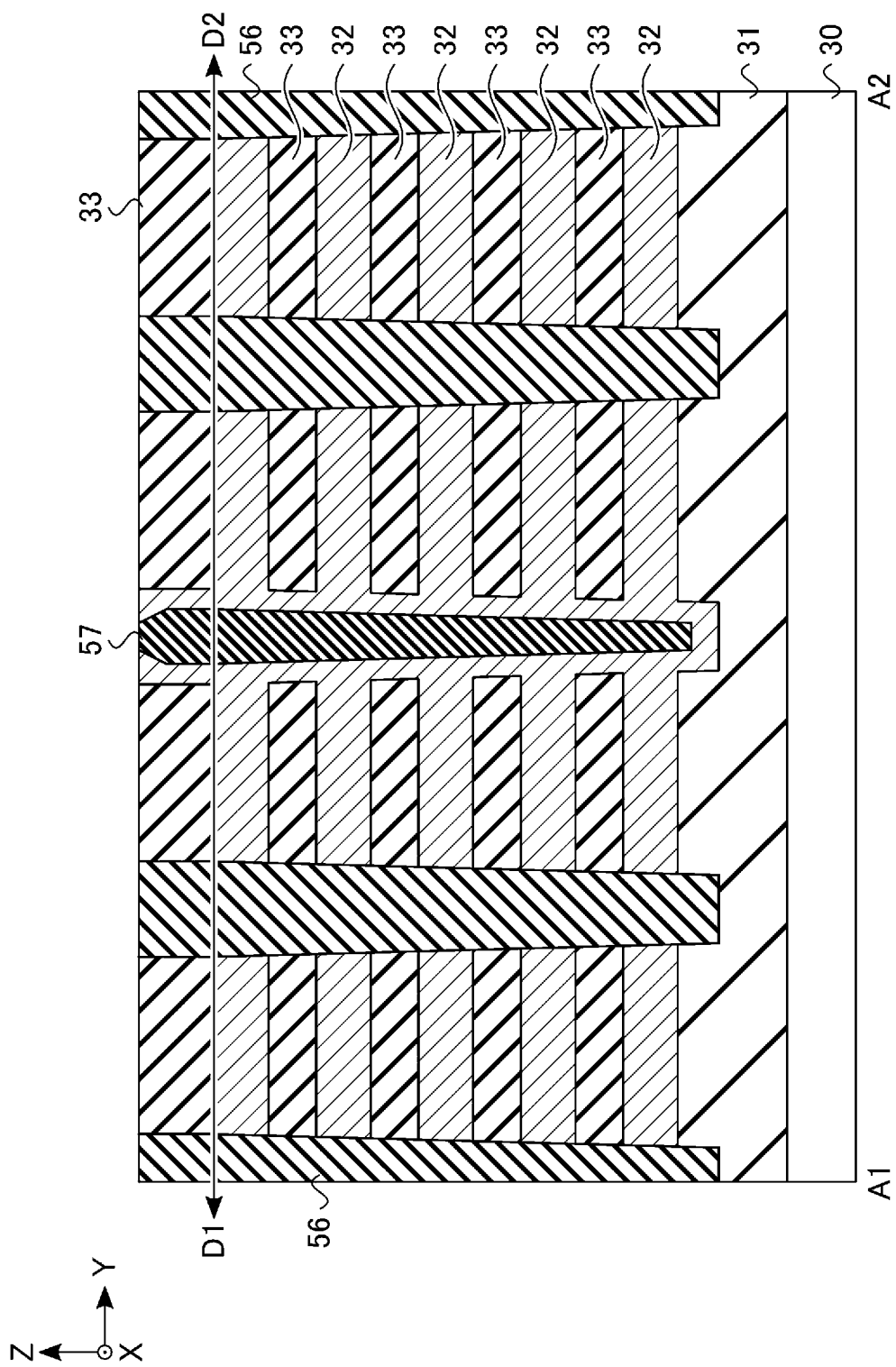
FIG. 32 is a cross-sectional view taken along line A1-A2 of FIG. 31.
Figure 33:
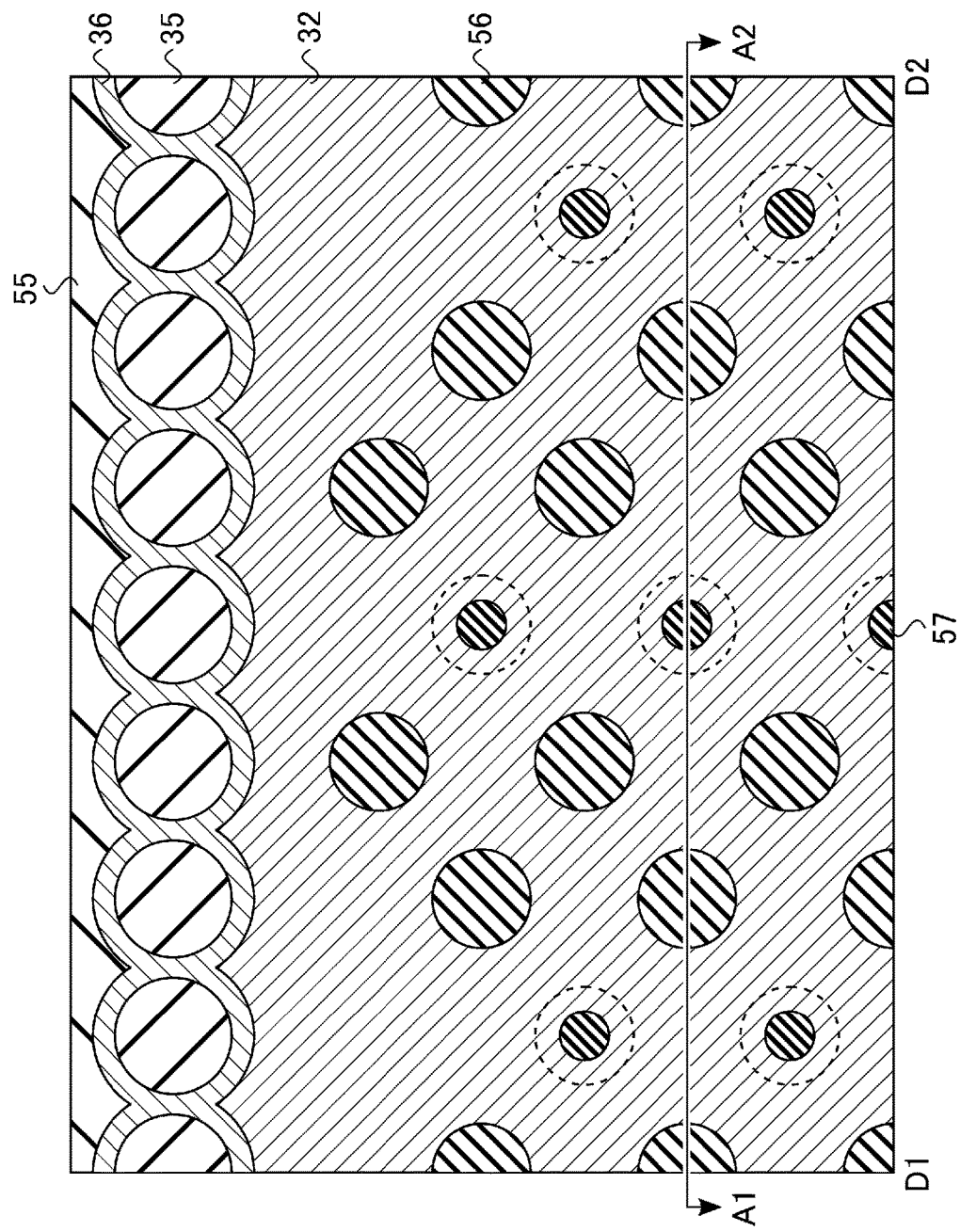
FIG. 33 is a plan view taken along line D1-D2 of FIG. 32.

As illustrated in FIGS. 31 to 33, the semiconductor 32 is formed and is embedded in the gap GP. At this time, the thickness of the semiconductor 32 is the thickness of a film that is embedded in the gap GP without blocking the opening of the hole RH. Next, a sacrificial film 57 is formed and is embedded in the hole RH. As the sacrificial film 57, for example, SiN is used.

Next, the sacrificial film 57, the semiconductor 32, and the insulator 50 on the insulator 33 in the uppermost layer are removed. As a result, the insulator 33 in the uppermost layer, the semiconductor 32 and the sacrificial film 57 in the hole RH, the sacrificial film 56 corresponding to the hole CH, and the surface of the insulator 35 are exposed.

Figure 34:
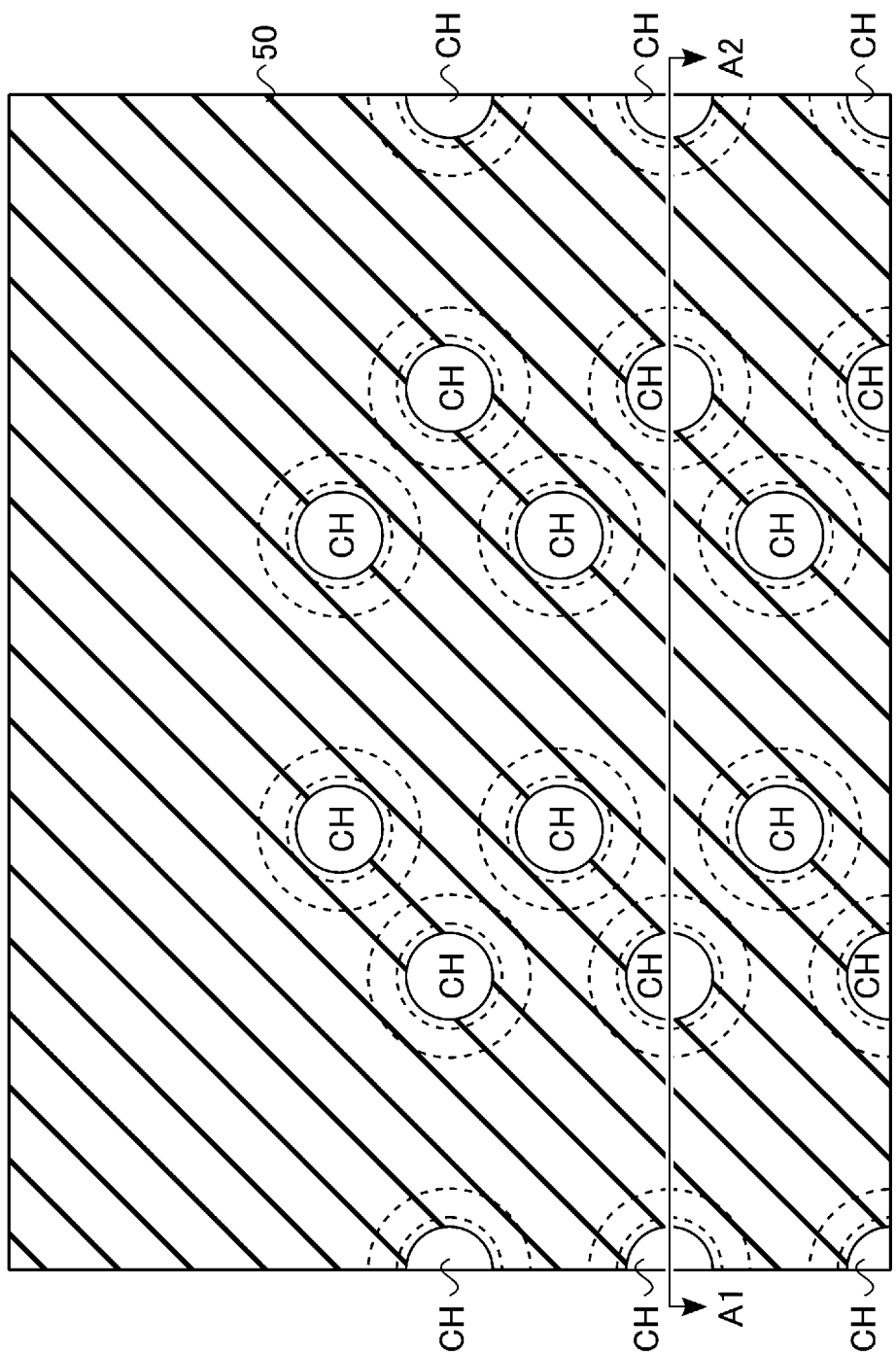
FIG. 34 is a plan view illustrating a manufacturing step of the memory cell array in the semiconductor memory device according to the embodiment.
Figure 35:
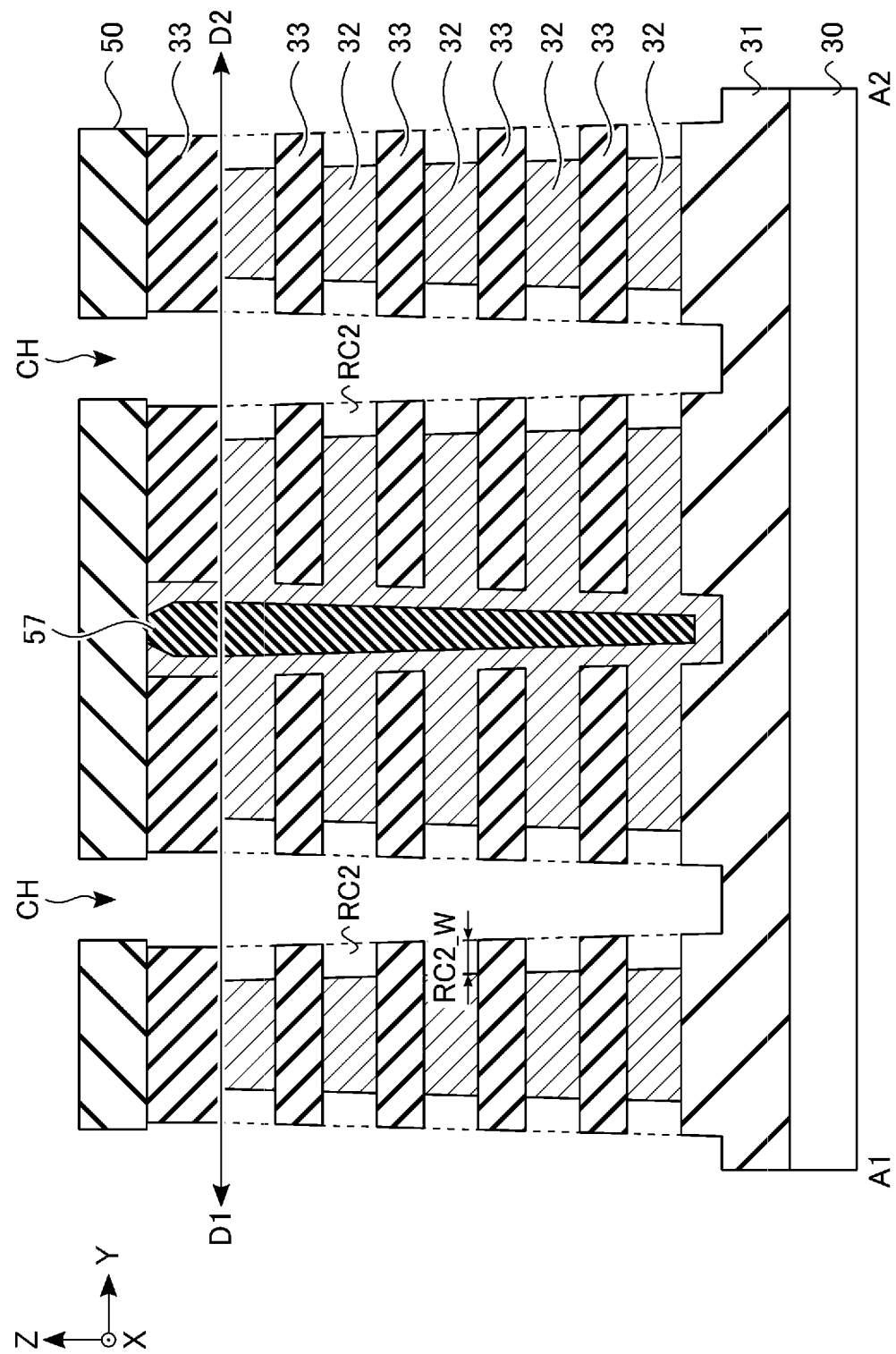
FIG. 35 is a cross-sectional view taken along line A1-A2 of FIG. 34.
Figure 36:
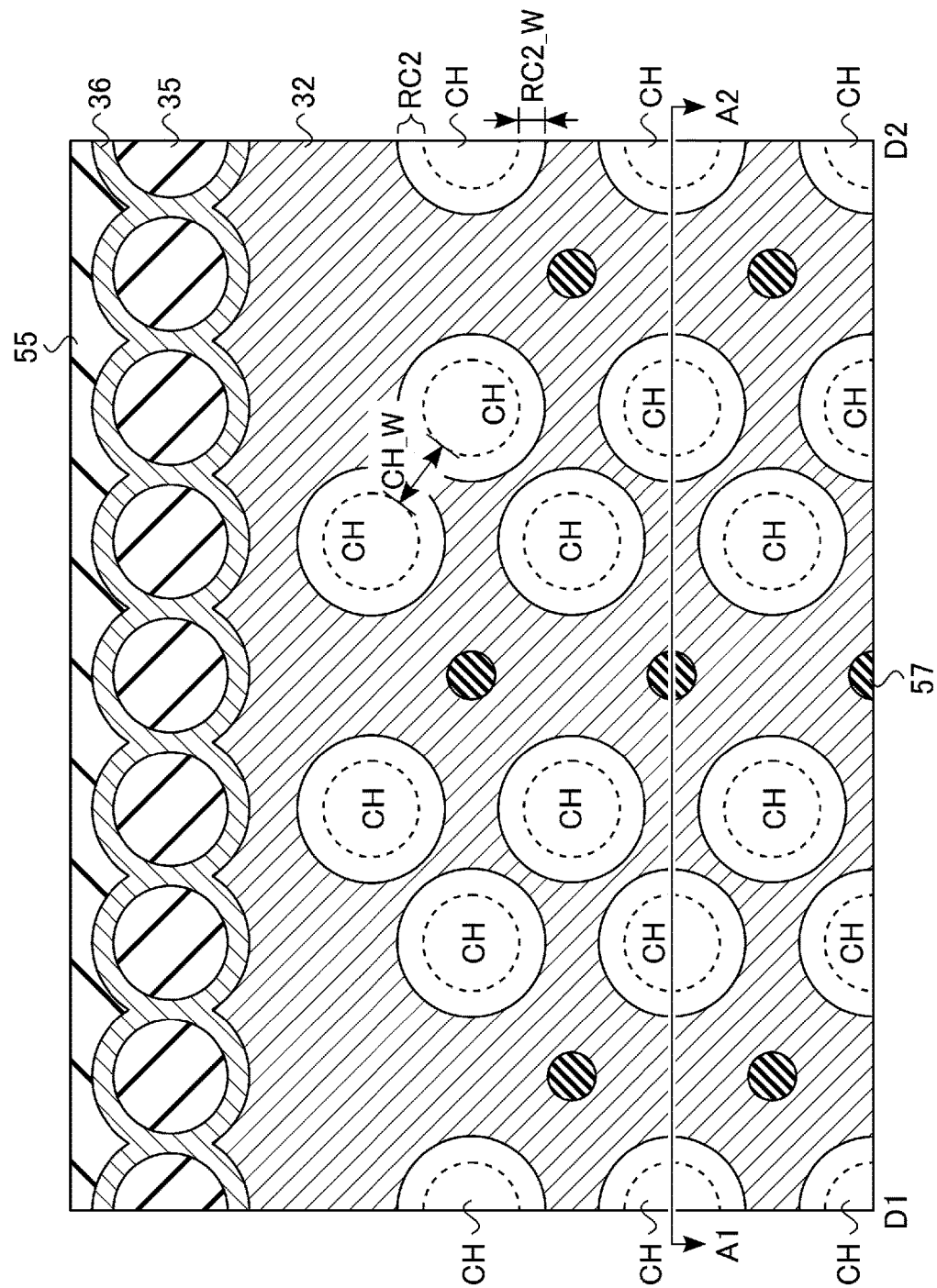
FIG. 36 is a plan view taken along line D1-D2 of FIG. 35.

As illustrated in FIGS. 34 to 36, after forming the insulator 50, the insulator 50 on the hole CH is processed (opening is formed) such that the sacrificial film 56 in the hole CH is exposed. Next, the sacrificial film 56 in the hole CH is removed.

Next, the side surface of the semiconductor 32 exposed in the hole CH is processed by recess etching such that a recessed region RC2 that spreads concentrically from the hole CH is formed. As illustrated in FIG. 36, in the recess etching using the hole CH, the recess amount, that is, a recess width RC2_W of the recessed region RC2 is adjusted such that the semiconductors 32 between the holes CH that are disposed in a staggered arrangement in the X direction remain. The recess width RC2_W is the distance from an end portion of the opening of the insulator 33 formed by the hole CH to a portion of the insulator 33 in contact with the semiconductor 32.

Accordingly, when the distance between the holes CH that are disposed in a staggered arrangement is represented by CH_W, a relationship of $(RC2\_W)<((CH\_W)/2)$ is satisfied. Therefore, the recessed regions RC provided in the respective holes CH are not connected to each other.

Figure 37:
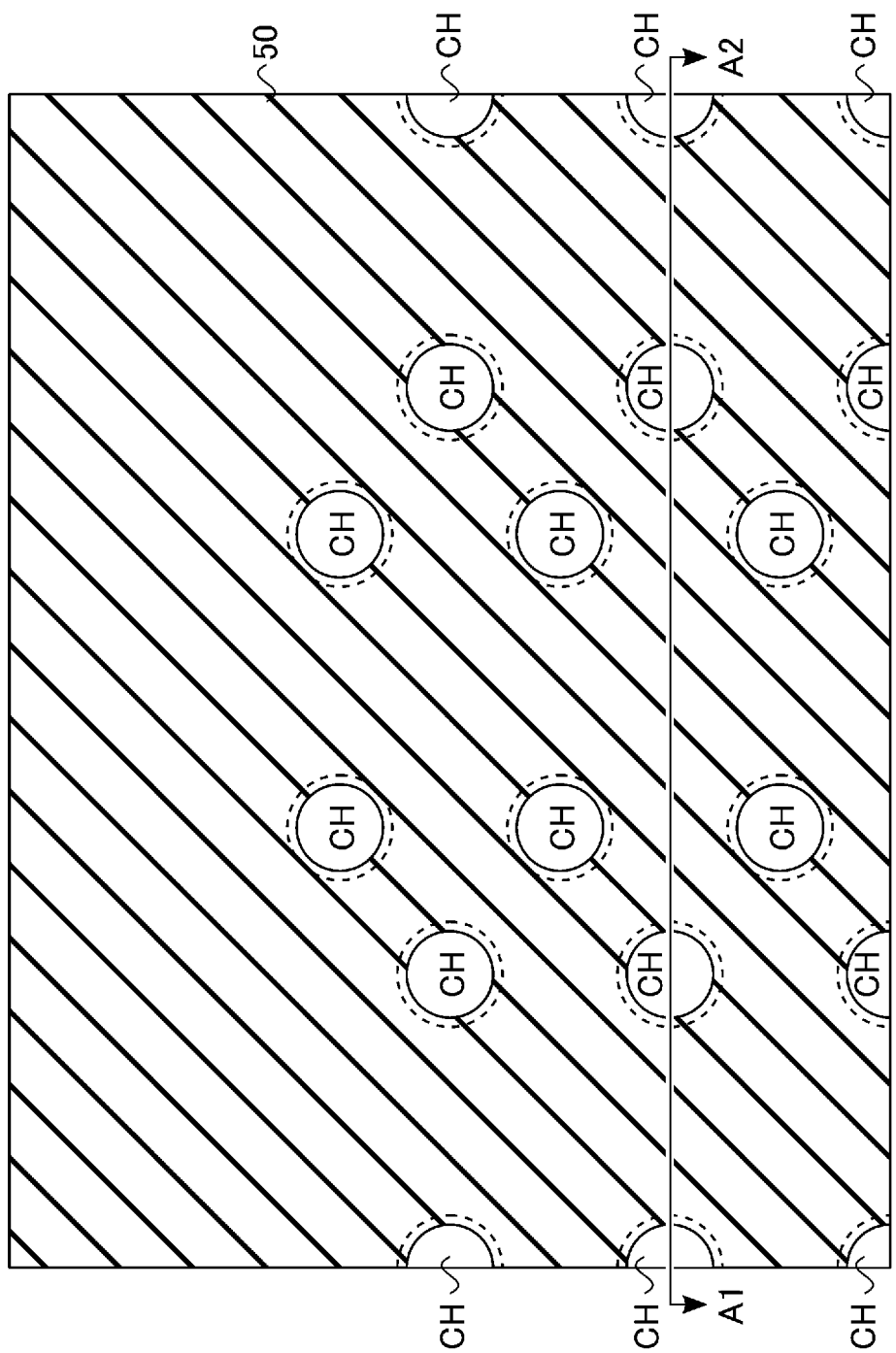
FIG. 37 is a plan view illustrating a manufacturing step of the memory cell array in the semiconductor memory device according to the embodiment.
Figure 38:
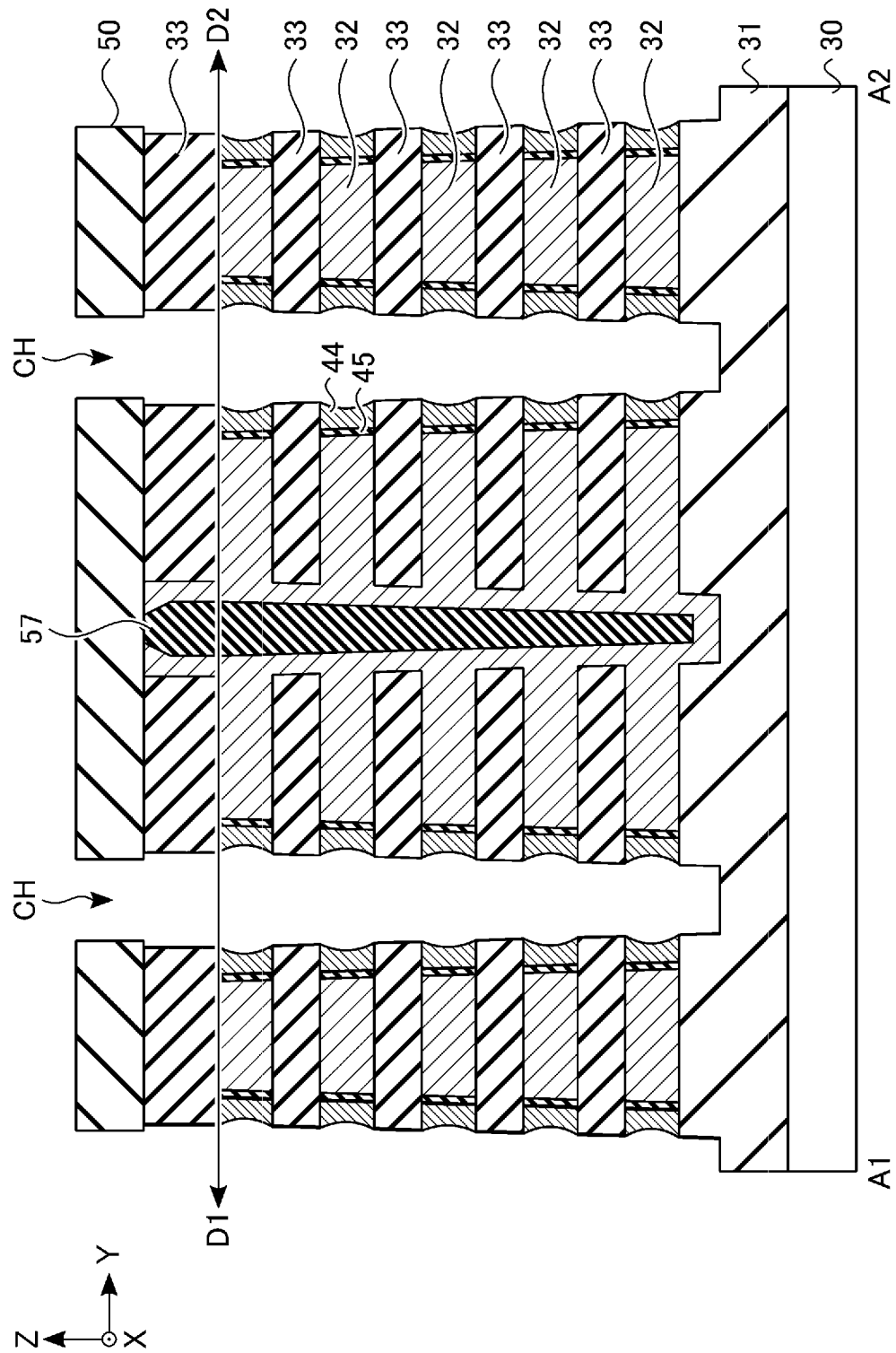
FIG. 38 is a cross-sectional view taken along line A1-A2 of FIG. 37.
Figure 39:
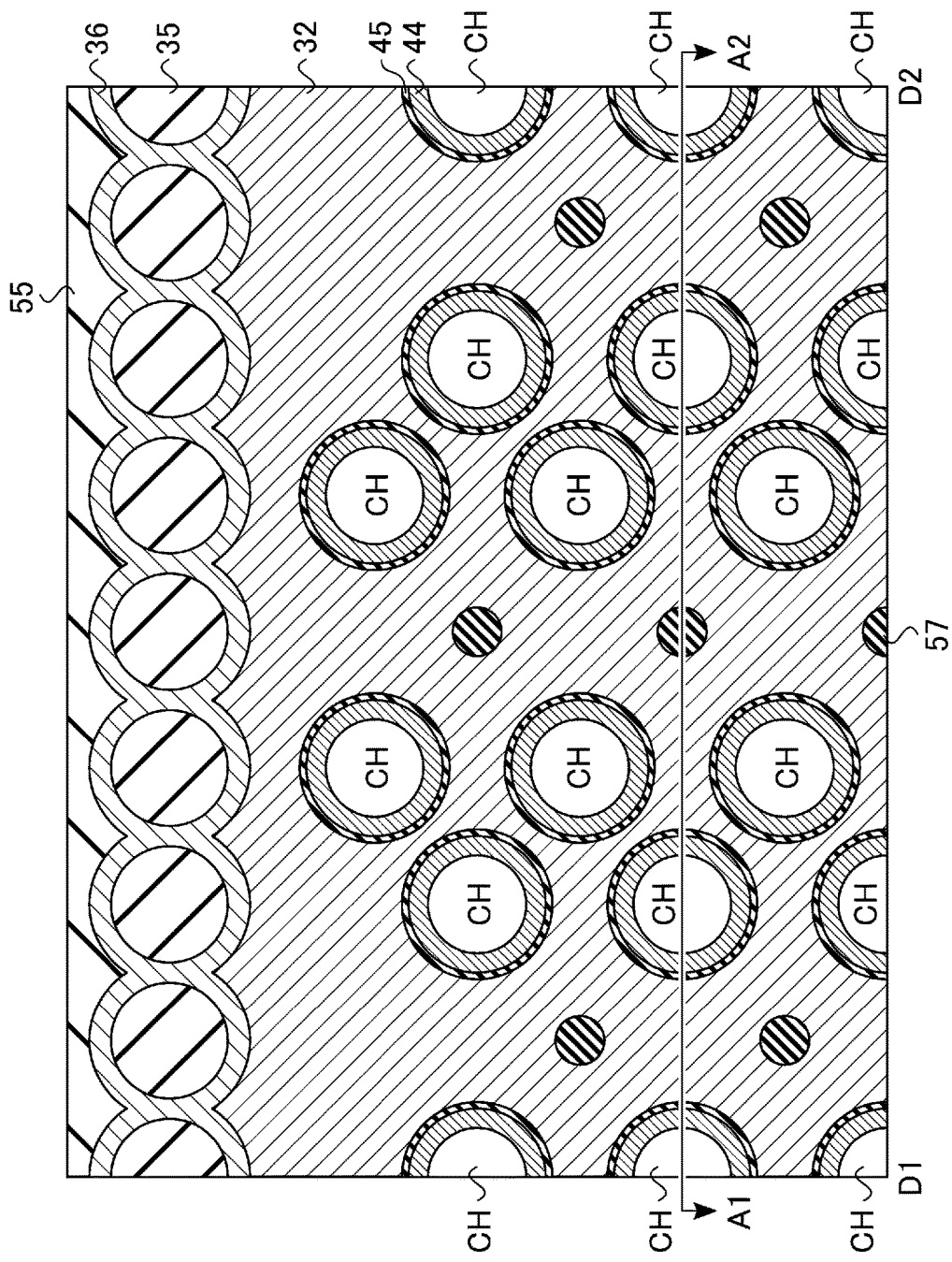
FIG. 39 is a plan view taken along line D1-D2 of FIG. 38.

As illustrated in FIGS. 37 to 39, for example, the insulator 45 is formed by oxidizing the side surface of the semiconductor 32 exposed in the recessed region RC2. The insulator 45 may be formed by, for example, CVD.

Next, the charge storage layer 44 is formed in the recessed region RC2 by recess embedding. In the example of FIG. 38, the side surface of the charge storage layer 44 is curved in a recessed shape but does not need to be curved. Further, the charge storage layer 44 may remain in a step difference portion between the insulators 33 and 50 or in the bottom of the hole CH.

Figure 40:
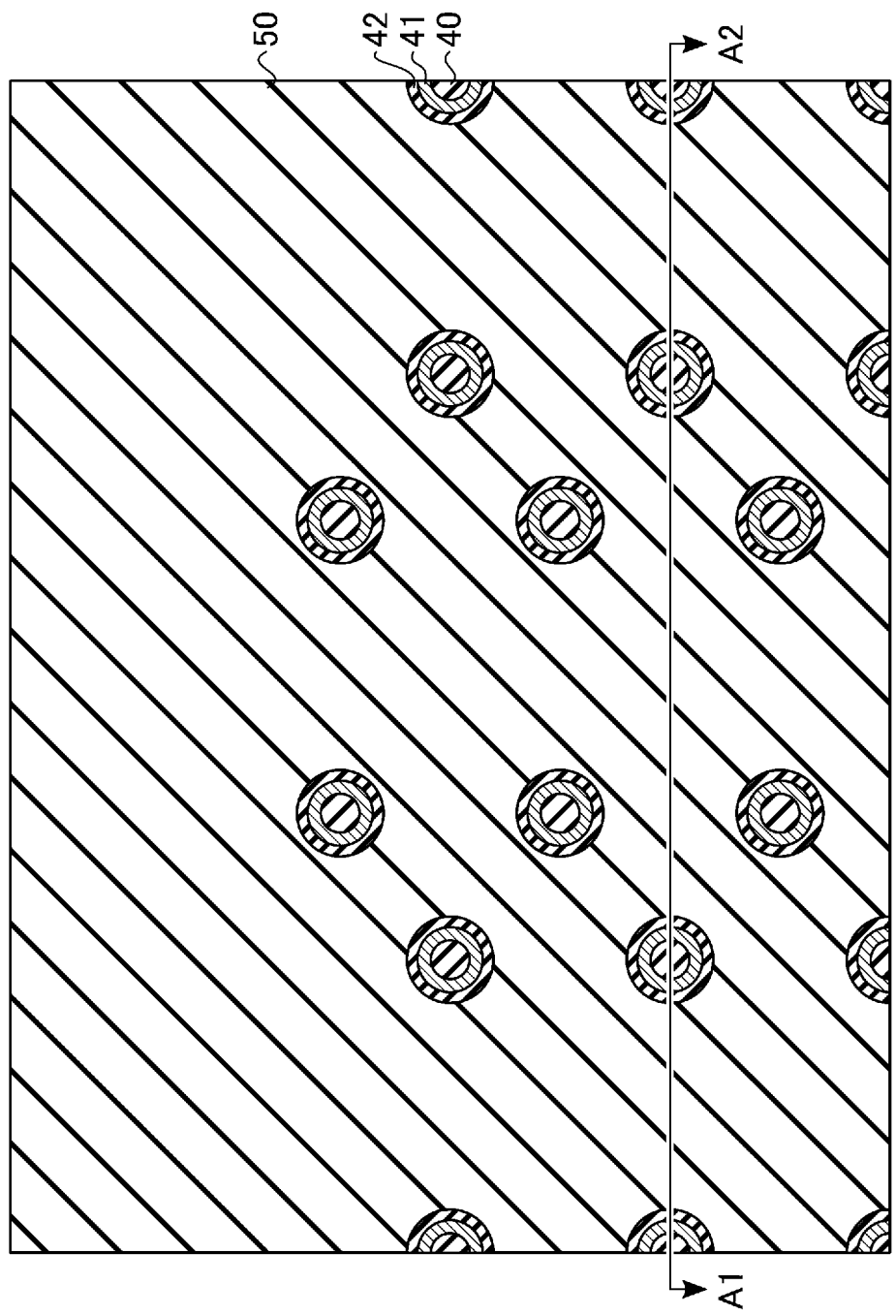
FIG. 40 is a plan view illustrating a manufacturing step of the memory cell array in the semiconductor memory device according to the embodiment.
Figure 41:
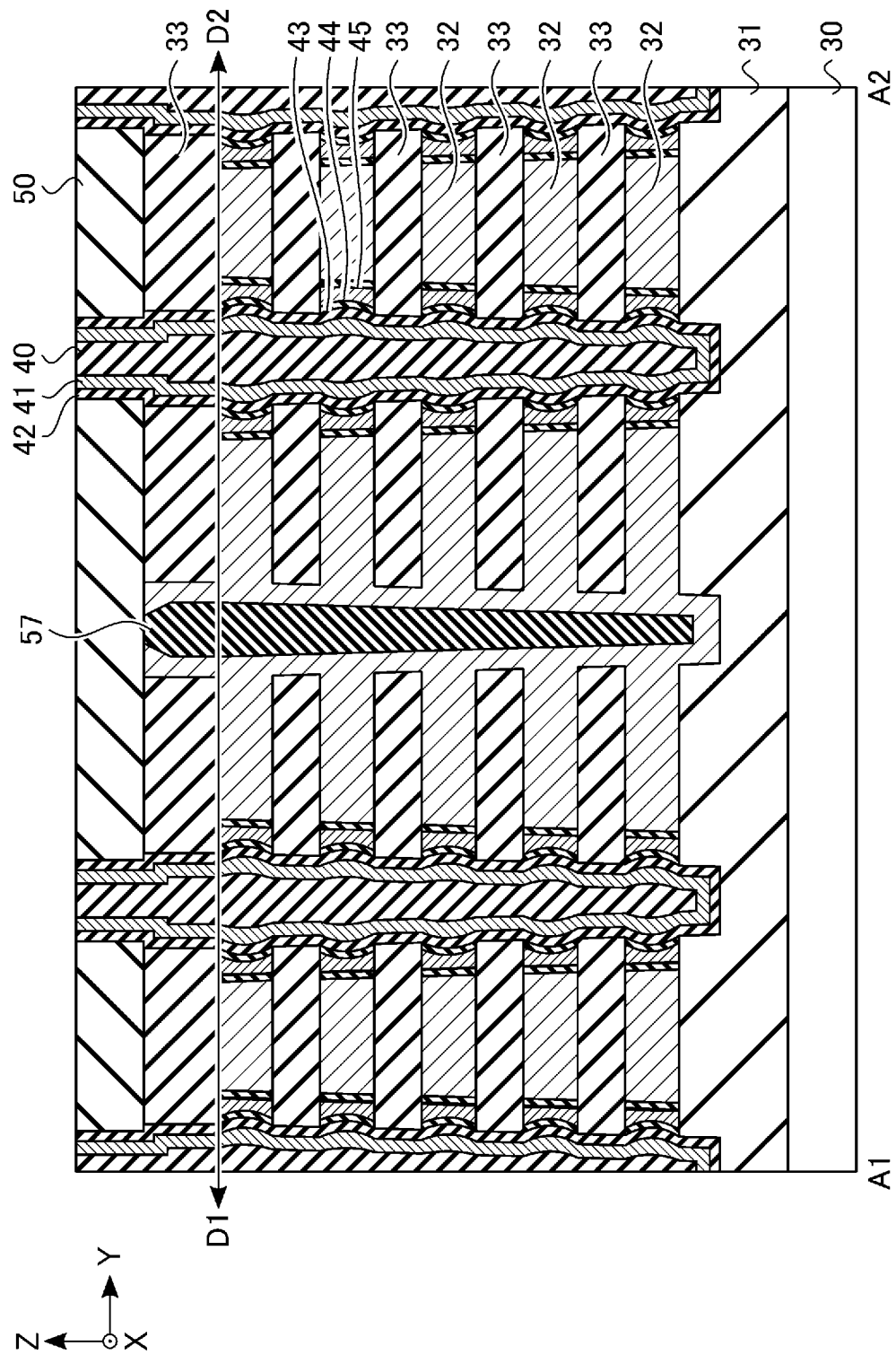
FIG. 41 is a cross-sectional view taken along line A1-A2 of FIG. 40.
Figure 42:
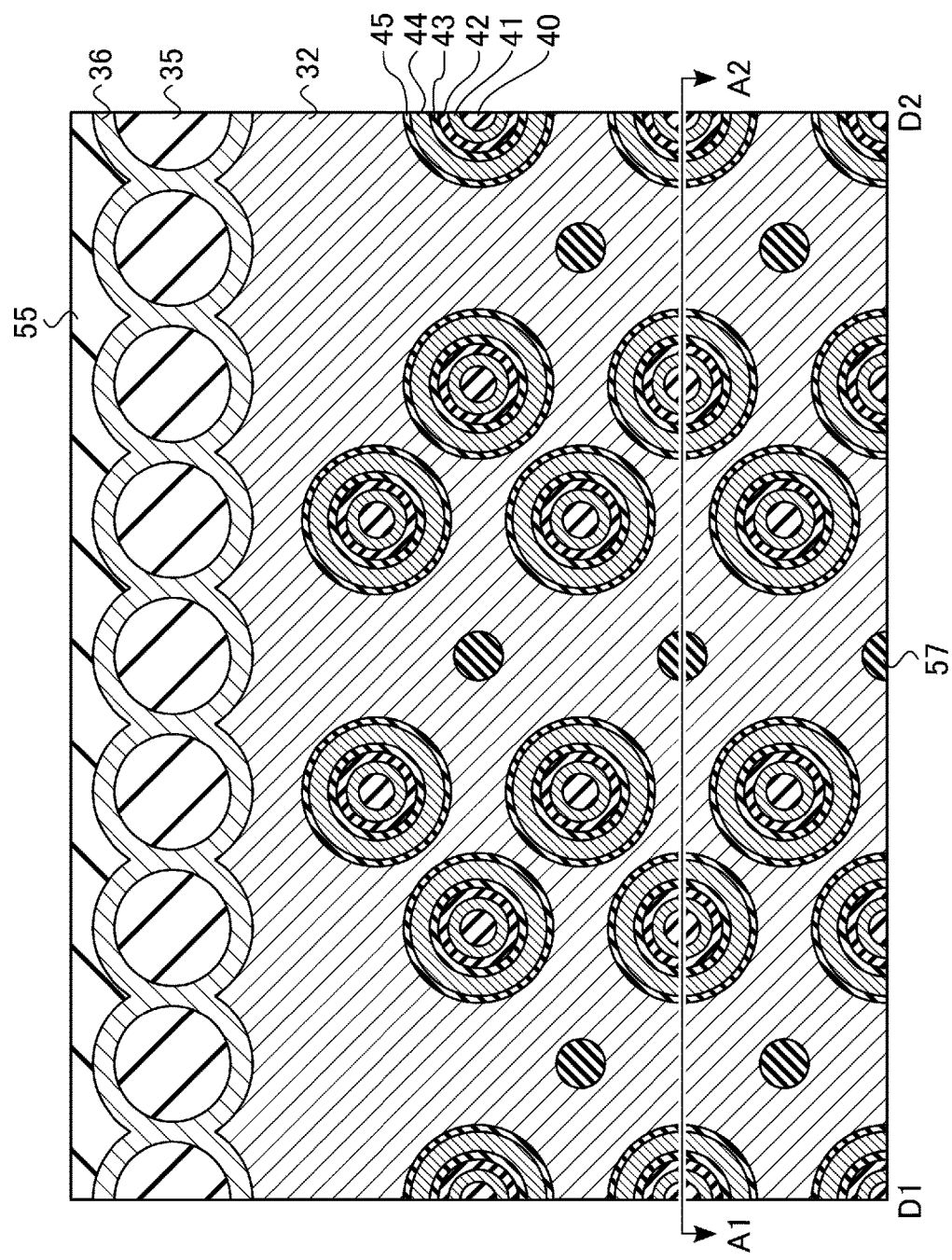
FIG. 42 is a plan view taken along line D1-D2 of FIG. 41.

As illustrated in FIGS. 40 to 42, for example, the insulator 43 is formed by oxidizing the side surface of the charge storage layer 44 exposed in the hole CH. The insulator 43 may be formed by, for example, CVD.

Next, the insulator 42, the conductor 41, and the insulator 40 are sequentially formed and are embedded in the hole CH. The insulator 42, the conductor 41, and the insulator 40 on the insulator 50 are removed. As a result, the electrode pillar CGP is formed.

Figure 43:
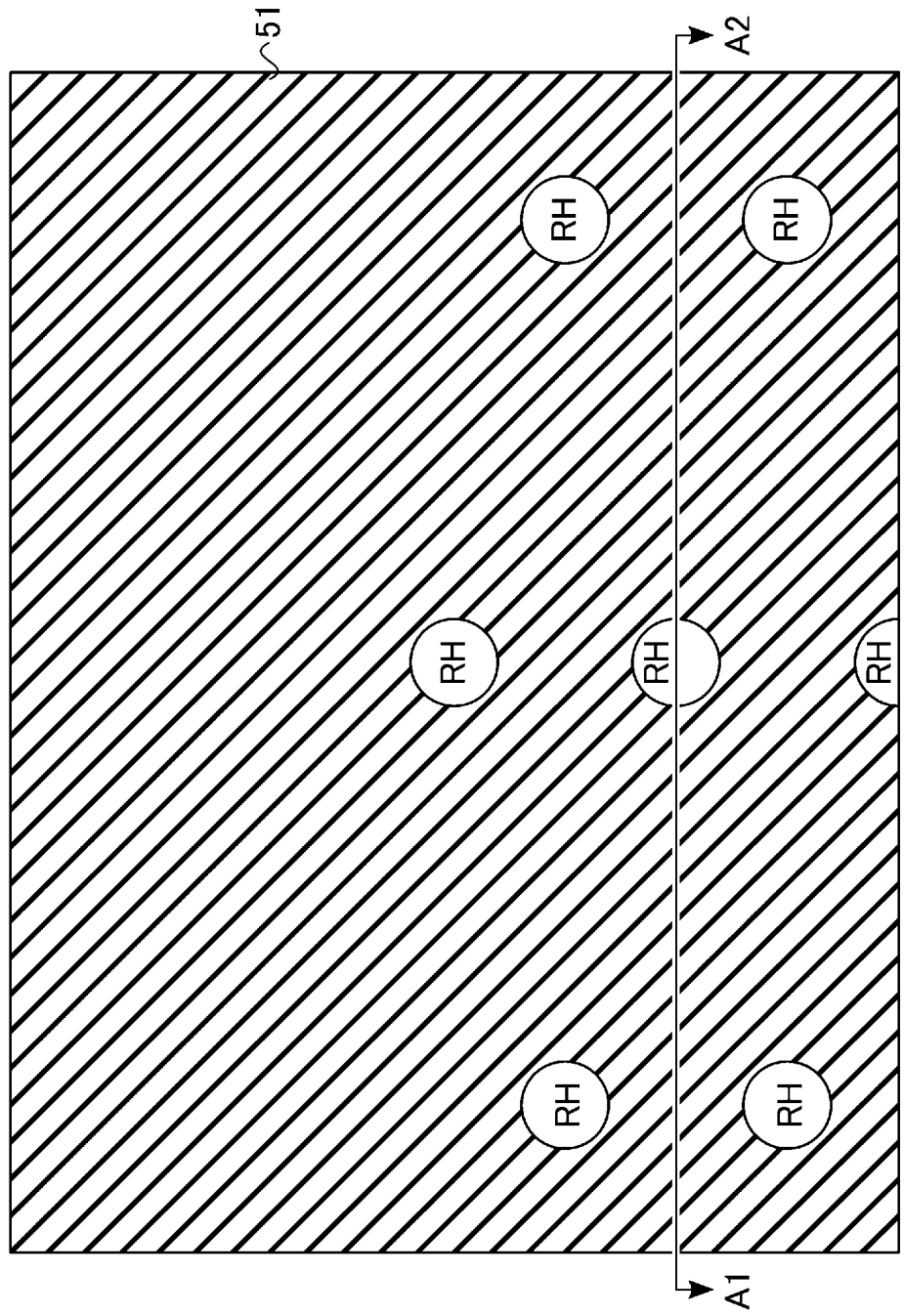
FIG. 43 is a plan view illustrating a manufacturing step of the memory cell array in the semiconductor memory device according to the embodiment.
Figure 44:
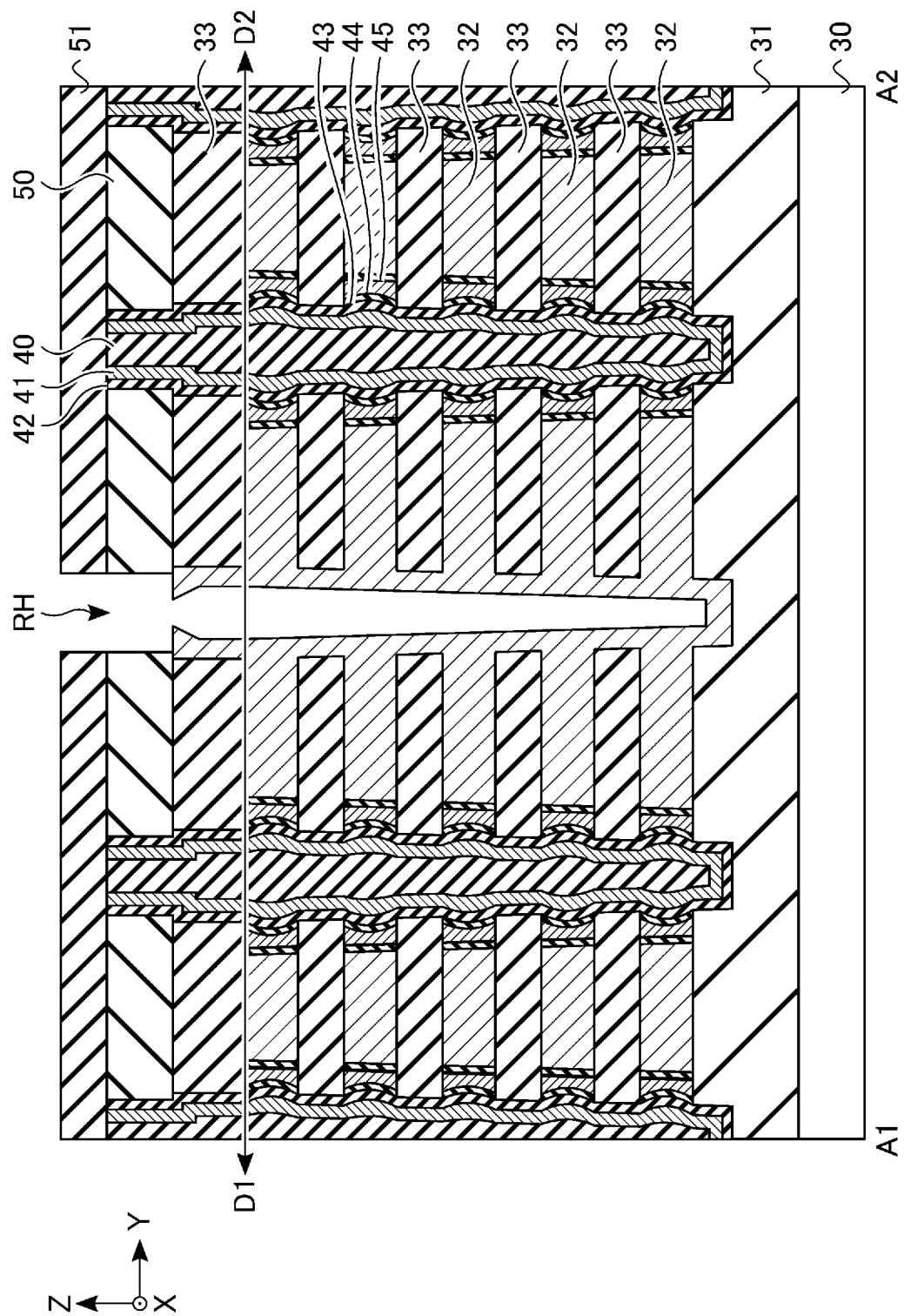
FIG. 44 is a cross-sectional view taken along line A1-A2 of FIG. 43.
Figure 45:
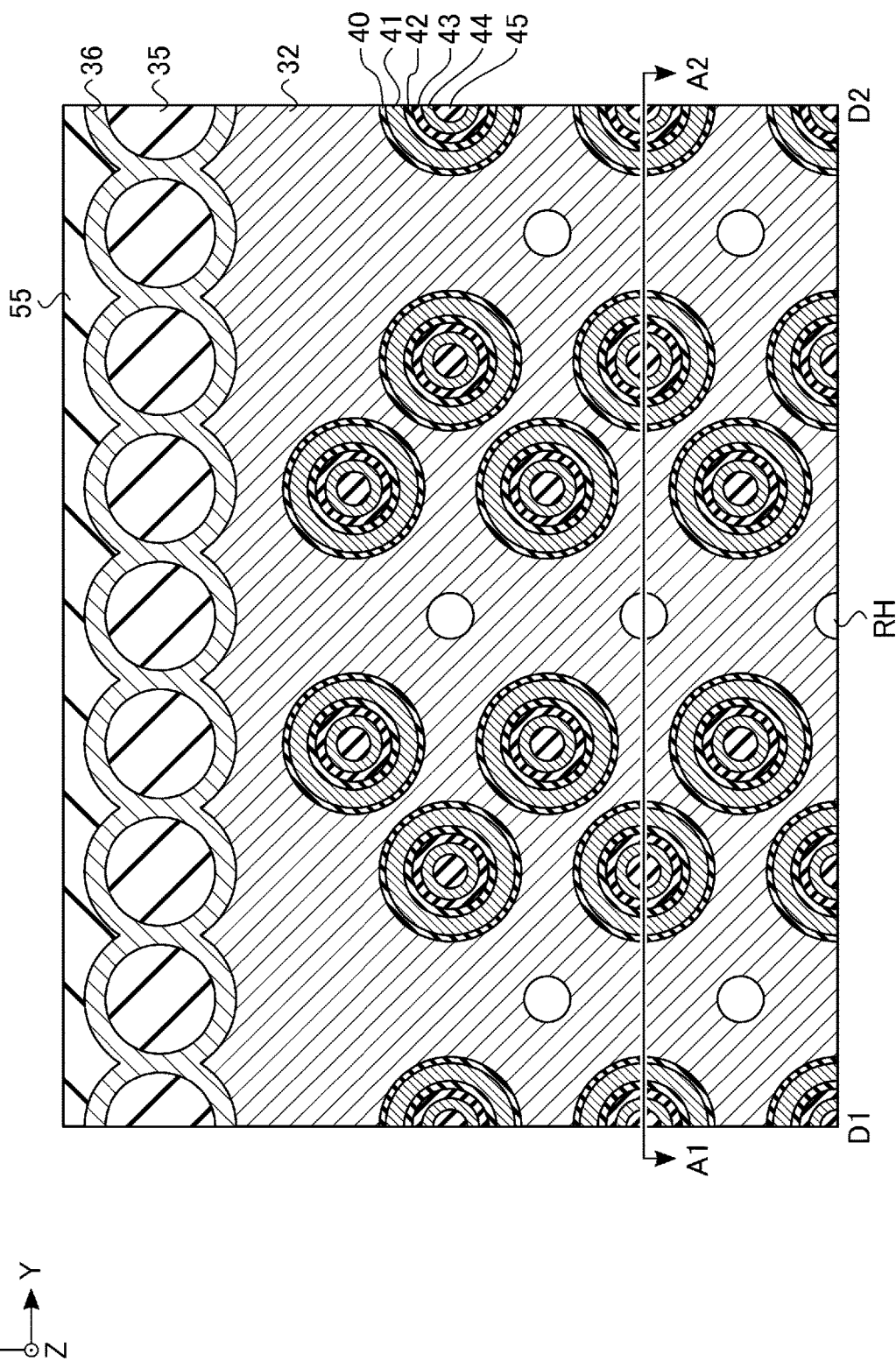
FIG. 45 is a plan view taken along line D1-D2 of FIG. 44.

As illustrated in FIGS. 43 to 45, after forming the insulator 51, the insulator 51 on the hole RH is processed (opening is formed) such that the sacrificial film 57 in the hole RH is exposed. Next, the sacrificial film 57 in the hole RH is removed by wet etching or the like.

Figure 46:
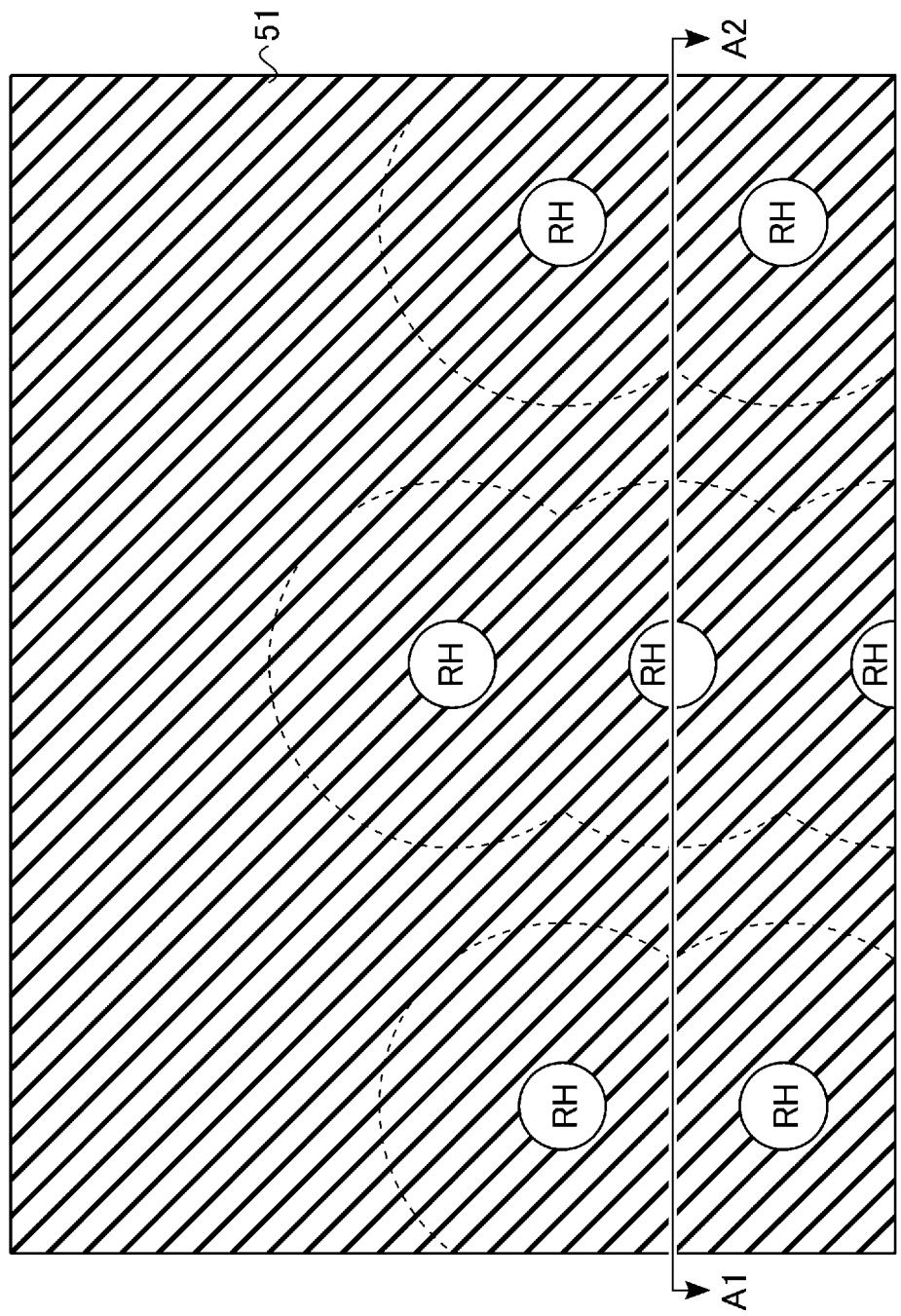
FIG. 46 is a plan view illustrating a manufacturing step of the memory cell array in the semiconductor memory device according to the embodiment.
Figure 47:
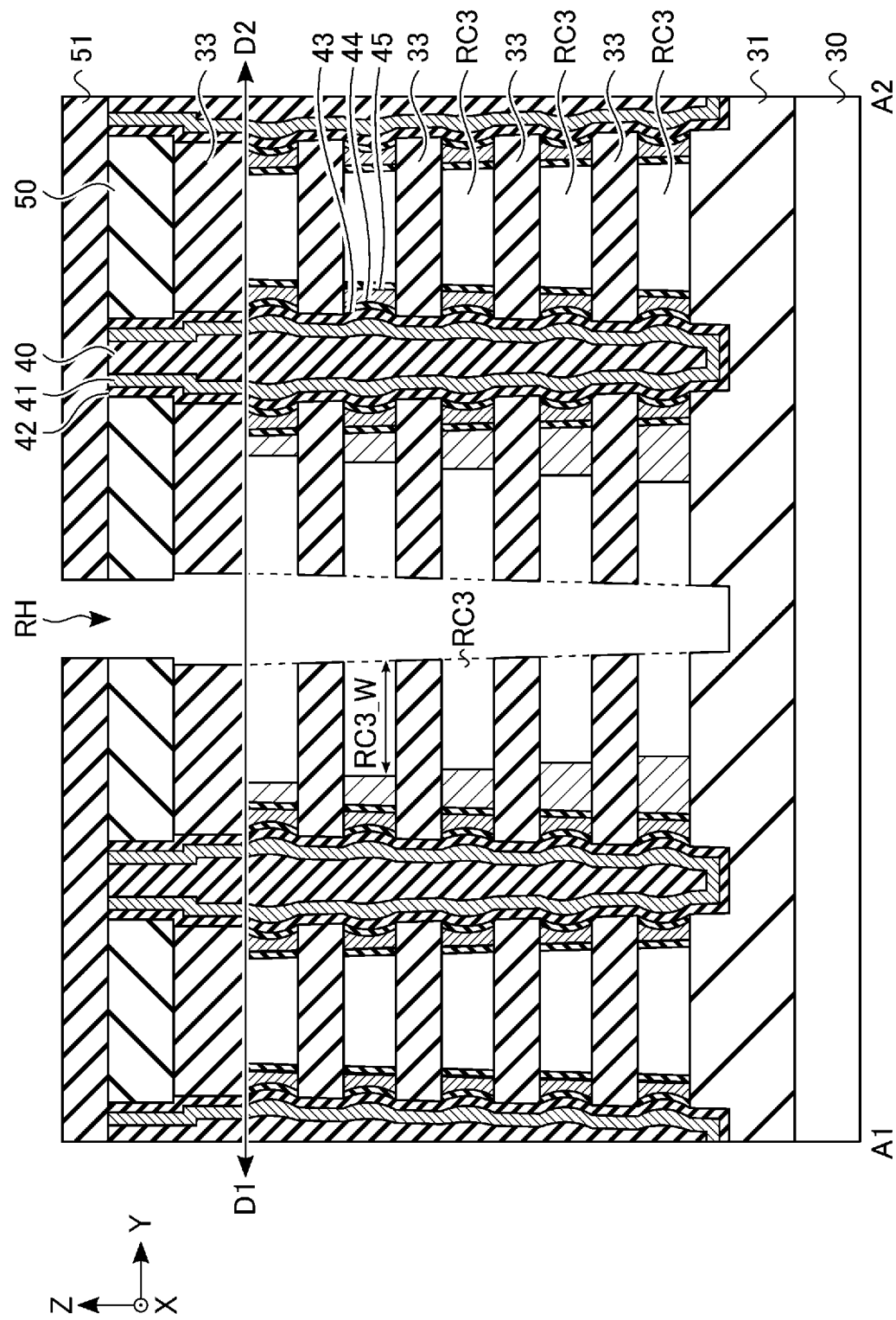
FIG. 47 is a cross-sectional view taken along line A1-A2 of FIG. 46.
Figure 48:
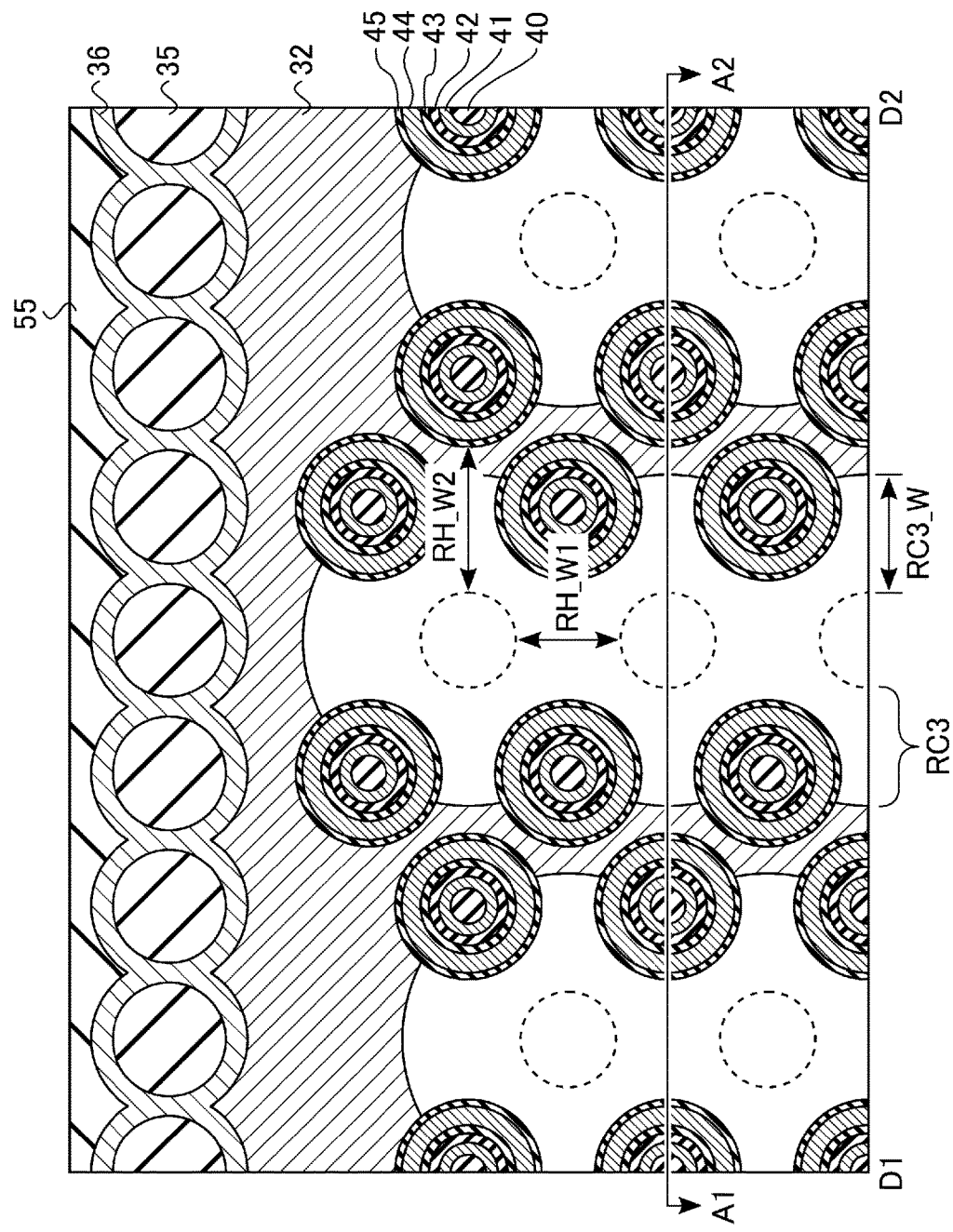
FIG. 48 is a plan view taken along line D1-D2 of FIG. 47.

As illustrated in FIGS. 46 to 48, the side surface of the semiconductor 32 exposed in the hole RH is processed by recess etching such that a recessed region RC3 that spreads concentrically from the hole RH is formed. As a result, the ST1 connection portion SC and the active area portion AA of the semiconductor 32 are formed. As illustrated in FIG. 48, in the recess etching using the hole RH, the recess amount, that is, a recess width RC3_W of the recessed region RC3 is adjusted such that the recessed regions RC3 of the holes RH adjacent to each other in the X direction are connected and the active area portion AA does not disappear. The recess width RC3_W is the distance from an end portion of the opening of the insulator 33 formed by the hole RH to a portion of the insulator 33 in contact with the semiconductor 32. The distance between the holes RH adjacent to each other in the X direction is represented by RH_W1, and the distance between the hole RH and the insulator 45 adjacent to each other in the Y direction is represented by RH_W2. In this case, RC3_W, RH_W1, and RH_W2 satisfy a relationship of $((RH\_W1)/2)<(RC3\_W)<(RH\_W2)$.

Figure 49:
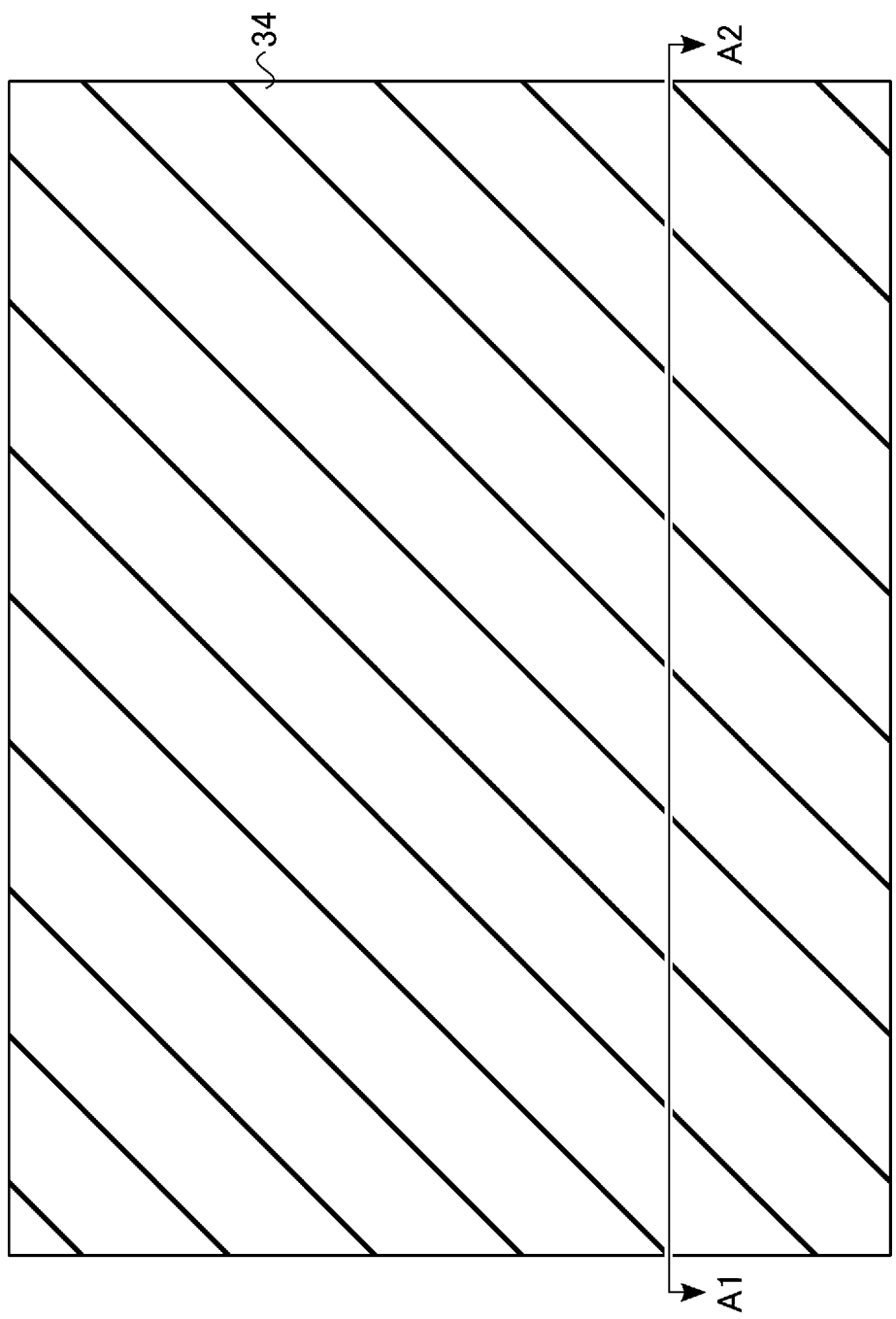
FIG. 49 is a plan view illustrating a manufacturing step of the memory cell array in the semiconductor memory device according to the embodiment.
Figure 50:
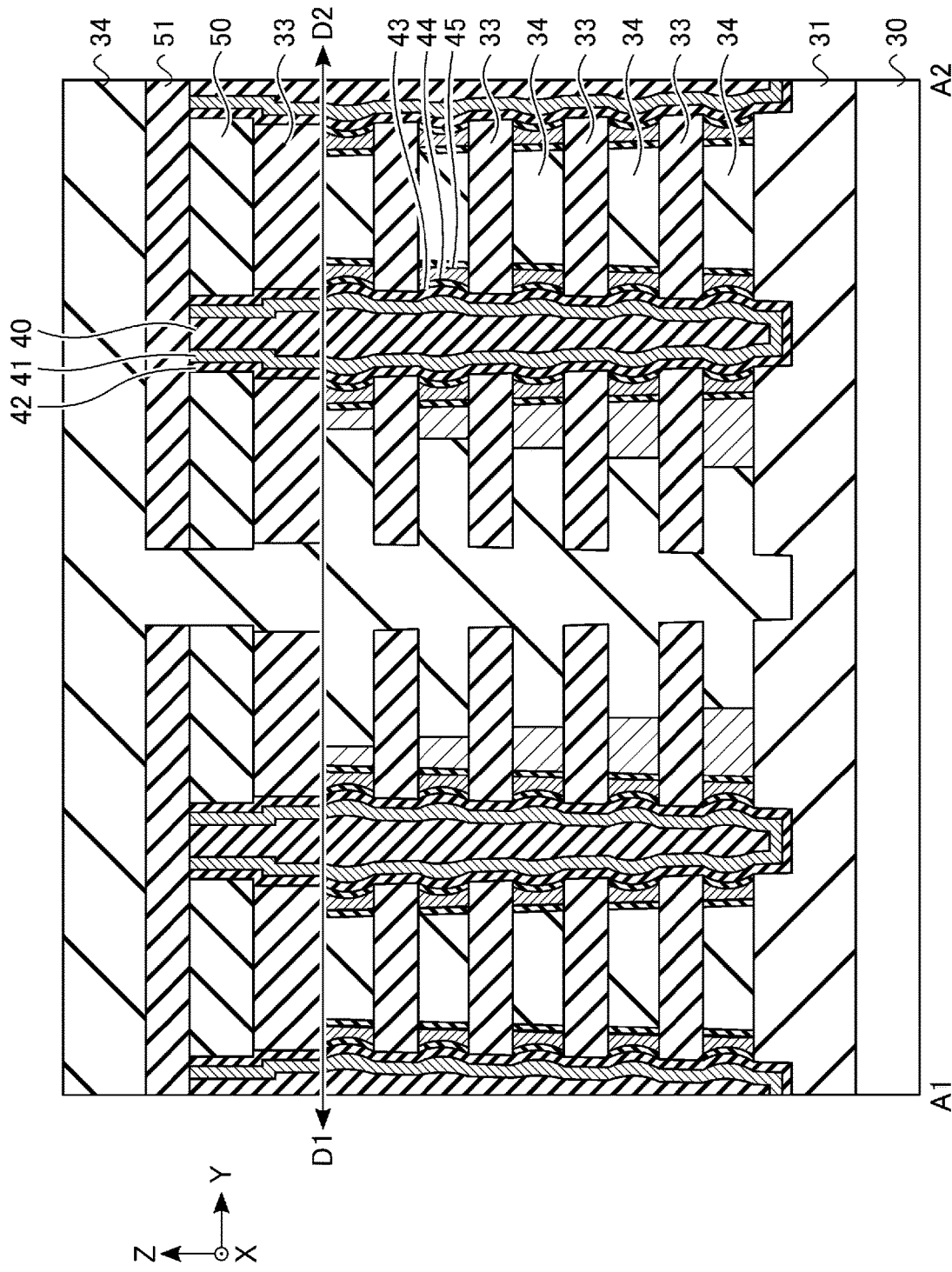
FIG. 50 is a cross-sectional view taken along line A1-A2 of FIG. 49.
Figure 51:
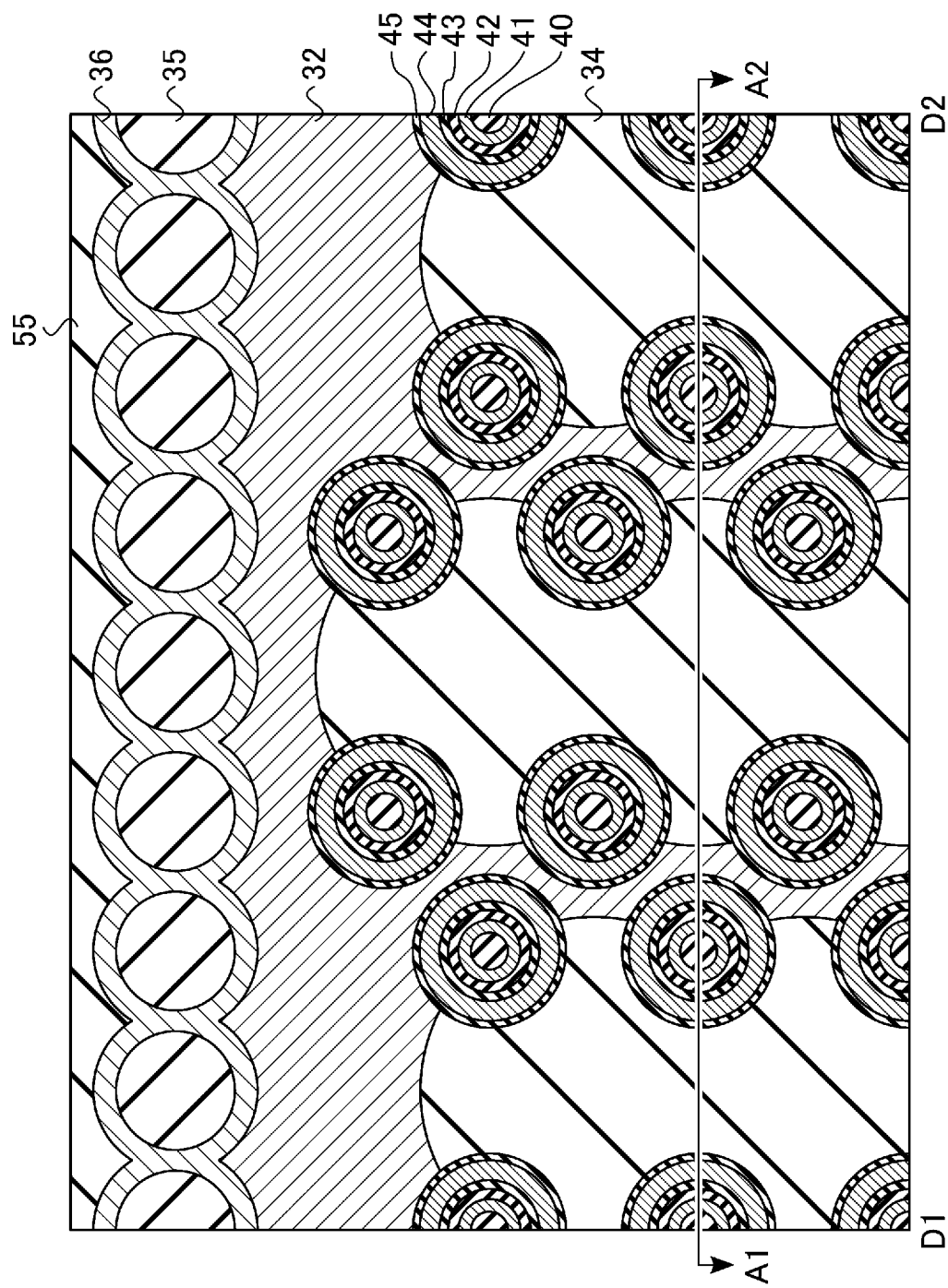
FIG. 51 is a plan view taken along line D1-D2 of FIG. 50.

As illustrated in FIGS. 49 to 51, the insulator 34 is formed and is embedded into the recessed region RC3 and the hole RH. The recessed region RC3 and the hole RH do not need to be completely embedded. The openings of the holes RH of the insulators 50 and 51 only need to be blocked by the insulator 34. In other words, an air gap may be formed in the recessed region RC3 and the hole RH.

3 Effect of Embodiment

Figure 52:
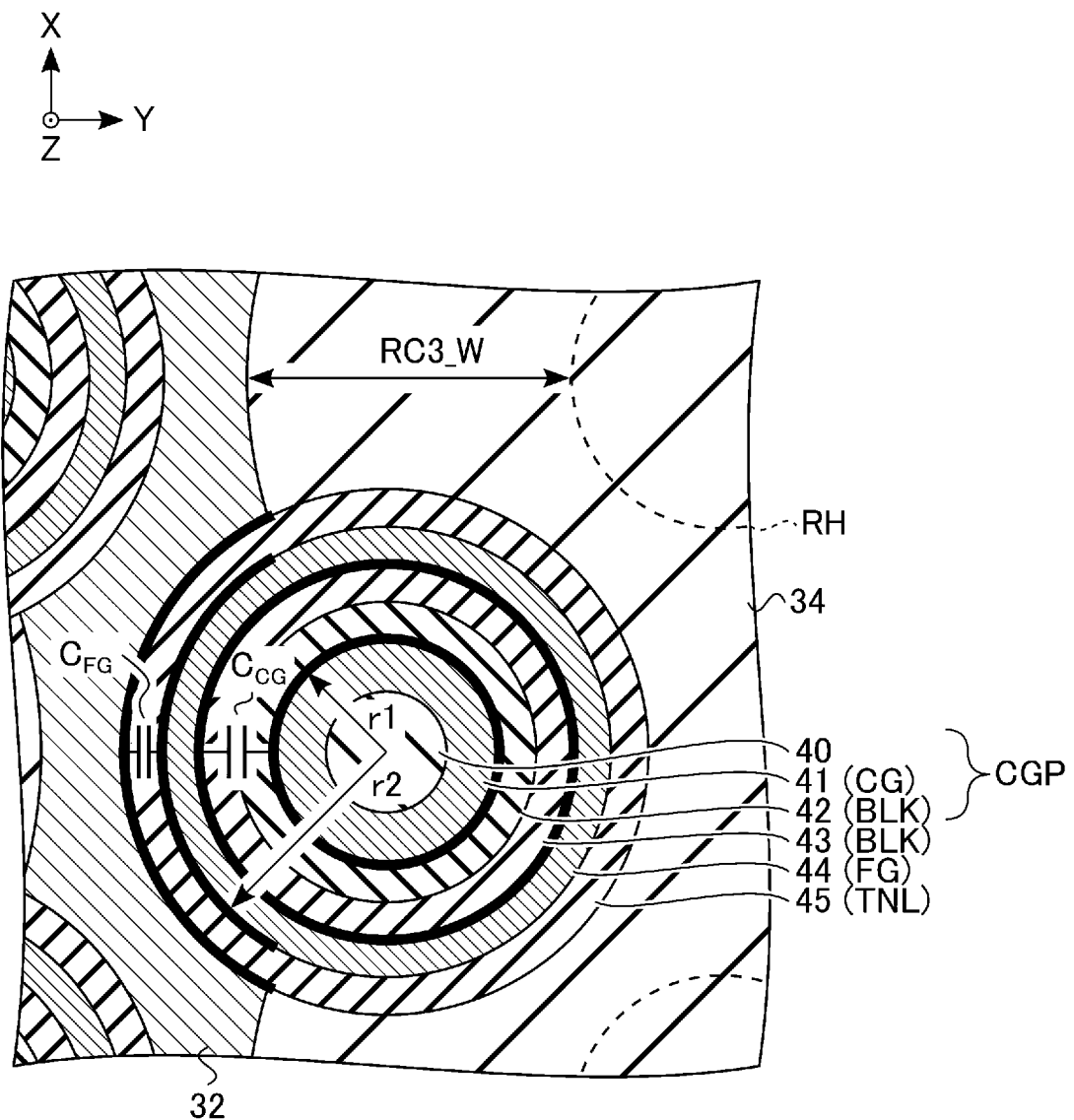
FIG. 52 is a plan view illustrating a memory cell transistor of the memory cell array in the semiconductor memory device according to the embodiment.

With the configuration according to the embodiment, a semiconductor memory device capable of improving reliability can be provided. The effect will be described in detail with reference to FIG. 52. FIG. 52 is a plan view illustrating the memory cell transistor MC.

As illustrated in FIG. 52, in the memory cell transistor MC according to the embodiment, the outer circumference of the conductor 41 that functions as the gate electrode is surrounded by the charge storage layer 44 having a cylindrical shape that functions as FG through the insulators 42 and 43 that function as the block insulating film. A part of the outer circumference of the charge storage layer 44 faces the semiconductor 32 that functions as the channel of the memory cell transistor MC through the insulator 45 that functions as the tunnel insulating film. Accordingly, in the embodiment, the memory cell transistor MC including a channel having an arc shape can be formed. Here, when the radius of the conductor 41 having a cylindrical shape is represented by r1 and the radius of the charge storage layer 44 having a cylindrical shape is represented by r2, a relationship of $r1<r2$ is satisfied. The length of an arc-shaped portion of the charge storage layer 44 facing the channel having an arc shape is shorter than $2 \times \pi \times r2$.

Here, the parasitic capacitance between the channel having an arc shape (semiconductor 32) and the charge storage layer 44 is represented by $C_{FG}$, and the parasitic capacitance between the charge storage layer 44 and the conductor 41 having a cylindrical shape is represented by $C_{CG}$. When a coupling ratio between the capacitance $C_{FG}$ and the capacitance $C_{CG}$ is represented by Cr, $Cr=C_{CG}/(C_{FG}+C_{CG})$ is satisfied. By forming the memory cell transistor MC having an arc shape, the coupling ratio Cr can be improved. As a result, the block insulating film of the memory cell transistor MC, that is, the total thickness of the insulators 42 and 43 can be increased. By increasing the thickness of the block insulating film, leakage of charge from the charge storage layer 44 to the conductor can be reduced. Further, the thickness of the block insulating film can be increased such that the breakdown voltage of the block insulating film of the memory cell transistor MC can be improved. As a result, the reliability of the memory cell transistor MC can be improved.

Further, with the configuration according to the embodiment, the capacitance $C_{FG}$ can be controlled by controlling the recess width RC3_W of the semiconductor 32. That is, the coupling ratio Cr can be controlled by adjusting the recess amount of the channel (semiconductor 32).

Further, with the configuration according to the embodiment, the holes CH, RH, and DH having a high aspect ratio can be collectively processed. By selectively removing the sacrificial films in the holes CH, RH, and DH and repeating the recess etching and the recess embedding, the memory cell array 11 can be formed. Therefore, the etching time of the holes having a high aspect ratio in the memory cell array 11 can be reduced, and the memory cell array 11 can be easily processed.

4 Modification Example and the Like

The semiconductor memory device according to the embodiment includes: a first semiconductor (32) extending in a first direction (X direction) parallel to a substrate (30); a first conductor (41) extending in a second direction (Z direction) perpendicular to the substrate; a first charge storage layer (44) surrounding an outer circumference of the first conductor; a first insulator (42 or 43) provided between the first conductor and the first charge storage layer to surround the first conductor; a second insulator (45) provided between the first charge storage layer and the first semiconductor to surround the first charge storage layer; and a first memory cell (MC). A part of an outer circumference of the second insulator is in contact with the first semiconductor. The first memory cell includes the first conductor, the first semiconductor, a part of the first charge storage layer provided between the first conductor and the first semiconductor, a part of the first insulator, and the part of the second insulator.

By applying the above-described embodiment, a semiconductor memory device with improved reliability can be provided.

The embodiment is not limited to the above-described configuration, and various modifications may be made.

In addition, "connection" in the above-described embodiment includes a state where materials are connected indirectly with another material such as a transistor or a resistor interposed therebetween.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:
    a first semiconductor extending in a first direction parallel to a substrate;
    a first conductor extending in a second direction perpendicular to the first direction, wherein the first conductor includes a metal material;
    a first charge storage layer surrounding the first conductor;

a first insulator provided between the first conductor and the first charge storage layer;

a second insulator provided between the first charge storage layer and the first semiconductor, wherein an outer circumference of a portion of the second insulator is in contact with the first semiconductor; and a first memory cell including the first conductor, the first semiconductor, a portion of the first charge storage layer, a portion of the first insulator, and the portion of the second insulator.

2. The semiconductor memory device according to claim 1, wherein an outer circumference of another portion of the second insulator is in contact with a third insulator.

3. The semiconductor memory device according to claim 2, wherein the first semiconductor includes a curved sidewall in contact with the third insulator.

4. The semiconductor memory device according to claim 1, further comprising:

a second semiconductor provided above the first semiconductor;

a second charge storage layer surrounding the first conductor;

a fourth insulator provided between the first conductor and the second charge storage layer;

a fifth insulator provided between the second charge storage layer and the second semiconductor, wherein an outer circumference of a portion of the fifth insulator is in contact with the second semiconductor; and a second memory cell including the first conductor, the second semiconductor, a portion of the second charge storage layer, a portion of the fourth insulator, and the portion of the fifth insulator.

5. The semiconductor memory device according to claim 4, wherein a diameter of the first charge storage layer and a diameter of the second charge storage layer are different from each other.

6. The semiconductor memory device according to claim 4, wherein a width of the first semiconductor in a third direction intersecting the first and second directions is different from a width of the second semiconductor in the third direction.

7. The semiconductor memory device according to claim 1, further comprising:

a second conductor extending in the second direction;

a third charge storage layer surrounding the first conductor;

a sixth insulator provided between the first conductor and the first charge storage layer;

a seventh insulator provided between the third charge storage layer and the first semiconductor, wherein an outer circumference of a portion of the seventh insulator is in contact with the first semiconductor; and a third memory cell including the second conductor, the first semiconductor, a portion of the third charge storage layer, a portion of the sixth insulator, and the portion of the seventh insulator.

8. The semiconductor memory device according to claim 7, wherein the second insulator, the first semiconductor, and the seventh insulator are collectively provided between the first charge storage layer and the third charge storage layer.

9. The semiconductor memory device according to claim 1, wherein the first conductor has a cylindrical shape to surround a dielectric pillar extending in the second direction.

10. The semiconductor memory device according to claim 1, wherein the first conductor is configured as a gate electrode of the first memory cell.

* * * * *